United States Patent
Makino et al.

(10) Patent No.: US 12,529,956 B2
(45) Date of Patent: Jan. 20, 2026

(54) RESIN COMPOSITION, FILM, OPTICAL FILTER, SOLID-STATE IMAGING ELEMENT, AND IMAGE DISPLAY DEVICE

(71) Applicant: FUJIFILM Corporation, Tokyo (JP)

(72) Inventors: Masaomi Makino, Haibara-gun (JP); Takashi Kawashima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 633 days.

(21) Appl. No.: 17/940,400

(22) Filed: Sep. 8, 2022

(65) Prior Publication Data

US 2023/0050872 A1 Feb. 16, 2023

Related U.S. Application Data

(63) Continuation of application No. PCT/JP2021/008332, filed on Mar. 4, 2021.

(30) Foreign Application Priority Data

Mar. 11, 2020 (JP) .................................. 2020-041788
Jan. 13, 2021 (JP) .................................. 2021-003309

(51) Int. Cl.
| | | |
|---|---|---|
| G03F 7/00 | (2006.01) | |
| G02B 1/111 | (2015.01) | |
| G02B 5/20 | (2006.01) | |
| G02F 1/1335 | (2006.01) | |
| G03F 7/028 | (2006.01) | |
| H10F 39/00 | (2025.01) | |

(52) U.S. Cl.
CPC ............ *G03F 7/0007* (2013.01); *G02B 1/111* (2013.01); *G02B 5/208* (2013.01); *G03F 7/028* (2013.01); *G02F 1/133514* (2013.01); *H10F 39/8053* (2025.01)

(58) Field of Classification Search
CPC .................................................. G03F 7/0007
See application file for complete search history.

(56) References Cited

U.S. PATENT DOCUMENTS

| 6,410,206 B1 | 6/2002 | Ueda et al. |
| 2018/0002561 A1 | 1/2018 | Oomatsu et al. |
| 2019/0338064 A1 | 11/2019 | Mori et al. |
| 2020/0199352 A1 | 6/2020 | Masuda et al. |

FOREIGN PATENT DOCUMENTS

| CN | 106066578 A | 11/2016 |
| CN | 110291123 A | 9/2019 |
| JP | 2000-250217 A | 9/2000 |
| JP | 2002-332344 A | 11/2002 |
| JP | 2007-246559 A | 9/2007 |
| JP | 2008266534 A | * 11/2008 |
| JP | 2009-258652 A | 11/2009 |
| JP | 2010-044365 A | 2/2010 |
| JP | 2013-028764 A | 2/2013 |
| JP | 2016-170325 A | 9/2016 |
| JP | 2020-012092 A | 1/2020 |
| TW | 201946773 A | 12/2019 |
| WO | 2016/148095 A1 | 9/2016 |

OTHER PUBLICATIONS

English translation of JP2008266534. (Year: 2008).*
Office Action issued Aug. 1, 2023 in Japanese Application No. 2022-505991.
Office Action issued Jul. 21, 2023 in Chinese Application No. 202180019266.9.
International Search Report dated Apr. 27, 2021 in International Application No. PCT/JP2021/008332.
Written Opinion of the International Searching Authority dated Apr. 27, 2021 in International Application No. PCT/JP2021/008332.
International Preliminary Report on Patentability dated Sep. 6, 2022 in International Application No. PCT/JP2021/008332.
Office Action issued Mar. 29, 2024 in Chinese Application No. 202180019266.9.
Office Action dated Jul. 2, 2024 in Taiwanese Application No. 110108225.
Office Action issued Apr. 11, 2023 in Japanese Application No. 2022-505991.

* cited by examiner

*Primary Examiner* — Michael B Cleveland
*Assistant Examiner* — Anna Malloy
(74) *Attorney, Agent, or Firm* — Sughrue Mion, PLLC

(57) ABSTRACT

A resin composition includes a coloring material, a resin, and a solvent. The resin includes a graft polymer which has a main chain including a molecular chain having a structure derived from a compound having an ethylenically unsaturated bond-containing group and a graft chain, and the graft chain includes a repeating unit p1 having an oxetane group. The resin composition may be employed in a film formed of the resin composition; an optical filter; a solid-state imaging element; and an image display device.

18 Claims, No Drawings

RESIN COMPOSITION, FILM, OPTICAL FILTER, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2021/008332 filed on Mar. 4, 2021, which claims priority under 35 U.S.C § 119(a) to Japanese Patent Application No. 2020-041788 filed on Mar. 11, 2020 and Japanese Patent Application No. 2021-003309 filed on Jan. 13, 2021. Each of the above application(s) is hereby expressly incorporated by reference, in its entirety, into the present application.

BACKGROUND OF THE INVENTION

1. Field of the Invention

The present invention relates to a resin composition, a film, an optical filter, a solid-state imaging element, and an image display device.

2. Description of the Related Art

In recent years, as a digital camera, a mobile phone with a camera, and the like have been further spreading, there has been a greatly increasing demand for a solid-state imaging element such as a charge coupled device (CCD) image sensor. A film including a pigment, such as a color filter, has been used for the solid-state imaging element. The film including a coloring material, such as a color filter, is manufactured by using a resin composition and the like, which includes the coloring material, a resin, and a solvent.

For example, JP2016-170325A discloses an invention relating to a coloring composition for a color filter, containing a colorant, a dispersant, a binder resin, an epoxy compound, and a solvent, in which the dispersant contains a dispersant (X) that has a polyester moiety X1' which is obtained by reacting an acid anhydride group in one or more acid anhydrides (b) selected from a tetracarboxylic acid anhydride (b1) and a tricarboxylic acid anhydride (b2) with a hydroxyl group in a hydroxyl group-containing compound (a) and has a carboxy group and a vinyl polymer moiety X2' which is obtained by radically polymerizing an ethylenically unsaturated monomer (c) and has a thermally crosslinking functional group, in which the thermally crosslinking functional group is at least one selected from the group consisting of a hydroxyl group, an oxetane group, a t-butyl group, a blocked isocyanate group, and a (meth)acryloyl group.

SUMMARY OF THE INVENTION

In recent years, in the manufacturing process of a solid-state imaging element, it has been also studied to manufacture a film such as a color filter using a resin composition including a coloring material, a resin, and a solvent, and then subject the film to a step requiring a heating treatment at a high temperature (for example, 300° C. or higher).

From intensive studies with regard to the coloring composition disclosed in JP2016-170325A, the present inventor has found that a film obtained by this coloring composition has room for improvement in heat resistance.

Therefore, an object of the present invention is to provide a novel resin composition which can expand a process window of the process after manufacturing the film, a film, an optical filter, a solid-state imaging element, and an image display device.

Examples of typical embodiments of the present invention are shown below.

<1> A resin composition comprising:
a coloring material;
a resin; and
a solvent,
in which the resin includes a graft polymer which has a main chain including a molecular chain having a structure derived from a compound having an ethylenically unsaturated bond-containing group and a graft chain, and
the graft chain includes a repeating unit p1 having an oxetane group.

<2> The resin composition according to <1>,
in which the repeating unit p1 is a repeating unit represented by Formula (p1-1),

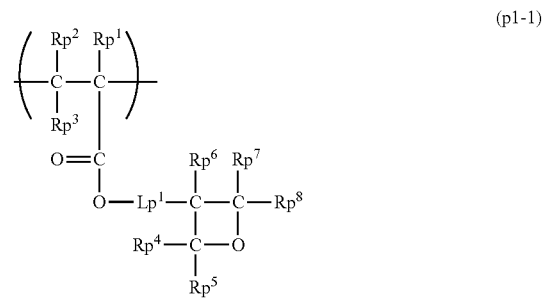

(p1-1)

in the formula, $Rp^1$ to $Rp^3$ each independently represent a hydrogen atom, an alkyl group, or an aryl group,
$Lp^1$ represents a divalent linking group, and
$Rp^4$ to $Rp^8$ each independently represent a hydrogen atom or an alkyl group.

<3> The resin composition according to <1> or <2>,
in which the graft chain includes a repeating unit having a group in which a carboxy group is protected by a heat-decomposable group.

<4> The resin composition according to <1> or <2>,
in which the graft chain includes a repeating unit having a t-butyl ester group.

<5> The resin composition according to <1> or <2>,
in which the graft chain includes a repeating unit represented by Formula (p2-10),

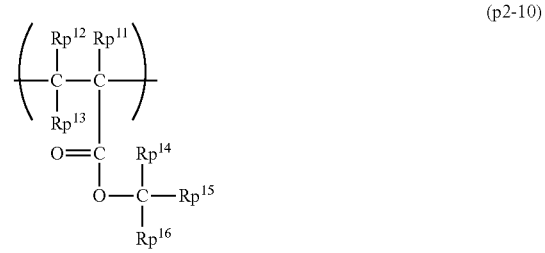

(p2-10)

in the formula, $Rp^{11}$ to $Rp^{13}$ each independently represent a hydrogen atom, an alkyl group, or an aryl group, and
$Rp^{14}$ to $Rp^{16}$ represent an alkyl group or an aryl group, and $Rp^{14}$ and $Rp^{15}$ may be bonded to each other to form a ring.

<6> The resin composition according to any one of <1> to <5>,
in which the main chain of the graft polymer includes a repeating unit represented by Formula (1),

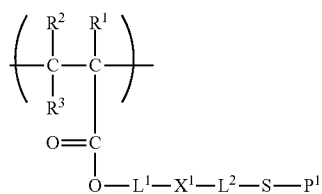

in the formula, $R^1$ to $R^3$ each independently represent a hydrogen atom, an alkyl group, or an aryl group,
$L^1$ and $L^2$ each independently represent a divalent linking group,
$X^1$ represents a single bond, —O—, —COO—, —OCO—, —NHCOO—, —OCONH—, or —NHCONH—, and
$P^1$ represents a graft chain including the repeating unit p1.
<7> The resin composition according to any one of <1> to <6>,
in which the main chain of the graft polymer includes a repeating unit having a crosslinkable group.
<8> The resin composition according to any one of <1> to <7>,
in which the main chain of the graft polymer includes a repeating unit having an acid group.
<9> The resin composition according to any one of <1> to <8>,
in which the coloring material includes a near-infrared absorbing coloring material.
<10> The resin composition according to any one of <1> to <8>,
in which the coloring material includes a black coloring material.
<11> The resin composition according to any one of <1> to <10>,
in which the coloring material includes at least one selected from Color Index Pigment Red 179, Color Index Pigment Red 264, Color Index Pigment Red 291, Color Index Pigment Blue 16, or Color Index Pigment Yellow 215.
<12> The resin composition according to any one of <1> to <11>,
in which Amin/B, which is a ratio of a minimum value Amin of an absorbance of the resin composition in a wavelength range of 400 to 640 nm to an absorbance B of the resin composition at a wavelength of 1500 nm, is 5 or more.
<13> The resin composition according to any one of <1> to <12>, further comprising:
a polymerizable monomer.
<14> The resin composition according to any one of <1> to <13>, further comprising:
a photopolymerization initiator.
<15> The resin composition according to any one of <1> to <14>,
in which the resin composition is used for a solid-state imaging element.
<16> A film formed of the resin composition according to any one of <1> to <15>.
<17> An optical filter comprising:
the film according to <16>.
<18> A solid-state imaging element comprising:
the film according to <16>.
<19> An image display device comprising:
the film according to <16>.

According to the present invention, a novel resin composition which can expand a process window of the process after manufacturing the film, a film, an optical filter, a solid-state imaging element, and an image display device are provided.

DESCRIPTION OF THE PREFERRED EMBODIMENTS

Hereinafter, main embodiments of the present invention will be described. However, the present invention is not limited to the specified embodiments.

In the present specification, "to" is used to refer to a meaning including numerical values denoted before and after "to" as a lower limit value and an upper limit value.

In the present specification, unless specified as a substituted group or as an unsubstituted group, a group (atomic group) denotes not only a group (atomic group) having no substituent but also a group (atomic group) having a substituent. For example, an "alkyl group" includes not only an alkyl group having no substituent (unsubstituted alkyl group), but also an alkyl group having a substituent (substituted alkyl group).

In the present specification, unless specified otherwise, "exposure" denotes not only exposure using light but also drawing using a corpuscular beam such as an electron beam or an ion beam. In addition, examples of light used for the exposure include actinic rays or radiation such as a bright line spectrum of a mercury lamp, far ultraviolet rays typified by an excimer laser, extreme ultraviolet rays (EUV light), X-rays, or electron beams.

In the present specification, a (meth)allyl group represents either or both of allyl and methallyl, "(meth)acrylate" represents either or both of acrylate and methacrylate, "(meth)acryl" represents either or both of acryl and methacryl, and "(meth)acryloyl" represents either or both of acryloyl and methacryloyl.

In the present specification, a weight-average molecular weight and a number-average molecular weight are values in terms of polystyrene through measurement by a gel permeation chromatography (GPC) method.

In the present specification, near-infrared rays denote light having a wavelength in a range of 700 to 2500 nm.

In the present specification, a total solid content denotes the total mass of all the components of the composition excluding a solvent.

In the present specification, the term "step" is not only an independent step, but also includes a step which is not clearly distinguished from other steps in a case where an intended action of the step is obtained.

In addition, in the present specification, a combination of preferred aspects is a more preferred aspect.

<Resin Composition>

A resin composition according to an embodiment of the present invention includes a coloring material, a resin, and a solvent, in which the resin includes a graft polymer which has a main chain including a molecular chain having a structure derived from a compound having an ethylenically unsaturated bond-containing group and a graft chain, and the graft chain includes a repeating unit p1 having an oxetane group.

Since the resin composition according to the embodiment of the present invention includes the above-described graft polymer (hereinafter, also referred to as a specific resin), it is possible to form a film having excellent heat resistance, which is not easily decomposed even at a high temperature and is less likely to contract even after a heating treatment at a high temperature. Therefore, even in a case where a film is formed of the resin composition according to the embodiment of the present invention and then the obtained film is heat-treated at a high temperature (for example, 300° C. or higher), the film contraction is suppressed, and even in a case where another film such as an inorganic film is formed on the film, it is possible to suppress occurrence of cracks in the another film. Therefore, with the resin composition according to the embodiment of the present invention, a process window of the process after manufacturing the film can be expanded. The detailed reason for obtaining such an effect is not sure, but is presumed as follows. Since the above-described main chain of the specific resin includes the molecular chain having a structure derived from a compound having an ethylenically unsaturated bond-containing group, it is presumed that a binding energy of the main chain is large and a depolymerization temperature of the resin is improved. In addition, since the graft chain includes the repeating unit p1 having an oxetane group, it is presumed that a strong crosslinking structure is formed by the oxetane group of the graft chain during film formation. Therefore, it is presumed that, even in a case where the film obtained by using the resin composition is subjected to high-temperature heating treatment, a site of the graft chain in the specific resin is less likely to detached from a site of the main chain. Therefore, with the resin composition according to the embodiment of the present invention including the above-described specific resin, it is presumed that it is possible to form a film having excellent heat resistance, which is not easily decomposed even at a high temperature and is less likely to contract even after a heating treatment at a high temperature. In addition, since the above-described specific resin has the oxetane group at the site of the graft chain, dispersibility of the coloring material in the resin composition can be improved, and storage stability of the resin composition can also be improved.

In a case where a film having a thickness of 0.60 μm is formed by heating the resin composition according to the embodiment of the present invention at 200° C. for 30 minutes, a thickness of the film after performing a heating treatment of the film at 300° C. for 5 hours in a nitrogen atmosphere is preferably 70% or more of a thickness of the film before the heating treatment, more preferably 80% or more thereof, and still more preferably 90% or more.

In addition, a thickness of the film after performing a heating treatment of the film at 350° C. for 5 hours in a nitrogen atmosphere is preferably 70% or more of a thickness of the film before the heating treatment, more preferably 80% or more thereof, and still more preferably 90% or more thereof.

In addition, a thickness of the film after performing a heating treatment of the film at 400° C. for 5 hours in a nitrogen atmosphere is preferably 70% or more of a thickness of the film before the heating treatment, more preferably 80% or more thereof, and still more preferably 90% or more thereof.

The above-described physical properties can be achieved by a method such as adjusting the type and content of the specific resin to be used.

In addition, in a case where a film having a thickness of 0.60 μm is formed by heating the resin composition according to the embodiment of the present invention at 200° C. for 30 minutes, a rate of change $\Delta A$ in absorbance of the film after the heating treatment at 300° C. for 5 hours in a nitrogen atmosphere, which is represented by Expression (A1), is preferably 50% or less, more preferably 45% or less, still more preferably 40% or less, and particularly preferably 35% or less.

$$\Delta A \ (\%) = |100 - (A2/A1) \times 100| \tag{A1}$$

$\Delta A$ is the rate of change in the absorbance of the film after the heating treatment;

A1 is a maximum value of an absorbance of the film before the heating treatment in a wavelength range of 400 to 1100 nm; and A2 is the absorbance of the film after the heating treatment, and is the absorbance at a wavelength showing the maximum value of the absorbance of the film before the heating treatment in a wavelength range of 400 to 1100 nm.

The above-described physical properties can be achieved by a method such as adjusting the type and content of the specific resin to be used.

In addition, in a case where a film having a thickness of 0.60 μm is formed by heating the resin composition according to the embodiment of the present invention at 200° C. for 30 minutes, an absolute value of a difference between a wavelength $\lambda 1$ showing the maximum value of the absorbance of the film in a wavelength range of 400 to 1100 nm and a wavelength $\lambda 2$ showing the maximum value of the absorbance of the film after the heating treatment at 300° C. for 5 hours in a nitrogen atmosphere is preferably 50 nm or less, more preferably 45 nm or less, and still more preferably 40 nm or less.

The above-described physical properties can be achieved by a method such as adjusting the type and content of the specific resin to be used.

In addition, in a case where a film having a thickness of 0.60 μm is formed by heating the resin composition according to the embodiment of the present invention at 200° C. for 30 minutes, a maximum value of the rate of change $\Delta A_\lambda$ in absorbance of the film after the heating treatment at 300° C. for 5 hours in a nitrogen atmosphere in a wavelength range of 400 to 1100 nm is preferably 30% or less, more preferably 27% or less, and still more preferably 25% or less. The rate of change in the absorbance is a value calculated from Expression (2).

$$\Delta A_\lambda = |100 - (A2_\lambda)/A1_\lambda) \times 100| \tag{2}$$

$\Delta A_\lambda$ is the rate of change in the absorbance of the film after the heating treatment at a wavelength $\lambda$;

$A1_\lambda$ is the absorbance of the film before the heating treatment at the wavelength $\lambda$; and $A2_\lambda$ is the absorbance of the film after the heating treatment at the wavelength $\lambda$.

The above-described physical properties can be achieved by a method such as adjusting the type and content of the specific resin to be used.

The resin composition according to the embodiment of the present invention is preferably used as a resin composition for an optical filter. Examples of the optical filter include a color filter, a near-infrared transmitting filter, and a near-infrared cut filter, and a color filter is preferable. In addition, the resin composition according to the embodiment of the present invention can be preferably used as a resin composition for a solid-state imaging element, and can be more preferably used as a resin composition for forming a pixel of an optical filter used in the solid-state imaging element.

Examples of the color filter include a filter having a colored pixel which transmits light having a specific wavelength, and a filter having at least one colored pixel selected from a red pixel, a blue pixel, a green pixel, a yellow pixel, a cyan pixel, or a magenta pixel is preferable. The color filter can be formed using a resin composition including a chromatic coloring material.

Examples of the near-infrared cut filter include a filter having a maximal absorption wavelength in a wavelength range of 700 to 1800 nm. The maximal absorption wavelength of the near-infrared cut filter is preferably in a wavelength range of 700 to 1300 nm and more preferably in a wavelength range of 700 to 1100 nm. In addition, in the near-infrared cut filter, a transmittance of in the entire wavelength range of 400 to 650 nm is preferably 70% or more, more preferably 80% or more, and still more preferably 90% or more. In addition, the transmittance at at least one point in a wavelength range of 700 to 1800 nm is preferably 20% or less. In addition, in the near-infrared cut filter, absorbance $A_{max}$/absorbance $A_{550}$, which is a ratio of an absorbance $A_{max}$ at a maximal absorption wavelength to an absorbance $A_{550}$ at a wavelength of 550 nm, is preferably 20 to 500, more preferably 50 to 500, still more preferably 70 to 450, and particularly preferably 100 to 400. The near-infrared cut filter can be formed using a resin composition including a near-infrared absorbing coloring material.

The near-infrared transmitting filter is a filter which transmits at least a part of near-infrared rays. As the near-infrared transmitting filter, a filter which shields at least a part of visible light and transmits at least a part of near-infrared rays is preferably. Preferred examples of the near-infrared transmitting filter include filters satisfying spectral characteristics in which the maximum value of a transmittance in a wavelength range of 400 to 640 nm is 20% or less (preferably 15% or less and more preferably 10% or less) and the minimum value of a transmittance in a wavelength range of 1100 to 1300 nm is 70% or more (preferably 75% or more and more preferably 80% or more). The near-infrared transmitting filter is preferably a filter which satisfies any one of the following spectral characteristics (1) to (5).

(1): filter in which the maximum value of a transmittance in a wavelength range of 400 to 640 nm is 20% or less (preferably 15% or less and more preferably 10% or less) and the minimum value of a transmittance in a wavelength range of 800 to 1500 nm is 70% or more (preferably 75% or more and more preferably 80% or more).

(2): filter in which the maximum value of a transmittance in a wavelength range of 400 to 750 nm is 20% or less (preferably 15% or less and more preferably 10% or less) and the minimum value of a transmittance in a wavelength range of 900 to 1500 nm is 70% or more (preferably 75% or more and more preferably 80% or more).

(3): filter in which the maximum value of a transmittance in a wavelength range of 400 to 830 nm is 20% or less (preferably 15% or less and more preferably 10% or less) and the minimum value of a transmittance in a wavelength range of 1000 to 1500 nm is 70% or more (preferably 75% or more and more preferably 80% or more).

(4): filter in which the maximum value of a transmittance in a wavelength range of 400 to 950 nm is 20% or less (preferably 15% or less and more preferably 10% or less) and the minimum value of a transmittance in a wavelength range of 1100 to 1500 nm is 70% or more (preferably 75% or more and more preferably 80% or more).

(5): filter in which the maximum value of a transmittance in a wavelength range of 400 to 1050 nm is 20% or less (preferably 15% or less and more preferably 10% or less) and the minimum value of a transmittance in a wavelength range of 1200 to 1500 nm is 70% or more (preferably 75% or more and more preferably 80% or more).

Examples of a preferred aspect of the spectral characteristics of the resin composition according to the embodiment of the present invention include an aspect in which, in a case where a film having a thickness of 5 μm is formed of the resin composition, the maximum value of light transmittance in a wavelength range of 360 to 700 nm in a thickness direction of the film is 50% or more. A resin composition satisfying such spectral characteristics can be preferably used as a resin composition for forming a pixel of a color filter. Specifically, the resin composition can be preferably used as a resin composition for forming a colored pixel selected from a red pixel, a blue pixel, a green pixel, a yellow pixel, a cyan pixel, and a magenta pixel.

The resin composition having the above-described spectral characteristics preferably includes a chromatic coloring material. For example, a resin composition including a red coloring material and a yellow coloring material can be preferably used as a resin composition for forming a red pixel. In addition, a resin composition including a blue coloring material and a violet coloring material can be preferably used as a resin composition for forming a blue pixel. In addition, a resin composition including a green coloring material can be preferably used as a resin composition for forming a green or cyan pixel. In a case where the resin composition is used as a resin composition for forming a green pixel, it is also preferable to further include a yellow coloring material in addition to the green coloring material.

Examples of another preferred aspect of the spectral characteristics of the resin composition according to the embodiment of the present invention include an aspect of spectral characteristics in which Amin/B, which is a ratio of the minimum value Amin of an absorbance in a wavelength range of 400 to 640 nm to an absorbance B at a wavelength of 1500 nm, is 5 or more. A resin composition satisfying such spectral characteristics can be preferably used as a resin composition for forming a pixel of a near-infrared transmitting filter. The value of Amin/B, which is the above-described absorbance ratio, is preferably 7.5 or more, more preferably 15 or more, and still more preferably 30 or more.

Here, the absorbance Aλ at the wavelength λ is defined by the following expression (λ1).

$$A\lambda = -\log(T\lambda/100) \qquad (\lambda 1)$$

Aλ is an absorbance at the wavelength λ and Tλ is a transmittance (%) at the wavelength λ.

In the present invention, the value of the absorbance may be a value measured in the form of a solution, or may be a value measured in the form of a film formed using a composition. In a case where the absorbance is measured in the state of the film, it is preferable that the absorbance is measured using a film obtained by applying the composition onto a glass substrate using a method such as spin coating and drying the film at 100° C. for 120 seconds using a hot plate.

The resin composition according to the embodiment of the present invention preferably satisfies any of the following spectral characteristics (Ir1) to (Ir5).

(Ir1): value of A1/B1, which is a ratio of the minimum value A1 of an absorbance in a wavelength range of 400 to 640 nm to the maximum value B1 of an absorbance in a wavelength range of 800 to 1500 nm, is 4.5 or more, preferably 7.5 or more, more preferably 15 or more, and still more preferably 30 or more. According to this aspect, it is possible to form a film capable of shielding light in a wavelength range of 400 to 640 nm and transmitting light having a wavelength of more than 750 nm.

(Ir2): value of A2/B2, which is a ratio of the minimum value A2 of an absorbance in a wavelength range of 400 to 750 nm to the maximum value B2 of an absorbance in a wavelength range of 900 to 1500 nm, is 4.5 or more, preferably 7.5 or more, more preferably 15 or more, and still more preferably 30 or more. According to this aspect, it is possible to form a film capable of shielding light in a wavelength range of 400 to 750 nm and transmitting light having a wavelength of more than 850 nm.

(Ir3): value of A3/B3, which is a ratio of the minimum value A3 of an absorbance in a wavelength range of 400 to 830 nm to the maximum value B3 of an absorbance in a wavelength range of 1000 to 1500 nm, is 4.5 or more, preferably 7.5 or more, more preferably 15 or more, and still more preferably 30 or more. According to this aspect, it is possible to form a film capable of shielding light in a wavelength range of 400 to 830 nm and transmitting light having a wavelength of more than 950 nm.

(Ir4): value of A4/B4, which is a ratio of the minimum value A4 of an absorbance in a wavelength range of 400 to 950 nm to the maximum value B4 of an absorbance in a wavelength range of 1100 to 1500 nm, is 4.5 or more, preferably 7.5 or more, more preferably 15 or more, and still more preferably 30 or more. According to this aspect, it is possible to form a film capable of shielding light in a wavelength range of 400 to 950 nm and transmitting light having a wavelength of more than 1050 nm.

(Ir5): value of A5/B5, which is a ratio of the minimum value A5 of an absorbance in a wavelength range of 400 to 1050 nm to the maximum value B5 of an absorbance in a wavelength range of 1200 to 1500 nm, is 4.5 or more, preferably 7.5 or more, more preferably 15 or more, and still more preferably 30 or more. According to this aspect, it is possible to form a film capable of shielding light in a wavelength range of 400 to 1050 nm and transmitting light having a wavelength of more than 1150 nm.

The resin composition according to the embodiment of the present invention is also preferably a resin composition used for forming a pattern in a photolithography method. According to this aspect, finely sized pixels can be easily formed. Therefore, the resin composition according to the embodiment of the present invention can be particularly preferably used as a resin composition for forming a pixel of an optical filter used in a solid-state imaging element. For example, a resin composition containing a component having an ethylenically unsaturated bond-containing group (for example, a resin having an ethylenically unsaturated bond-containing group or a monomer having an ethylenically unsaturated bond-containing group) and a photopolymerization initiator can be preferably used as a resin composition used for forming a pattern in a photolithography method. The resin composition for forming a pattern in the photolithography method preferably further contains an alkali-soluble resin.

The resin composition according to the embodiment of the present invention can also be used as a resin composition for forming a black matrix or a resin composition for forming a light-shielding film.

Hereinafter, the respective components used in the resin composition according to the embodiment of the present invention will be described.

<<Coloring Material>>

The resin composition according to the embodiment of the present invention contains a coloring material. Examples of the coloring material include a black coloring material, a chromatic coloring material, and a near-infrared absorbing coloring material. In the present invention, the white coloring material includes not only a pure white coloring material but also includes a bright gray (for example, grayish-white, light gray, and the like) coloring material close to white.

It is preferable that the coloring material includes at least one selected from the group consisting of a chromatic coloring material, a black coloring material, and a near-infrared absorbing coloring material, it is more preferable to include at least one selected from the group consisting of a chromatic coloring material and a near-infrared absorbing coloring material, it is still more preferable to include a chromatic coloring material, and it is even more preferable to include at least one chromatic coloring material selected from the group consisting of a red coloring material, a yellow coloring material, a blue coloring material, and a violet coloring material.

In addition, the coloring material also preferably includes a chromatic coloring material and a near-infrared absorbing coloring material, and also preferably includes two or more kinds of chromatic coloring materials and a near-infrared absorbing coloring material. In addition, a combination of two or more kinds of chromatic coloring materials may form black. In addition, the coloring material also preferably includes a black coloring material and a near-infrared absorbing coloring material. According to these aspects, the resin composition according to the embodiment of the present invention can be preferably used as a resin composition for forming a near-infrared transmitting filter. For a combination of coloring materials which form black with the combination of two or more kinds of chromatic coloring materials, JP2013-077009A, JP2014-130338A, WO2015/166779A, and the like can be referred to.

Examples of the coloring material include a dye and a pigment, and from the viewpoint of heat resistance, a pigment is preferable. In addition, the pigment may be an inorganic pigment or an organic pigment, but from the viewpoint of many color variations, ease of dispersion, safety, and the like, an organic pigment is preferable. In addition, it is preferable that the pigment includes at least one selected from a chromatic pigment or a near-infrared absorbing pigment, and it is more preferable to include a chromatic pigment.

In addition, it is preferable that the pigment includes at least one selected from a phthalocyanine pigment, a dioxazine pigment, a quinacridone pigment, an anthraquinone pigment, a perylene pigment, an azo pigment, a diketopyrrolopyrrole pigment, a pyrrolopyrrole pigment, an isoindoline pigment, or a quinophthalone pigment, it is more preferable to include at least one selected from a phthalocyanine pigment, a diketopyrrolopyrrole pigment, or a pyrrolopyrrole pigment, and it is still more preferable to include a phthalocyanine pigment or a diketopyrrolopyrrole pigment. In addition, from the reason that it is easy to form a film in which spectral characteristics do not easily fluctuate even after heating to a high temperature (for example, 300° C. or higher), the phthalocyanine pigment is preferably a phthalocyanine pigment having no central metal or a phthalocyanine pigment having copper or zinc as a central metal.

In addition, from the reason that it is easy to form a film in which spectral characteristics do not easily fluctuate even after heating to a high temperature (for example, 300° C. or higher), it is preferable that the coloring material included in the resin composition includes at least one selected from a red pigment, a yellow pigment, a blue pigment, or a near-infrared absorbing pigment, it is more preferable to include at least one selected from a red pigment or a blue pigment, and it is still more preferable to include a blue pigment.

The coloring material included in the resin composition preferably includes a pigment A satisfying the following requirement 1. By using a coloring material having such characteristics, it is possible to form a film in which spectral characteristics do not easily fluctuate even after heating to a high temperature (for example, 300° C. or higher). The proportion of the pigment A in the total amount of the pigment included in the resin composition is preferably 20% to 100% by mass, more preferably 30% to 100% by mass, and still more preferably 40% to 100% by mass.
Requirement 1)

In a case where a film having a thickness of 0.60 μm is formed by heating, at 200° C. for 30 minutes, a composition which includes 6% by mass of the pigment A, 10% by mass of a resin 1, and 84% by mass of propylene glycol monomethyl ether acetate, in a case where the film is subjected to a heating treatment at 300° C. for 5 hours in a nitrogen atmosphere, the rate of change ΔA10 in absorbance of the film after the heating treatment, which is represented by Expression (A10), is 50% or less;

$$\Delta A10=|100-(A12/A11)\times 100| \qquad (A10)$$

ΔA10 is the rate of change in the absorbance of the film after the heating treatment;

A11 is the maximum value of the absorbance of the film before the heating treatment in a wavelength range of 400 to 1100 nm;

A12 is the absorbance of the film after the heating treatment, and is the absorbance at the wavelength showing the maximum value of the film before the heating treatment in a wavelength range of 400 to 1100 nm; and The resin 1 is a resin having the following structure, in which a numerical value added to a main chain represents a molar ratio, the weight-average molecular weight is 11000, and the acid value is 32 mgKOH/g.

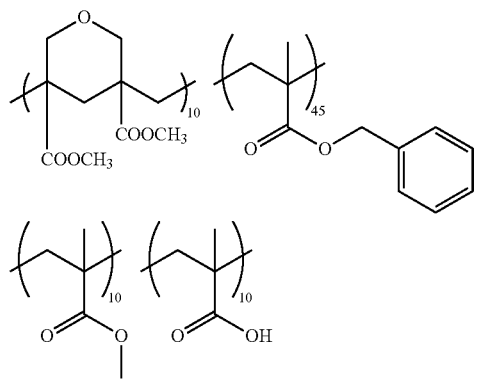

-continued

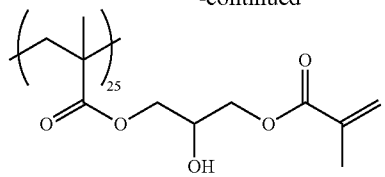

Examples of the pigment A satisfying the above-described requirement 1 include Color Index (C. I.) Pigment Red 254, C. I. Pigment Red 264, C. I. Pigment Red 272, C. I. Pigment Red 122, C. I. Pigment Red 177, C. I. Pigment Blue 15:3, C. I. Pigment Blue 15:4, C. I. Pigment Blue 15:6, and C. I. Pigment Blue 16.

In addition, it is also preferable that the resin composition according to the embodiment of the present invention includes at least one selected from C. I. Pigment Red 179, C. I. Pigment Red 264, C. I. Pigment Blue 16, or C. I. Pigment Yellow 215.

An average primary particle diameter of the pigment is preferably 1 to 200 nm. The lower limit is preferably 5 nm or more and more preferably 10 nm or more. The upper limit is preferably 180 nm or less, more preferably 150 nm or less, and still more preferably 100 nm or less. In a case where the average primary particle diameter of the pigment is within the above-described range, dispersion stability of the pigment in the resin composition is good. In the present invention, the primary particle diameter of the pigment can be determined from an image obtained by observing primary particles of the pigment using a transmission electron microscope. Specifically, a projected area of the primary particles of the pigment is determined, and the corresponding equivalent circle diameter is calculated as the primary particle diameter of the pigment. In addition, the average primary particle diameter in the present invention is an arithmetic average of the primary particle diameters with respect to 400 primary particles of the pigment. In addition, the primary particle of the pigment refers to a particle which is independent without aggregation.

(Chromatic Coloring Material)

Examples of the chromatic coloring material include a coloring material having a maximal absorption wavelength in a wavelength range of 400 to 700 nm. Examples thereof include a yellow coloring material, an orange coloring material, a red coloring material, a green coloring material, a violet coloring material, and a blue coloring material. From the viewpoint of heat resistance, the chromatic coloring material is preferably a pigment (chromatic pigment), more preferably a red pigment, a yellow pigment, or a blue pigment, and still more preferably a red pigment or a blue pigment. Specific examples of the chromatic pigment include the following.

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228, 231, 232 (methine-based), 233 (quinoline-based), 234 (aminoketone-based), 235 (aminoketone-based), 236 (aminoketone-based), and the like (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, 73, and the like (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 269, 270, 272, 279, 291, 294 (xanthene-based, Organo Ultramarine, Bluish Red), 295 (monoazo-based), 296 (diazo-based), 297 (aminoketone-based), and the like (all of which are red pigments);

C. I. Pigment Green 7, 10, 36, 37, 58, 59, 62, 63, 64 (phthalocyanine-based), 65 (phthalocyanine-based), 66 (phthalocyanine-based), and the like (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 29, 60, 64, 66, 79, 80, 87 (monoazo-based), 88 (methine-based), and the like (all of which are blue pigments).

Among these chromatic pigments, from the reason that it is easy to form a film in which the spectral characteristics do not easily fluctuate even after heating to a high temperature (for example, 300° C. or higher), as the red pigment, C. I. Pigment Red 254, C. I. Pigment Red 264, C. I. Pigment Red 272, C. I. Pigment Red 291, C. I. Pigment Red 122, or C. I. Pigment Red 177 is preferable. In addition, as the blue pigment, C. I. Pigment Blue 15:3, C. I. Pigment Blue 15:4, C. I. Pigment Blue 15:6, or C. I. Pigment Blue 16 is preferable.

In addition, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green coloring material. Specific examples thereof include the compounds described in WO2015/118720A. In addition, as the green coloring material, a compound described in CN2010-6909027A, a phthalocyanine compound described in WO2012/102395A, which has phosphoric acid ester as a ligand, a phthalocyanine compound described in JP2019-008014A, a phthalocyanine compound described in JP2018-180023A, a compound described in JP2019-038958A, and the like can also be used.

In addition, as the blue coloring material, an aluminum phthalocyanine compound having a phosphorus atom can also be used. Specific examples thereof include the compounds described in paragraph Nos. 0022 to 0030 of JP2012-247591A and paragraph No. 0047 of JP2011-157478A.

In addition, as the yellow coloring material, compounds described in JP2017-201003A, compounds described in JP2017-197719A, compounds described in paragraph Nos. 0011 to 0062 and 0137 to 0276 of JP2017-171912A, compounds described in paragraph Nos. 0010 to 0062 and 0138 to 0295 of JP2017-171913A, compounds described in paragraph Nos. 0011 to 0062 and 0139 to 0190 of JP2017-171914A, compounds described in paragraph Nos. 0010 to 0065 and 0142 to 0222 of JP2017-171915A, quinophthalone compounds described in paragraph Nos. 0011 to 0034 of JP2013-054339A, quinophthalone compounds described in paragraph Nos. 0013 to 0058 of JP2014-026228A, isoindoline compounds described JP2018-062644A, quinophthalone compounds described in JP2018-203798A, quinophthalone compounds described in JP2018-062578A, quinophthalone compounds described in JP6432076B, quinophthalone compounds described in JP2018-155881A, quinophthalone compounds described in JP2018-111757A, quinophthalone compounds described in JP2018-040835A, quinophthalone compounds described in JP2017-197640A, quinophthalone compounds described in JP2016-145282A, quinophthalone compounds described in JP2014-085565A, quinophthalone compounds described in JP2014-021139A, quinophthalone compounds described in JP2013-209614A, quinophthalone compounds described in JP2013-209435A, quinophthalone compounds described in JP2013-181015A, quinophthalone compounds described in JP2013-061622A, quinophthalone compounds described in JP2013-032486A, quinophthalone compounds described in JP2012-226110A, quinophthalone compounds described in JP2008-074987A, quinophthalone compounds described in JP2008-081565A, quinophthalone compounds described in JP2008-074986A, quinophthalone compounds described in JP2008-074985A, quinophthalone compounds described in JP2008-050420A, quinophthalone compounds described in JP2008-031281A, quinophthalone compounds described in JP1973-032765A (JP-S48-032765A), quinophthalone compounds described in JP2019-008014A, quinophthalone compounds described in JP6607427B, methine dyes described in JP2019-073695A, methine dyes described in JP2019-073696A, methine dyes described in JP2019-073697A, methine dyes described in JP2019-073698A, a compound represented by Formula (QP1), a compound represented by Formula (QP2), compounds described in KR10-2014-0034963A, compounds described in JP2017-095706A, compounds described in TW2019-20495A, and compounds described in JP6607427B can also be used. In addition, from the viewpoint of improving a color value, a multimerized compound of these compounds is also preferably used.

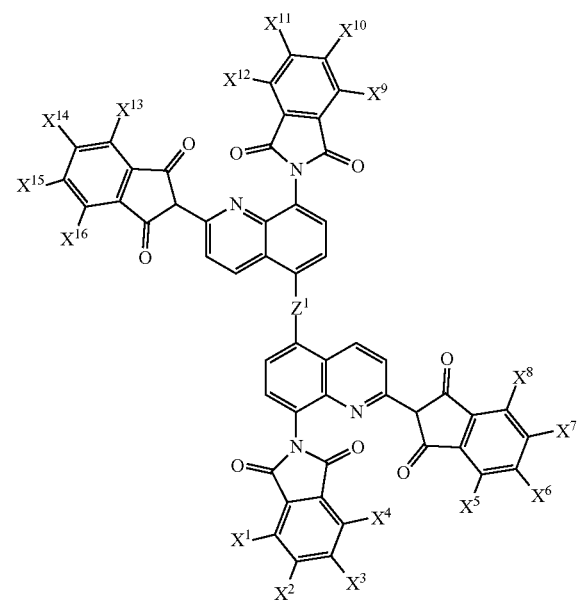

(QP1)

In Formula (QP1), $X^1$ to $X^{16}$ each independently represent a hydrogen atom or a halogen atom, and $Z^1$ represents an alkylene group having 1 to 3 carbon atoms. Specific examples of the compound represented by Formula (QP1) include compounds described in paragraph No. 0016 of JP6443711B.

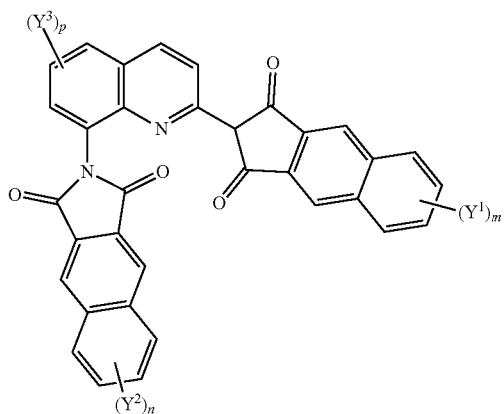

(QP2)

In Formula (QP2), $Y^1$ to $Y^3$ each independently represent a halogen atom. n and m represent an integer of 0 to 6, and p represents an integer of 0 to 5. (n+m) is 1 or more. Specific examples of the compound represented by Formula (QP2) include compounds described in paragraph Nos. 0047 and 0048 of JP6432077B.

As the red coloring material, diketopyrrolopyrrole compounds described in JP2017-201384A, in which the structure has at least one substituted bromine atom, diketopyrrolopyrrole compounds described in paragraph Nos. 0016 to 0022 of JP6248838B, diketopyrrolopyrrole compounds described in WO2012/102399A, diketopyrrolopyrrole compounds described in WO2012/117965A, naphtholazo compounds described in JP2012-229344, compounds described in JP6516119B, compounds described in JP6525101B, and the like can also be used. In addition, as the red coloring material, a compound having a structure that an aromatic ring group in which a group bonded with an oxygen atom, a sulfur atom, or a nitrogen atom is introduced to an aromatic ring is bonded to a diketopyrrolopyrrole skeleton can also be used. As the compound, a compound represented by Formula (DPP1) is preferable, and a compound represented by Formula (DPP2) is more preferable.

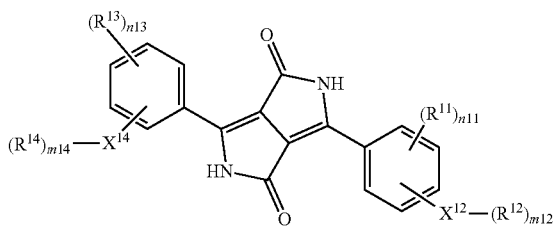

(DPP1)

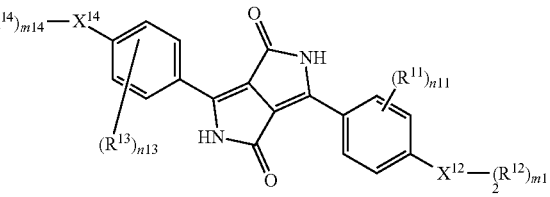

(DPP2)

In the formulae, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ is an oxygen atom or a sulfur atom, m12 represents 1, in a case where $X^{12}$ is a nitrogen atom, m12 represents 2, in a case where $X^{14}$ is an oxygen atom or a sulfur atom, m14 represents 1, and in a case where $X^{14}$ is a nitrogen atom, m14 represents 2. Preferred specific examples of the substituent represented by $R^{11}$ and $R^{13}$ include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

Regarding diffraction angles preferably possessed by various pigments, descriptions of JP6561862B, JP6413872B, and JP6281345B can be referred to, the contents of which are incorporated herein by reference.

Examples of the chromatic dye include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. In addition, as the chromatic dye, the thiazole compound described in JP2012-158649A, the azo compound described in JP2011-184493A, the azo compound described in JP2011-145540A, the triarylmethane dye polymer described in KR10-2020-0028160A, or the xanthene compound described in JP2020-117638A can also be preferably used.

As the chromatic coloring material, the phthalocyanine compound described in WO2020/174991A can be used.

The chromatic coloring material may be used in a combination of two or more kinds thereof. In addition, in a case where the chromatic coloring material is used in a combination of two or more kinds thereof, the combination of two or more kinds of chromatic coloring materials may form black. Examples of such a combination include the following aspects (1) to (7). In a case where two or more chromatic coloring materials are included in the resin composition and the combination of two or more chromatic coloring materials forms black, the resin composition according to the embodiment of the present invention can be preferably used as a resin composition for forming the near-infrared transmitting filter.

(1) aspect in which a red coloring material and a blue coloring material are contained.
(2) aspect in which a red coloring material, a blue coloring material, and a yellow coloring material are contained.

(3) aspect in which a red coloring material, a blue coloring material, a yellow coloring material, and a violet coloring material are contained.
(4) aspect in which a red coloring material, a blue coloring material, a yellow coloring material, a violet coloring material, and a green coloring material are contained.
(5) aspect in which a red coloring material, a blue coloring material, a yellow coloring material, and a green coloring material are contained.
(6) aspect in which a red coloring material, a blue coloring material, and a green coloring material are contained.
(7) aspect in which a yellow coloring material and a violet coloring material are contained.

(White Coloring Material)

Examples of the white coloring material include inorganic pigments (white pigments) such as titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, the white pigment is preferably a particle having a refractive index of 2.10 or more with respect to light having a wavelength of 589 nm. The above-mentioned refractive index is preferably 2.10 to 3.00 and more preferably 2.50 to 2.75.

In addition, as the white pigment, the titanium oxide described in "Titanium Oxide-Physical Properties and Applied Technology, written by Manabu Kiyono, pages 13 to 45, published in Jun. 25, 1991, published by Gihodo Shuppan Co., Ltd." can also be used.

The white pigment is not limited to a compound formed of a single inorganic substance, and may be particles combined with other materials. For example, it is preferable to use a particle having a pore or other materials therein, a particle having a number of inorganic particles attached to a core particle, or a core-shell composite particle composed of a core particle formed of polymer particles and a shell layer formed of inorganic fine nanoparticles. With regard to the core-shell composite particle composed of a core particle formed of polymer particles and a shell layer formed of inorganic fine nanoparticles, reference can be made to, for example, the descriptions in paragraph Nos. 0012 to 0042 of JP2015-047520A, the contents of which are incorporated herein by reference.

As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

(Black Coloring Material)

The black coloring material is not particularly limited, and a known black coloring material can be used. Examples of an inorganic black coloring material include inorganic pigments (black pigments) such as carbon black, titanium black, and graphite, and carbon black or titanium black is preferable and titanium black is more preferable. The titanium black is black particles containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. Examples of the black pigment include Color Index (C. I.) Pigment Black 1 and 7. It is preferable that the titanium black has a small primary particle diameter of the individual particles and has a small average primary particle diameter. Specifically, an average primary particle diameter thereof is preferably 10 to 45 nm. The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs 0020 to 0105 of JP2012-169556A, the contents of which are incorporated herein by reference. Examples of a commercially available product of the titanium black include Titanium black 10S, 12S, 13R, 13M, 13M-C, 13R-N, 13M-T (trade name; manufactured by Mitsubishi Materials Corporation) and Tilack D (trade name; manufactured by Akokasei Co., Ltd.).

In addition, examples of the organic black coloring material include a bisbenzofuranone compound, an azomethine compound, a perylene compound, and an azo compound. Examples of the bisbenzofuranone compound include the compounds described in JP2010-534726A, JP2012-515233A, JP2012-515234A, and the like, and the bisbenzofuranone compound is available, for example, as "Irgaphor Black" manufactured by BASF SE. Examples of the perylene compound include compounds described in paragraph Nos. 0016 to 0020 of JP2017-226821A, and C. I. Pigment Black 31 and 32. Examples of the azomethine compound include the compounds described in JP1989-170601A (JP-H01-170601A) and JP1990-034664A (JP-H02-034664A), and the azomethine compound is available, for example, "CHROMOFINE BLACK A1103" manufactured by Dainichiseika Color & Chemicals Mfg. Co., Ltd.

The coloring material used in the resin composition according to the embodiment of the present invention may be only the above-described black coloring material, or may further include the chromatic coloring material. According to this aspect, it is easy to obtain a resin composition with which a film having excellent light-shielding properties in the visible region can be formed. In a case where the black coloring material and the chromatic coloring material are used in combination as the coloring material, the mass ratio of the two is preferably black coloring material:chromatic coloring material=100:10 to 300, and more preferably 100:20 to 200. In addition, it is preferable to use the black pigment as the black coloring material, and it is preferable to use the chromatic pigment as the chromatic coloring material.

Examples of preferred combinations of the black coloring material and the chromatic coloring material include the following.

(A-1) aspect in which the organic black coloring material and the blue coloring material are contained
(A-2) aspect in which the organic black coloring material, the blue coloring material, and the yellow coloring material are contained
(A-3) aspect in which the organic black coloring material, the blue coloring material, the yellow coloring material, and the red coloring material are contained
(A-4) aspect in which the organic black coloring material, the blue coloring material, the yellow coloring material, and the violet coloring material are contained In the above-described aspect (A-1), the mass ratio of the organic black coloring material and the blue coloring material is preferably organic black coloring material:blue coloring material=100:1 to 70, more preferably 100:5 to 60, and still more preferably 100:10 to 50.

In the above-described aspect (A-2), the mass ratio of the organic black coloring material, the blue coloring material, and the yellow coloring material is preferably organic black coloring material:blue coloring material:yellow coloring material=100:10 to 90:10 to 90, more preferably 100:15 to 85:15 to 80, and still more preferably 100:20 to 80:20 to 70.

In the above-described aspect (A-3), the mass ratio of the organic black coloring material, the blue coloring material, the yellow coloring material, and the red coloring material is preferably organic black coloring material:blue coloring material:yellow coloring material:red coloring material=100:20 to 150:1 to 60:10 to 100, more preferably 100:30 to 130:5 to 50:20 to 90, and still more preferably 100:40 to 120:10 to 40:30 to 80.

In the above-described aspect (A-4), the mass ratio of the organic black coloring material, the blue coloring material, the yellow coloring material, and the violet coloring material is preferably organic black coloring material:blue coloring material:yellow coloring material:violet coloring material=100:20 to 150:1 to 60:10 to 100, more preferably 100:30 to 130:5 to 50:20 to 90, and still more preferably 100:40 to 120:10 to 40:30 to 80.

(Near-Infrared Absorbing Coloring Material)

The near-infrared absorbing coloring material is preferably a pigment, and more preferably an organic pigment. In addition, the near-infrared absorbing coloring material preferably has a maximal absorption wavelength in a wavelength range of more than 700 nm and 1400 nm or less. In addition, the maximal absorption wavelength of the near-infrared absorbing coloring material is preferably 1200 nm or less, more preferably 1000 nm or less, and still more preferably 950 nm or less. In addition, in the near-infrared absorbing coloring material, $A_{550}/A_{max}$, which is a ratio of an absorbance $A_{550}$ at a wavelength of 550 nm to an absorbance $A_{max}$ at the maximal absorption wavelength, is preferably 0.1 or less, more preferably 0.05 or less, still more preferably 0.03 or less, and particularly preferably 0.02 or less. The lower limit is not particularly limited, but for example, may be 0.0001 or more or may be 0.0005 or more. In a case where the ratio of the above-described absorbance is within the above-described range, a near-infrared absorbing coloring material excellent in visible light transparency and near-infrared shielding properties can be obtained. In the present invention, the maximal absorption wavelength of the near-infrared absorbing coloring material and values of absorbance at each wavelength are values obtained from an absorption spectrum of a film formed by using a resin composition including the near-infrared absorbing coloring material.

The near-infrared absorbing coloring material is not particularly limited, and examples thereof include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, and a dithiolene metal complex. Examples of the pyrrolopyrrole compound include compounds described in paragraph Nos. 0016 to 0058 of JP2009-263614A, compounds described in paragraph Nos. 0037 to 0052 of JP2011-068731A, and compounds described in paragraph Nos. 0010 to 0033 of WO2015/166873A. Examples of the squarylium compound include compounds described in paragraph Nos. 0044 to 0049 of JP2011-208101A, compounds described in paragraph Nos. 0060 and 0061 of JP6065169B, compounds described in paragraph No. 0040 of WO2016/181987A, compounds described in JP2015-176046A, compounds described in paragraph No. 0072 of WO2016/190162A, compounds described in paragraph Nos. 0196 to 0228 of JP2016-074649A, compounds described in paragraph No. 0124 of JP2017-067963A, compounds described in WO2017/135359A, compounds described in JP2017-114956A, compounds described in JP6197940B, and compounds described in WO2016/120166A. Examples of the cyanine compound include compounds described in paragraph Nos. 0044 and 0045 of JP2009-108267A, compounds described in paragraph Nos. 0026 to 0030 of JP2002-194040A, compounds described in JP2015-172004A, compounds described in JP2015-172102A, compounds described in JP2008-088426A, compounds described in paragraph No. 0090 of WO2016/190162A, and compounds described in JP2017-031394A. Examples of the croconium compound include compounds described in JP2017-082029A. Examples of the iminium compound include compounds described in JP2008-528706A, compounds described in JP2012-012399A, compounds described in JP2007-092060A, and compounds described in paragraph Nos. 0048 to 0063 of WO2018/043564A. Examples of the phthalocyanine compound include compounds described in paragraph No. 0093 of JP2012-077153A, oxytitanium phthalocyanine described in JP2006-343631A, compounds described in paragraph Nos. 0013 to 0029 of JP2013-195480A, vanadium phthalocyanine compounds described in JP6081771B, and compounds described in WO2020/071470A. Examples of the naphthalocyanine compound include compounds described in paragraph No. 0093 of JP2012-077153A. Examples of the dithiolene metal complex include compounds described in JP5733804B.

In addition, as the near-infrared absorbing coloring material, squarylium compounds described in JP2017-197437A, squarylium compounds described in JP2017-025311A, squarylium compounds described in WO2016/154782A, squarylium compounds described in JP5884953B, squarylium compounds described in JP6036689B, squarylium compounds described in JP5810604B, squarylium compounds described in paragraph Nos. 0090 to 0107 of WO2017/213047A, pyrrole ring-containing compounds described in paragraph Nos. 0019 to 0075 of JP2018-054760A, pyrrole ring-containing compounds described in paragraph Nos. 0078 to 0082 of JP2018-040955A, pyrrole ring-containing compounds described in paragraph Nos. 0043 to 0069 of JP2018-002773A, squarylium compounds having an aromatic ring at the α-amide position described in paragraph Nos. 0024 to 0086 of JP2018-041047A, amide-linked squarylium compounds described in JP2017-179131A, compounds having a pyrrole bis-type squarylium skeleton or a croconium skeleton described in JP2017-141215A, dihydrocarbazole bis-type squarylium compounds described in JP2017-082029, asymmetric compounds described in paragraph Nos. 0027 to 0114 of JP2017-068120A, pyrrole ring-containing compounds (carbazole type) described in JP2017-067963A, phthalocyanine compounds described in JP6251530B, squalylium compounds described in JP2020-075959A, copper complex described in KR10-2019-0135217A, coloring materials described in JP2013-077009A, JP2014-130338A, and WO2015/166779A, combinations of coloring materials described in these documents, or the like can also be used.

A content of the coloring material in the total solid content of the resin composition is preferably 20% to 90% by mass. The lower limit is preferably 30% by mass or more, more preferably 40% by mass or more, and still more preferably 50% by mass or more. The upper limit is preferably 80% by mass or less and more preferably 70% by mass or less.

In addition, a content of the pigment in the total solid content of the resin composition is preferably 20% to 90% by mass. The lower limit is preferably 30% by mass or more, more preferably 40% by mass or more, and still more preferably 50% by mass or more. The upper limit is preferably 80% by mass or less and more preferably 70% by mass or less.

In addition, the content of the dye in the coloring material is preferably 50% by mass or less, more preferably 40% by mass or less, and still more preferably 30% by mass or less.

In addition, from the reason that it is easy to more effectively suppress the change in film thickness in a case where the obtained film is heated to a high temperature, it is also preferable that the resin composition according to the embodiment of the present invention does not substantially include the dye. The case where the resin composition according to the embodiment of the present invention does not substantially include the dye means that the content of the dye in the total solid content of the resin composition according to the embodiment of the present invention is preferably 0.1% by mass or less, more preferably 0.05% by mass or less, and particularly preferably 0% by mass.

<<Resin>>

(Specific Resin)

The resin composition according to the embodiment of the present invention includes a resin. The resin included in the resin composition includes a graft polymer which has a main chain including a molecular chain having a structure derived from a compound having an ethylenically unsaturated bond-containing group and a graft chain, in which the graft chain includes a repeating unit p1 having an oxetane group. Hereinafter, the above-described graft polymer is also referred to as a specific resin. Since this specific resin includes the above-described graft chain, the dispersibility of the coloring material is also excellent, and the specific resin can be preferably used as a dispersant. In addition, the specific resin may be used as a binder. In the present specification, the main chain means a molecular chain having the most branch points. In addition, the graft chain means a molecular chain branched from the main chain.

The specific resin also preferably includes at least one selected from an ethylenically unsaturated bond-containing group or an epoxy group. According to this aspect, a film having more excellent heat resistance can be formed. Examples of the ethylenically unsaturated bond-containing group include a (meth)acryloyl group, a (meth)acryloyloxy group, a (meth)acrylamide group, a vinylphenyl group, and an allyl group, and from the viewpoint of reactivity, a (meth)acryloyloxy group is preferable. In a case where the specific resin includes an ethylenically unsaturated bond-containing group or an epoxy group, these groups may be included in the graft chain or in repeating units constituting the main chain of the graft polymer.

In a case where the specific resin includes an ethylenically unsaturated bond-containing group, from the viewpoint of storage stability and curing properties, an ethylenically unsaturated bond-containing group value (hereinafter, also referred to as a C=C value) of the specific resin is preferably 0.01 to 5 mmol/g. The lower limit of the C=C value is preferably 0.02 mmol/g or more, more preferably 0.03 mmol/g or more, still more preferably 0.05 mmol/g or more, and particularly preferably 0.10 mmol/g or more. The upper limit of the above-described C=C value is preferably 3 mmol/g or less, more preferably 2 mmol/g or less, still more preferably 1.5 mmol/g or less, and particularly preferably 1 mmol/g or less. The C=C value of the specific resin refers to the number of ethylenically unsaturated bond-containing groups included in 1 g of the specific resin.

In a case where the specific resin includes an epoxy group, from the viewpoint of storage stability and curing properties, an epoxy group value of the specific resin is preferably 0.01 to 5 mmol/g. The lower limit of the epoxy group value is preferably 0.02 mmol/g or more, more preferably 0.03 mmol/g or more, still more preferably 0.05 mmol/g or more, and particularly preferably 0.10 mmol/g or more. The upper limit of the above-described epoxy group value is preferably 3 mmol/g or less, more preferably 2 mmol/g or less, still more preferably 1.5 mmol/g or less, and particularly preferably 1 mmol/g or less.

The main chain of the specific resin preferably has a repeating unit represented by Formula (a1-1) as the repeating unit having the above-described graft chain.

(a1-1)

In Formula (a1-1), $A^{1a}$ represents a molecular chain which has a structure derived from a compound having an ethylenically unsaturated bond-containing group, $L^{1a}$ represents a single bond or a divalent linking group, and $P^{1a}$ represents the graft chain including the above-described repeating unit p1.

In Formula (a1-1), examples of the molecular chain which has a structure derived from a compound having an ethylenically unsaturated bond-containing group, represented by $A^{1a}$, include molecular chains which have a structure formed by polymerization of a compound having an ethylenically unsaturated bond-containing group such as (meth)acrylic acid esters, crotonic esters, vinyl esters, maleic acid diesters, fumaric acid diesters, itaconic acid diesters, (meth)acrylamides, styrenes, vinyl ethers, vinyl ketones, olefins, maleimides, and (meth)acrylonitriles. Specific examples of $A^{1a}$ include structures represented by Formulae (A-1) to (A-5), and a structure represented by Formula (A-1) is preferable. In the formulae, * represents a bonding site with $L^{1a}$ in Formula (a1-1), and $R^{a1}$ to $R^{a3}$ each independently represent a hydrogen atom, an alkyl group, or an aryl group. The alkyl group preferably has 1 to 10 carbon atoms, more preferably has 1 to 5 carbon atoms, and still more preferably 1 to 3 carbon atoms. The alkyl group may be linear, branched, or cyclic forms, and is preferably linear or branched and more preferably linear. The aryl group preferably has 6 to 20 carbon atoms, more preferably has 6 to 12 carbon atoms, and still more preferably has 6 to 10 carbon atoms. $R^{a1}$ is preferably a hydrogen atom or an alkyl group. $R^{a2}$ and $R^{a3}$ are preferably hydrogen atoms.

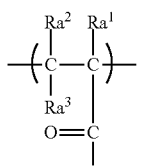

(A-1)

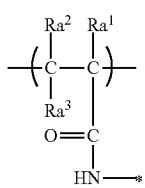

(A-2)

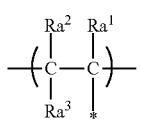

(A-3)

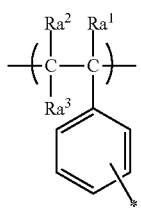

(A-4)

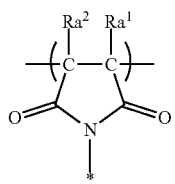

(A-5)

In Formula (a1-1), examples of the divalent linking group represented by $L^{1a}$ include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group formed by a combination of two or more these groups. The alkylene group and the arylene group may have a substituent. Examples of the substituent include a hydroxy group and a halogen atom. The divalent linking group represented by $L^{1a}$ is preferably a group represented by Formula (L-1).

$$*2—L^{3a}-X^1—L^{4a}-S—*1 \quad (L-1)$$

In Formula (L-1), $L^{3a}$ and $L^{4a}$ each independently represent a divalent linking group, $X^1$ represents a single bond, —O—, —COO—, —OCO—, —NHCOO—, —OCONH—, or —NHCONH—, *1 represents a bonding site with $P^{1a}$, and *2 represents a bonding site with A.

Examples of the divalent linking group represented by $L^{3a}$ and $L^{4a}$ in Formula (L-1) include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group formed by a combination of two or more these groups. The alkylene group and the arylene group may have a substituent. In a case where $X^1$ is —O—, —COO—, —OCO—, —NHCOO—, —OCONH—, or —NHCONH—, $L^{3a}$ and $L^{4a}$ are each independently preferably an alkylene group or an arylene group, and more preferably an alkylene group.

$X^1$ is preferably —O—, —COO—, —OCO—, —NHCOO—, —OCONH—, or —NHCONH—, and more preferably —NHCOO— or —OCONH—.

In Formula (a1-1), the graft chain represented by $P^{1a}$ includes the above-described repeating unit p1. As the repeating unit p1, a repeating unit derived from a compound having an ethylenically unsaturated bond-containing group is preferable. Specific examples of the repeating unit p1 include a repeating unit represented by Formulae (p1-1) to (p1-4), and a repeating unit represented by Formula (p1-1) is preferable.

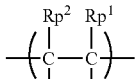

(p1-1)

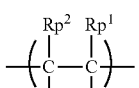

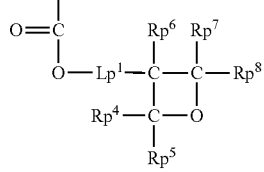

(p1-2)

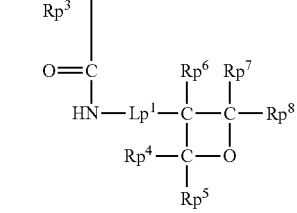

(p1-3)

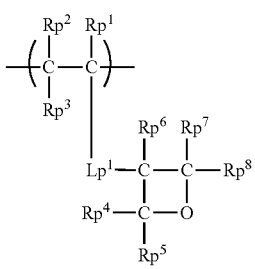

-continued

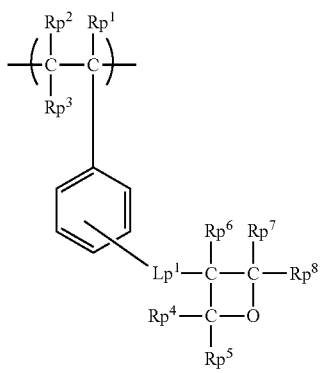
(p1-4)

In the formulae, $Rp^1$ to $Rp^3$ each independently represent a hydrogen atom, an alkyl group, or an aryl group, $Lp^1$ represents a divalent linking group, and $Rp^4$ to $Rp^8$ each independently represent a hydrogen atom or an alkyl group.

The alkyl group represented by $Rp^1$ to $Rp^3$ preferably has 1 to 10 carbon atoms, more preferably has 1 to 5 carbon atoms, and still more preferably has 1 to 3 carbon atoms. The alkyl group may be linear, branched, or cyclic forms, and is preferably linear or branched and more preferably linear. The aryl group represented by $Rp^1$ to $Rp^3$ preferably has 6 to 20 carbon atoms, more preferably has 6 to 12 carbon atoms, and still more preferably has 6 to 10 carbon atoms. $Rp^1$ is preferably a hydrogen atom or an alkyl group. $Rp^2$ and $Rp^3$ are preferably hydrogen atoms.

The alkyl group represented by $Rp^4$ to $Rp^8$ preferably has 1 to 10 carbon atoms and more preferably has 1 to 5 carbon atoms. The alkyl group may be linear, branched, or cyclic forms, and is preferably linear or branched and more preferably linear. In the formulae, it is preferable that $Rp^4$, $Rp^5$, $Rp^7$, and $Rp^8$ are hydrogen atoms and $Rp^6$ is an alkyl group.

Examples of the divalent linking group represented by $Lp^1$ include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group including a combination of two or more thereof, and an alkylene group is preferable. The alkylene group and the arylene group may have a substituent. Examples of the substituent include a hydroxy group and a halogen atom.

It is also preferable that the graft chain represented by $P^{1a}$ further includes a repeating unit p2 having a group in which a carboxy group is protected by a heat-decomposable group (hereinafter, also referred to as a protected carboxy group). According to this aspect, by heating during film formation, the heat-decomposable group is eliminated from the above-described protected carboxy group to generate a carboxy group, and the generated carboxy group can promote a crosslinking reaction of the oxetane group in the graft chain. In addition, since the carboxy group is generated in the vicinity of the oxetane group in the graft chain, the crosslinking reaction of the oxetane group can be promoted more effectively. Therefore, it is possible to form a film having more excellent heat resistance, in which film contraction after heating is further suppressed. In addition, since the carboxy group is protected by the heat-decomposable group in a state before heating, the reaction and the like of the oxetane group during storage of the resin composition can be suppressed, and the storage stability of the resin composition is also excellent.

Here, the group (protected carboxy group) in which the carboxy group is protected by a heat-decomposable group refers to a group in which the heat-decomposable group is eliminated by heating to generate a carboxy group. The group in which the carboxy group is protected by a heat-decomposable group is preferably a group in which a carboxy group is generated by heating to a temperature of 120° C. to 290° C., more preferably 200° C. to 260° C.

Examples of the above-described protected carboxy group include a group having a structure in which a carboxy group is protected by a tertiary alkyl group, a group having a structure in which a carboxy group is protected by an acetal group or a ketal group, and a group having a structure in which a carboxy group is protected by a carbonate ester group, and from the viewpoint of dispersion stability of the coloring material and ease of generation of carboxy group by heating, a group having a structure in which a carboxy group is protected by a tertiary alkyl group is preferable. Specific examples of the protected carboxy group include a group represented by Formulae (b1-1) to (b1-3), and from the viewpoint of dispersion stability of the coloring material and ease of generation of carboxy group by heating, a group represented by Formula (b1-1) is preferable.

(b1-1)

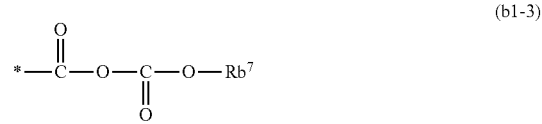
(b1-2)

$$*-\overset{O}{\overset{\|}{C}}-O-\overset{}{\underset{\|}{C}}-O-Rb^7$$
(b1-3)

In Formula (b1-1), $Rb^1$ to $Rb^3$ each independently represent an alkyl group or an aryl group, and $Rb^1$ and $Rb^2$ may be bonded to each other to form a ring.

In Formula (b1-2), $Rb^4$ represents an alkyl group or an aryl group, $Rb^5$ and $Rb^6$ each independently represent a hydrogen atom, an alkyl group, or an aryl group, at least one of $Rb^5$ or $Rb^6$ is an alkyl group or an aryl group, and $Rb^4$ and $Rb^5$ may be bonded to each other to form a ring.

In Formula (b1-3), $Rb^7$ represents an alkyl group or an aryl group.

* in Formulae (b1-1) to (b1-3) represents a bonding site.

The alkyl group represented by $Rb^1$ to $Rb^3$ preferably has 1 to 10 carbon atoms, more preferably has 1 to 5 carbon atoms, and still more preferably has 1 to 3 carbon atoms. The alkyl group may be linear, branched, or cyclic, and is preferably linear or branched.

The aryl group represented by $Rb^1$ to $Rb^3$ preferably has 6 to 20 carbon atoms, more preferably has 6 to 12 carbon atoms, and still more preferably has 6 to 10 carbon atoms.

$Rb^1$ to $Rb^3$ are each independently preferably an alkyl group, more preferably a linear alkyl group, still more preferably a linear alkyl group having 1 to 5 carbon atoms, even more preferably a linear alkyl group having 1 to 3 carbon atoms, and particularly preferably a methyl group.

In Formula (b1-1), $Rb^1$ and $Rb^2$ may be bonded to each other to form a ring. The ring formed is preferably a 5-membered ring or a 6-membered ring.

The alkyl group represented by $Rb^4$ to $Rb^6$ preferably has 1 to 20 carbon atoms, more preferably has 1 to 10 carbon atoms, and still more preferably has 1 to 10 carbon atoms. The alkyl group may be linear, branched, or cyclic, and is preferably linear or branched.

The aryl group represented by $Rb^4$ to $Rb^6$ preferably has 6 to 20 carbon atoms, more preferably has 6 to 12 carbon atoms, and still more preferably has 6 to 10 carbon atoms.

In Formula (b1-2), $Rb^4$ and $Rb^5$ may be bonded to each other to form a ring. The ring formed is preferably a 5-membered ring or a 6-membered ring.

The alkyl group represented by $Rb^7$ preferably has 1 to 20 carbon atoms, more preferably has 1 to 10 carbon atoms, and still more preferably has 1 to 10 carbon atoms. The alkyl group may be linear, branched, or cyclic, and is preferably linear or branched.

The aryl group represented by $Rb^7$ preferably has 6 to 20 carbon atoms, more preferably has 6 to 12 carbon atoms, and still more preferably has 6 to 10 carbon atoms.

$Rb^1$ to $Rb^3$ in Formula (b1-1) are each independently preferably an alkyl group, more preferably a linear alkyl group, and still more preferably a methyl group.

Specific examples of the protected carboxy group include groups shown below, and a group represented by Formula (bb-1), that is, a t-butyl ester group is preferable. The t-butyl ester group has an optimum decomposition temperature, and it is easy to generate a carboxy group by a heating treatment during film formation. As a result, the crosslinking reaction of the oxetane group can be promoted more effectively, and a film having more excellent heat resistance can be formed. In addition, since a volume of an eliminated substance of the t-butyl ester group is small, it is possible to suppress generation voids in the film. In the formulae, * represents a bonding site.

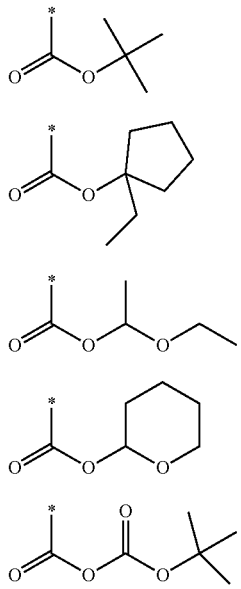

(bb-1)

(bb-2)

(bb-3)

(bb-4)

(bb-5)

Examples of the repeating unit p2 include a repeating unit represented by Formulae (p2-1) to (p2-4).

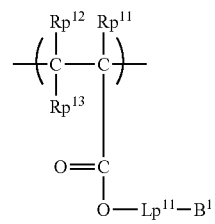

(p2-1)

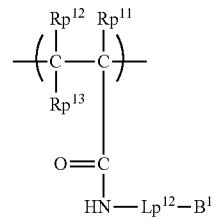

(p2-2)

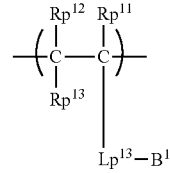

(p2-3)

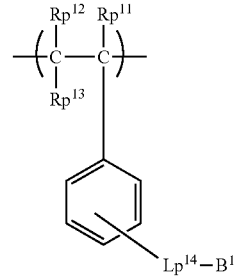

(p2-4)

In the formulae, $Rp^{11}$ to $Rp^{13}$ each independently represent a hydrogen atom, an alkyl group, or an aryl group, $Lp^{11}$ to $Lp^{14}$ each independently represent a single bond or a divalent linking group, and $B^1$ represents the group represented Formula (b1-1), the group represented Formula (b1-2), or the group represented Formula (b1-3).

The alkyl group represented by $Rp^{11}$ to $Rp^{13}$ preferably has 1 to 10 carbon atoms, more preferably has 1 to 5 carbon atoms, and still more preferably has 1 to 3 carbon atoms. The alkyl group may be linear, branched, or cyclic forms, and is preferably linear or branched and more preferably linear. The aryl group represented by $Rp^{11}$ to $Rp^{13}$ preferably has 6 to 20 carbon atoms, more preferably has 6 to 12 carbon atoms, and still more preferably has 6 to 10 carbon atoms. $Rp^{11}$ is preferably a hydrogen atom or an alkyl group. $Rp^{12}$ and $Rp^{13}$ are preferably hydrogen atoms.

Examples of the divalent linking group represented by $Lp^{11}$ to $Lp^{14}$ include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group including a combination of two or more thereof, and an alkylene group is preferable. The alkylene group and the arylene group may have a substituent. Examples of the substituent include a hydroxy group and a halogen atom.

B¹ represents the group represented Formula (b1-1), the group represented Formula (b1-2), or the group represented Formula (b1-3), and the group represented by Formula (b1-1) is preferable.

The repeating unit p2 is preferably a repeating unit represented by Formula (p2-10).

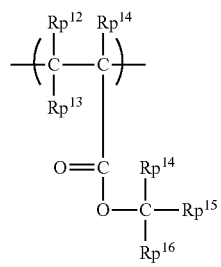

(p2-10)

In the formula, $Rp^{11}$ to $Rp^{13}$ each independently represent a hydrogen atom, an alkyl group, or an aryl group, $Rp^{14}$ to $Rp^{16}$ represent an alkyl group or an aryl group, and $Rp^{14}$ and $Rp^{15}$ may be bonded to each other to form a ring.

The graft chain represented by $P^{1a}$ may include a repeating unit other than the above-described repeating unit p1 and the above-described repeating unit p2. Examples of the other repeating units include a repeating unit having an ethylenically unsaturated bond-containing group, a repeating unit having an epoxy group, a repeating unit having a primary or secondary alkyl group, and a repeating unit having an aryl group. Examples of the ethylenically unsaturated bond-containing group include a (meth)acryloyl group, a (meth)acryloyloxy group, a (meth)acrylamide group, a vinylphenyl group, and an allyl group.

In addition, the other repeating units included in the graft chain represented by $P^{1a}$ may be a repeating unit derived from a compound capable of copolymerizing with the above-described repeating unit p1. Examples of the compound capable of copolymerizing with the above-described repeating unit p1 include a (meth)acrylic acid ester monomer, a crotonic acid ester monomer, a vinyl ester monomer, a maleic acid diester monomer, a fumaric acid diester monomer, an itaconic acid diester monomer, a (meth)acrylamide monomer, a styrene monomer, a vinyl ether monomer, a vinyl ketone monomer, a vinyl ester monomer, an olefin monomer, a maleimide monomer, (meth)acrylonitrile, and vinyl acetate. In addition, a heterocyclic group substituted with a vinyl group (for example, vinylpyridine, N-vinylpyrrolidone, vinylcarbazole, and the like), N-vinylformamide, N-vinylacetamide, N-vinylimidazole, vinylcaprolactone, or the like can also be used. In addition, from the viewpoint of improving the dispersibility of the coloring material, a monomer containing a pigment partial structure can also be used.

Examples of the (meth)acrylic acid ester monomer include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, amyl (meth)acrylate, n-hexyl (meth)acrylate, cyclohexyl (meth)acrylate, t-butyl cyclohexyl (meth)acrylate, 2-ethylhexyl (meth)acrylate, t-octyl (meth)acrylate, dodecy (meth)acrylate, octadecyl (meth)acrylate, acetoxyethyl (meth)acrylate, phenyl (meth)acrylate, 2-hydroxy ethyl (meth)acrylate, 2-hydroxypropyl (meth)acrylate, 3-hydroxypropyl (meth)acrylate, 4-hydroxybutyl (meth)acrylate, 2-methoxyethyl (meth)acrylate, 2-ethoxyethyl (meth)acrylate, 2-(2-methoxyethoxy)ethyl (meth)acrylate, 3-phenoxy-2-hydroxypropyl (meth)acrylate, 2-chloroethyl (meth)acrylate, glycidyl (meth)acrylate, 3,4-epoxycyclohexylmethyl (meth)acrylate, vinyl (meth)acrylate, 2-phenylvinyl (meth)acrylate, 1-propenyl (meth)acrylate, allyl (meth)acrylate, 2-aryloxyethyl (meth)acrylate, propargyl (meth)acrylate, benzyl (meth)acrylate, diethylene glycol monomethyl ether (meth)acrylate, diethylene glycol monoethyl ether (meth)acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxyethoxyethyl (meth)acrylate, nonylphenoxy polyethylene glycol (meth)acrylate, dicyclopentenyl (meth)acrylate, dicyclopentenyloxyethyl (meth)acrylate, trifluoroethyl (meth)acrylate, octafluoropentyl (meth)acrylate, perfluorooctylethyl (meth)acrylate, dicyclopentanyl (meth)acrylate, tribromophenyl (meth)acrylate, tribromophenyloxyethyl (meth)acrylate, and γ-butyrolactone (meth)acrylate.

Examples of the crotonic acid ester monomer include butyl crotonic acid and hexyl crotonic acid.

Examples of the vinyl ester monomer include vinyl acetate, vinyl chloroacetate, vinyl propionate, vinyl butyrate, vinyl methoxyacetate, and vinyl benzoate.

Examples of the maleic acid diester monomer include dimethyl maleate, diethyl maleate, and dibutyl maleate.

Examples of the funaric acid diester monomer include dimethyl furmarate, diethyl fumarate, and dibutyl funarate.

Examples of the itaconic acid diester monomer include dimethyl itaconic acid, diethyl itaconic acid, and dibutyl itaconic acid.

Examples of the (meth)acrylic amide monomer include (meth)acrylamide, N-methyl (meth)acrylamide, N-ethyl (meth)acrylamide, N-propyl (meth)acrylamide, N-isopropyl (meth)acrylamide, N-n-butyl (meth)acrylicamide, N-t-butyl (meth)acrylamide, N-cyclohexyl (meth)acrylamide, N-(2-methoxyethyl) (meth)acrylamide, N,N-dimethyl (meth)acrylamide, N,N-diethyl (meth)acrylamide, N-phenyl (meth)acrylamide, N-nitrophenylacrylamide, N-ethyl-N-phenylacrylamide, N-benzyl (meth)acrylamide, (meth)acryloyl morpholine, diacetone acrylamide, N-methylol acrylamide, N-hydroxyethyl acrylamide, vinyl (meth)acrylamide, N,N-diallyl (meth)acrylamide, N-allyl (meth)acrylamide, and N-vinylcaprolactam.

Examples of the styrene monomer include styrene, methylstyrene, dimethylstyrene, trimethylstyrene, ethylstyrene, isopropylstyrene, butylstyrene, hydroxystyrene, methoxystyrene, n-butoxystyrene, t-butoxystyrene, acetoxystyrene, chlorostyrene, dichlorostyrene, bromostyrene, chloromethylstyrene, methyl vinylbenzoic acid, α-methylstyrene, and indene.

Examples of the vinyl ether monomer include methyl vinyl ether, ethyl vinyl ether, 2-chloroethyl vinyl ether, hydroxyethyl vinyl ether, propyl vinyl ether, butyl vinyl ether, hexyl vinyl ether, octyl vinyl ether, methoxyethyl vinyl ether, and phenyl vinyl ether.

Examples of the vinyl ketone monomer include methyl vinyl ketone, ethyl vinyl ketone, propyl vinyl ketone, and phenyl vinyl ketone.

Examples of the olefin monomer include ethylene, propylene, isobutylene, butadiene, and isoprene.

Examples of the maleimide monomer include maleimide, N-phenylmaleimide, N-methylmaleimide, N-butylmaleimide, and N-cyclohexylmaleimide.

A content of the above-described repeating unit p1 in the graft chain is preferably 30 mol % or more, more preferably 50 mol % or more, and still more preferably 70 mol % or more with respect to the total molar amount of repeating units included in the graft chain. The upper limit is not particularly limited and may be 100 mol % or less. In addition, the content of the above-described repeating unit p1 in the specific resin is preferably 20 mol % or more, more preferably 30 mol % or more, still more preferably 40 mol % or more, even more preferably 50 mol % or more, even still more preferably 60 mol % or more, and particularly preferably 70 mol % or more with respect to the total molar amount of repeating units included in the specific resin. The upper limit is not particularly limited, and may be 100 mol % or less, 90 mol % or less, or 95 mol % or less.

In a case where the graft chain includes the above-described repeating unit p2, the content of the above-described repeating unit p2 in the graft chain is preferably 5 to 70 mol % with respect to the total molar amount of repeating units included in the graft chain. The lower limit is preferably 10 mol % or more and more preferably 20 mol % or more. The upper limit is preferably 50 mol % or less and more preferably 40 mol % or less. A proportion of the above-described repeating unit p1 and the above-described repeating unit p2 is preferably 0.1 to 5 mol of the above-described repeating unit p2 with respect to 1 mol of the above-described repeating unit p1, more preferably 0.2 to 3 mol, and still more preferably 0.3 to 1 mol. In addition, the total content of the above-described repeating unit p1 and the above-described repeating unit p2 in the graft chain is preferably 50 mol % or more, more preferably 70 mol % or more, and still more preferably 85 mol % or more with respect to the total molar amount of repeating units included in the graft chain. In addition, the total content of the above-described repeating unit p1 and the above-described repeating unit p2 in the specific resin is preferably 30 mol % or more, more preferably 40 mol % or more, still more preferably 50 mol % or more, even more preferably 60 mol % or more, even still more preferably 70 mol % or more, and particularly preferably 85 mol % or more with respect to the total molar amount of repeating units included in the specific resin. The upper limit is not particularly limited, and may be 100 mol % or less, 90 mol % or less, or 95 mol % or less.

A weight-average molecular weight of the graft chain represented by $P^{1a}$ is preferably 500 to 10000.

The main chain of the specific resin preferably includes a repeating unit represented by Formula (a-1-1).

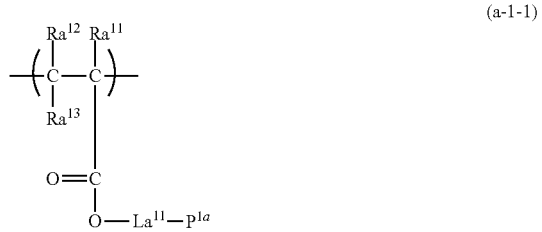

In the formula, $Ra^{11}$ to $Ra^{13}$ each independently represent a hydrogen atom, an alkyl group, or an aryl group, $La^{11}$ represents a divalent linking group, $P^{1a}$ represents a graft chain including the above-described repeating unit p1.

The graft chain represented by $P^{1a}$ in Formula (a-1-1) has the same meaning as $P^{1a}$ in Formula (a1-1) described above, and the preferred range is also the same.

The alkyl group represented by $Ra^{11}$ to $Ra^{13}$ preferably has 1 to 10 carbon atoms, more preferably has 1 to 5 carbon atoms, and still more preferably has 1 to 3 carbon atoms. The alkyl group may be linear, branched, or cyclic forms, and is preferably linear or branched and more preferably linear. The aryl group represented by $Ra^{11}$ to $Ra^{13}$ preferably has 6 to 20 carbon atoms, more preferably has 6 to 12 carbon atoms, and still more preferably has 6 to 10 carbon atoms. $Ra^{11}$ is preferably a hydrogen atom or an alkyl group. $Ra^{12}$ and $Ra^{13}$ are preferably hydrogen atoms.

Examples of the divalent linking group represented by $La^{11}$ include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group formed by a combination of two or more these groups. The alkylene group and the arylene group may have a substituent. Examples of the substituent include a hydroxy group and a halogen atom. The divalent linking group represented by $La^{11}$ is preferably the group represented by Formula (L-1) described above.

The main chain of the specific resin particularly preferably includes a repeating unit represented by Formula (1).

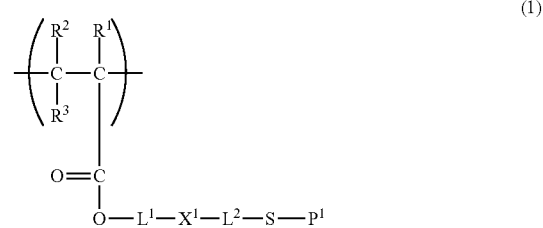

In the formula, $R^1$ to $R^3$ each independently represent a hydrogen atom, an alkyl group, or an aryl group, $L^1$ and $L^2$ each independently represent a divalent linking group, $X^1$ represents a single bond, —O—, —COO—, —OCO—, —NHCOO—, —OCONH—, or —NHCONH—, and $P^1$ represents a graft chain including the above-described repeating unit p1.

The graft chain represented by $P^1$ in Formula (1) has the same meaning as $P^{1a}$ in Formula (a1-1) described above, and the preferred range is also the same.

$R^1$ to $R^3$ in Formula (1) have the same meaning as $Ra^{11}$ to $Ra^{13}$ in Formula (a-1-1) described above, and the preferred ranges are also the same.

Examples of the divalent linking group represented by $L^1$ and $L^2$ in Formula (1) include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group formed by a combination of two or more these groups. The alkylene group and the arylene group may have a substituent. In a case where $X^1$ is —O—, —COO—, —OCO—, —NHCOO—, —OCONH—, or —NHCONH—, $L^1$ and $L^2$ are each independently preferably an alkylene group or an arylene group, and more preferably an alkylene group.

$X^1$ is preferably —O—, —COO—, —OCO—, —NHCOO—, —OCONH—, or —NHCONH—, and more preferably —NHCOO— or —OCONH—.

A content of the repeating unit having the above-described graft chain in the specific resin (preferably the repeating unit represented by Formula (a1-1), more preferably the repeating unit represented by Formula (a-1-1), and still more preferably the repeating unit represented by Formula (1)) is preferably 5 mol % or more, more preferably 10 mol % or more, still more preferably 15 mol % or more, and even more preferably 20 mol % or more with respect to the total molar amount of repeating units included in the main chain of the specific resin. The upper limit is not particularly limited, and may be 100 mol % or less, 90 mol % or less, 80 mol % or less, 70 mol % or less, 60 mol % or less, or 50 mol % or less.

In addition, the content of the repeating unit having the above-described graft chain in the specific resin (preferably the repeating unit represented by Formula (a1-1), more preferably the repeating unit represented by Formula (a-1-1), and still more preferably the repeating unit represented by Formula (1)) is preferably 30% by mass or more, more preferably 40% by mass or more, and still more preferably 50% by mass or more with respect to the mass of the specific resin. The upper limit may be 100% by mass or less, 95% by mass or less, 90% by mass or less, or 85% by mass or less.

The main chain of the specific resin may include a repeating unit (also referred to as other repeating units) other than the repeating unit having the above-described graft chain. Examples of the other repeating units include a repeating unit having an acid group, a repeating unit having a basic group, a repeating unit having a crosslinkable group, a repeating unit having a group (protected carboxy group) in which a carboxy group is protected by a heat-decomposable group.

In a case where the main chain of the specific resin includes a repeating unit having an acid group, dispersibility of the coloring material is further improved. Examples of the acid group include a phenolic hydroxy group, a carboxy group, a sulfo group, and a phosphoric acid group. Examples of a structure of the repeating unit having an acid group include a polyester repeating unit, a polyether repeating unit, and a repeating unit derived from a compound having an ethylenically unsaturated bond-containing group, and from the viewpoint of heat resistance of the obtained film, a repeating unit derived from a compound having an ethylenically unsaturated bond-containing group is preferable, and a polyvinyl repeating unit, a poly(meth)acrylic repeating unit, or a (poly)styrene repeating unit is more preferable. In a case where the main chain of the specific resin includes the repeating unit having an acid group, an acid value of the specific resin is preferably 20 to 200 mgKOH/g. The lower limit of the above-described acid value is preferably 30 mgKOH/g or more and more preferably 50 mgKOH/g or more. The upper limit of the above-described acid value is preferably 150 mgKOH/g or less. In addition, the content of the repeating unit having an acid group in the specific resin is preferably 30 to 90 mol %, more preferably 50 to 85 mol %, and still more preferably 60 to 80 mol % with respect to the total molar amount of repeating units included in the main chain of the specific resin.

A monomer used for forming the repeating unit having an acid group is not particularly limited, and a compound copolymerizable with the compound having an ethylenically unsaturated bond-containing group, which constitutes the molecular chain of the main chain, is used. Examples thereof include a compound having an acid group and an ethylenically unsaturated bond-containing group (also referred to as an acid group-containing monomer). Specific examples of the acid group-containing monomer include (meth)acrylic acid, p-vinylbenzoic acid, maleic acid, maleic acid monoalkyl ester, fumaric acid, itaconic acid, crotonic acid, cinnamic acid, acrylic acid dimer, succinic acid mono(2-acryloyloxyethyl), succinic acid mono(2-methacryloyloxyethyl), 2-acrylamide-2-methylpropanesulfonic acid, phosphoric acid mono(2-acryloyloxyethyl ester), and phosphoric acid mono(1-methyl-2-acryloyloxyethyl ester). In addition, an addition reaction product of a monomer having a hydroxy group, such as 2-hydroxyethyl (meth)acrylate, and a cyclic anhydride such as maleic acid anhydride, phthalic acid anhydride, and cyclohexanedicarboxylic acid anhydride, o-carboxy-polycaprolactone mono(meth)acrylate, or the like can also be used. Examples of a commercially available product thereof include ARONIX M-5300 (manufactured by TOAGOSEI CO., LTD.). The acid group-containing monomer is preferably (meth)acrylic acid or p-vinylbenzoic acid.

In a case where the main chain of the specific resin includes a repeating unit having a basic group, dispersibility of the coloring material is further improved. The basic group is preferably an amino group, more preferably a cyclic amino group, a secondary amino group, or a tertiary amino group, and still more preferably a tertiary amino group. Examples of the secondary amino group include a monoalkylamino group and a monoarylamino group, and a monoalkylamino group is preferable. Examples of the tertiary amino group include a dialkylamino group, a diarylamino group, and an alkylarylamino group, and a dialkylamino group is preferable. Examples of a structure of the repeating unit having a basic group include a polyester repeating unit, a polyether repeating unit, and a repeating unit derived from a compound having an ethylenically unsaturated bond-containing group, and from the viewpoint of heat resistance of the obtained film, a repeating unit derived from a compound having an ethylenically unsaturated bond-containing group is preferable, and a polyvinyl repeating unit, a poly(meth)acrylic repeating unit, or a (poly)styrene repeating unit is more preferable. In a case where the main chain of the specific resin includes the repeating unit having a basic group, an amine value of the specific resin is preferably 20 to 200 mgKOH/g. The lower limit of the above-described amine value is preferably 30 mgKOH/g or more and more preferably 50 mgKOH/g or more. The upper limit of the above-described amine value is preferably 150 mgKOH/g or less. In addition, the content of the repeating unit having a basic group in the specific resin is preferably 30 to 90 mol %, more preferably 50 to 85 mol %, and still more preferably 60 to 80 mol % with respect to the total molar amount of repeating units included in the main chain of the specific resin.

A monomer used for forming the repeating unit having a basic group is not particularly limited, and a compound copolymerizable with the compound having an ethylenically unsaturated bond-containing group, which constitutes the molecular chain of the main chain, is used.

In a case where the main chain of the specific resin includes a repeating unit having a crosslinkable group, it is easy to form a film having more excellent heat resistance. Examples of the crosslinkable group include an ethylenically unsaturated bond-containing group and a cyclic ether group. Examples of the ethylenically unsaturated bond-containing group include a (meth)acryloyl group, a (meth)acryloyloxy group, a (meth)acrylamide group, a vinylphenyl group, and an allyl group, and from the viewpoint of reactivity, a (meth)acryloyloxy group is preferable. Examples of the cyclic ether group include an epoxy group and an oxetane group. Examples of a structure of the repeating unit having a crosslinkable group include a polyester repeating unit, a polyether repeating unit, and a repeating unit derived from a compound having an ethylenically unsaturated bond-containing group, and from the viewpoint of heat resistance of the obtained film, a repeating unit derived from a compound having an ethylenically unsaturated bond-containing group is preferable, and a polyvinyl repeating unit, a poly(meth)acrylic repeating unit, or a (poly)styrene repeating unit is more preferable. A content of the repeating unit having a crosslinkable group in the specific resin is preferably 10 to 60 mol %, more preferably 15 to 50 mol %, and still more preferably 20 to 40 mol % with respect to the total molar amount of repeating units included in the main chain of the specific resin.

A monomer used for forming the repeating unit having a crosslinkable group is not particularly limited, and a compound copolymerizable with the compound having an ethylenically unsaturated bond-containing group, which constitutes the molecular chain of the main chain, is used.

The repeating unit having a protected carboxy group in the main chain of the specific resin can further promote the crosslinking reaction of the oxetane group during film formation, and it is easy to form a film having more excellent heat resistance. Examples of the protected carboxy group include groups having the above-described structures, and the same applies to the preferred range. Examples of a structure of the repeating unit having a protected carboxy group include a polyester repeating unit, a polyether repeating unit, and a repeating unit derived from a compound having an ethylenically unsaturated bond-containing group, and from the viewpoint of heat resistance of the obtained film, a repeating unit derived from a compound having an ethylenically unsaturated bond-containing group is preferable, and a polyvinyl repeating unit, a poly(meth)acrylic repeating unit, or a (poly)styrene repeating unit is more preferable. A content of the repeating unit having a protected carboxy group in the specific resin is preferably 10 to 60 mol %, more preferably 15 to 50 mol %, and still more preferably 20 to 40 mol % with respect to the total molar amount of repeating units included in the main chain of the specific resin.

In addition, the repeating unit (other repeating units) other than the repeating unit having the above-described graft chain included in the main chain of the specific resin may be a repeating unit derived from a compound capable of copolymerizing with the repeating unit p1. Examples of the compound capable of copolymerizing with the repeating unit p1 include compounds described as examples of the compounds capable of copolymerizing with the repeating unit p1 described above.

A weight-average molecular weight (Mw) of the specific resin is preferably 5000 to 100000, more preferably 10000 to 100000, and still more preferably 10000 to 50000.

The maximum value of a molar absorption coefficient of the specific resin in a wavelength of 400 to 1100 nm is preferably 0 to 1000 L·mol$^{-1}$·cm$^{-1}$, and more preferably 0 to 100 L·mol$^{-1}$·cm$^{-1}$.

From the reason that it is easy to form a film having more excellent heat resistance (crack suppression and film contraction suppression), an oxetane ratio of the specific resin is preferably 20 to 95 mol %. The lower limit of the oxetane ratio is preferably 30 mol % or more, more preferably 40 mol % or more, still more preferably 50 mol % or more, and particularly preferably 60 mol % or more. The upper limit of the oxetane ratio is preferably 90 mol % or less, more preferably 85 mol % or less, and still more preferably 80 mol % or less. In the present specification, the oxetane ratio of the specific resin means a mole fraction of repeating units having an oxetane group included in all repeating units of the specific resin. As the oxetane ratio of the specific resin is higher, heat resistance of the obtained film is improved.

An oxetane group value of the specific resin is preferably 0.01 to 5 mmol/g. The lower limit of the oxetane group value is preferably 0.02 mmol/g or more, more preferably 0.03 mmol/g or more, still more preferably 0.05 mmol/g or more, and particularly preferably 0.10 mmol/g or more. The upper limit of the oxetane group value is preferably 3 mmol/g or less, more preferably 2 mmol/g or less, still more preferably 1.5 mmol/g or less, and particularly preferably 1 mmol/g or less. The oxetane group value of the specific resin refers to the number of oxetane groups included in 1 g of the specific resin.

The specific resin preferably has a 5% by mass reduction temperature of 280° C. or higher, more preferably 300° C. or higher, and still more preferably 320° C. or higher by a thermogravimetry/differential thermal analysis (TG/DTA) under a nitrogen atmosphere. The upper limit of the above-described 5% by mass reduction temperature is not particularly limited, and for example, may be 1,000° C. or lower. The 5% by mass reduction temperature is determined by a known TG/DTA measuring method as a temperature at which the mass reduction rate is 5% in a case of being allowed to stand at a specific temperature for 5 hours under a nitrogen atmosphere.

In addition, the specific resin preferably has a mass reduction rate of 10% or less, more preferably 5% or less, and still more preferably 2% or less in a case of being allowed to stand at 300° C. for 5 hours under a nitrogen atmosphere. The lower limit of the above-described mass reduction rate is not particularly limited, and may be 0% or more.

The mass reduction rate is a value calculated as a proportion of mass reduction in the specific resin before and after being allowed to stand at 300° C. for 5 hours under a nitrogen atmosphere.

Specific examples of the specific resin include resins (A-1) to (A-48) mentioned in the section of Examples described later, but the present invention is not limited thereto.

(Other Resins)

The resin composition according to the embodiment of the present invention may include a resin other than the above-described specific resin as the resin. Examples of other resins include a resin having alkali developability and a resin as a dispersant. In addition, as the other resins, resins described in paragraph Nos. 0041 to 0060 of JP2017-206689A, resins described in paragraph Nos. 0022 to 0071 of JP2018-010856A, resins described in JP2017-057265A, resins described in JP2017-032685A, resins described in JP2017-075248A, resins described in JP2017-066240A, resins described in JP2017-173787A, resins described in JP2020-122052A, resins described in JP2020-111656A, resins described in JP2020-139021A, or resins including a constitutional unit having a ring structure in the main chain and a constitutional unit having a biphenyl group in the side chain, which are described in JP2017-138503A, can also be used.

[Resin Having Alkali Developability]

A weight-average molecular weight (Mw) of the resin having alkali developability is preferably 3000 to 2000000. The upper limit is more preferably 1000000 or less and still more preferably 500000 or less. The lower limit is more preferably 4000 or more and still more preferably 5000 or more.

Examples of the resin having alkali developability include a (meth)acrylic resin, a polyimine resin, a polyether resin, a polyolefin resin, a cyclic olefin resin, a polyester resin, a styrene resin, and a polyimide resin, and a (meth)acrylic resin or a polyimine resin is preferable and a (meth)acrylic resin is more preferable.

In addition, as the resin having alkali developability, it is preferable to use a resin having an acid group. According to this aspect, developability of the resin composition can be further improved. Examples of the acid group include a phenolic hydroxy group, a carboxy group, a sulfo group, a phosphoric acid group, a phosphonic acid group, an active imide group, and a sulfonamide group, and a carboxy group is preferable. In addition, as the resin having an acid group, a resin in which an acid anhydride is reacted with a hydroxy group generated by an epoxy ring opening to introduce an acid group may be used. Examples of such a resin include resins described in JP6349629B. The resin having an acid group can be used, for example, as an alkali-soluble resin.

The resin having alkali developability preferably includes a repeating unit having an acid group in the side chain, and more preferably includes 1 to 70 mol % of repeating units having an acid group in the side chain with respect to the total repeating units of the resin. The upper limit of the content of the repeating unit having an acid group in the side chain is preferably 50 mol % or less and more preferably 40 mol % or less. The lower limit of the content of the repeating unit having an acid group in the side chain is preferably 2 mol % or more and more preferably 5 mol % or more.

An acid value of the resin having alkali developability is preferably 200 mgKOH/g or less, more preferably 150 mgKOH/g or less, still more preferably 120 mgKOH/g or less, and particularly preferably 100 mgKOH/g or less. In addition, an acid value of the resin having an acid group is preferably 5 mgKOH/g or more, more preferably 10 mgKOH/g or more, and still more preferably 20 mgKOH/g or more.

The resin having alkali developability also preferably has an ethylenically unsaturated bond-containing group. Examples of the ethylenically unsaturated bond-containing group include a vinyl group, an allyl group, and a (meth)acryloyl group, and an allyl group or a (meth)acryloyl group is preferable and a (meth)acryloyl group is more preferable.

The resin having an ethylenically unsaturated bond-containing group preferably includes a repeating unit having an ethylenically unsaturated bond-containing group in the side chain, and more preferably includes 5 to 80 mol % of the repeating unit having an ethylenically unsaturated bond-containing group in the side chain with respect to the total repeating units of the resin. The upper limit of the content of the repeating unit having an ethylenically unsaturated bond-containing group in the side chain is preferably 60 mol % or less and more preferably 40 mol % or less. The lower limit of the content of the repeating unit having an ethylenically unsaturated bond-containing group in the side chain is preferably 10 mol % or more and more preferably 15 mol % or more.

It is also preferable that the resin having alkali developability includes a repeating unit derived from a monomer component including a compound represented by Formula (ED1) and/or a compound represented by Formula (ED2) (hereinafter, these compounds may be referred to as an "ether dimer").

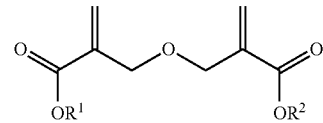

In Formula (ED1), $R^1$ and $R^2$ each independently represent a hydrogen atom or a hydrocarbon group having 1 to 25 carbon atoms, which may have a substituent.

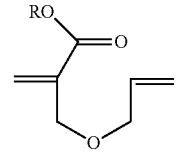

In Formula (ED2), R represents a hydrogen atom or an organic group having 1 to 30 carbon atoms. With regard to details of Formula (ED2), reference can be made to the description in JP2010-168539A, the contents of which are incorporated herein by reference.

With regard to the specific examples of the ether dimer, reference can be made to the description in paragraph No. 0317 of JP2013-029760A, the contents of which are incorporated herein by reference.

It is also preferable that the resin having alkali developability includes a repeating unit derived from a compound represented by Formula (X).

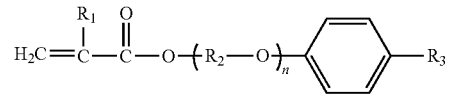

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may include a benzene ring. n represents an integer of 1 to 15.

Examples of the resin having alkali developability include resins having the following structures. In the following structural formulae, Me represents a methyl group.

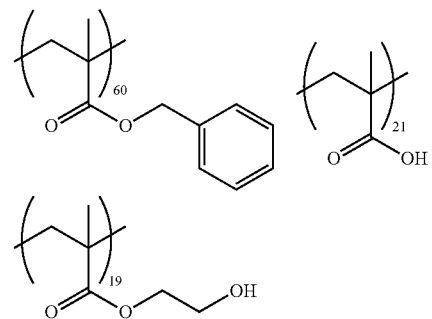

-continued

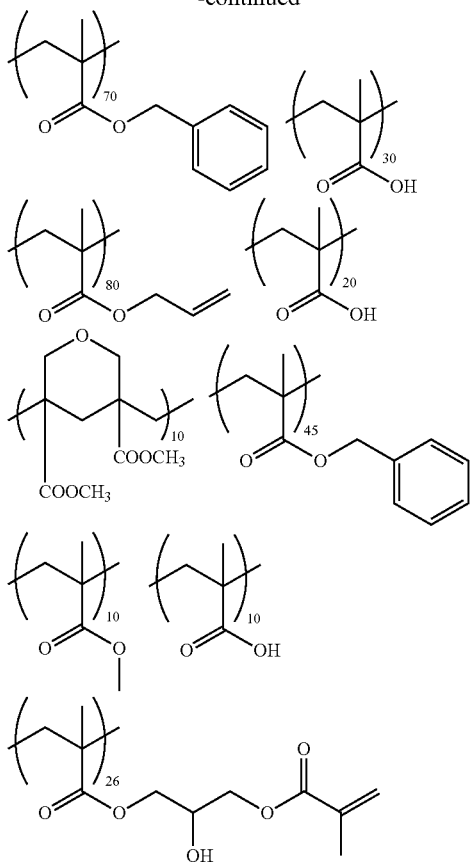

[Dispersant]

The resin composition according to the embodiment of the present invention can also include a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70 mol % or more in a case where the total amount of the acid group and the basic group is 100 mol %, and more preferably a resin substantially consisting of only an acid group. The acid group included in the acidic dispersant (acidic resin) is preferably a carboxy group. The acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The basic group included in the basic dispersant is preferably an amino group.

The resin used as a dispersant preferably includes a repeating unit having an acid group.

It is also preferable that the resin used as a dispersant is a graft polymer. Examples of the graft polymer include resins described in paragraph Nos. 0025 to 0094 of JP2012-255128A, the contents of which are incorporated herein by reference.

It is also preferable that the resin used as a dispersant is a polyimine-based dispersant (polyimine resin) including a nitrogen atom in at least one of the main chain or the side chain. As the polyimine-based dispersant, a resin having a main chain which has a partial structure having a functional group of pKa 14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. Examples of the polyimine-based dispersant include resins described in paragraph Nos. 0102 to 0166 of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A.

A commercially available product is also available as the dispersant, and specific examples thereof include DISPERBYK series (for example, DISPERBYK-111, 161, and the like) manufactured by BYK Chemie, and Solsperse series (for example, Solsperse 36000) manufactured by Lubrizol Japan Ltd. Dispersing agents described in paragraph Nos. 0041 to 0130 of JP2014-130338A can also be used, the contents of which are incorporated herein by reference. In addition, as the dispersant, compounds described in JP2018-150498A, JP2017-100116A, JP2017-100115A, JP2016-108520A, JP2016-108519A, and JP2015-232105A may be used.

The resin described as a dispersant can be used for an application other than the dispersant. For example, the resin can also be used as a binder.

A content of the resin in the total solid content of the resin composition is preferably 5% to 60% by mass. The lower limit is preferably 10% by mass or more and more preferably 15% by mass or more. The upper limit is preferably 50% by mass or less and more preferably 40% by mass or less.

A content of the above-described specific resin in the total solid content of the resin composition is preferably 5% to 60% by mass. The lower limit is preferably 10% by mass or more and more preferably 15% by mass or more. The upper limit is preferably 50% by mass or less and more preferably 40% by mass or less.

The content of the above-described specific resin is preferably 10 to 80 parts by mass with respect to 100 parts by mass of the pigment. The lower limit is preferably 20 parts by mass or more and more preferably 30 parts by mass or more. The upper limit is preferably 70 parts by mass or less and more preferably 50 parts by mass or less.

In addition, in the resin composition according to the embodiment of the present invention, in the components in which the coloring material is excepted from the total solid content of the resin composition, the specific resin is included preferably in an amount of 20% by mass or more, more preferably in an amount of 30% by mass or more, and still more preferably in an amount of 40% by mass or more. The upper limit may be 100% by mass, 90% by mass or less, or 85% by mass or less. In a case where the content of the specific resin is within the above-described range, it is easy to form a film having excellent heat resistance, and it is easy to suppress film contraction after heating. Further, in a case where an inorganic film is formed on a surface of the film obtained using the resin composition according to the embodiment of the present invention, it is also possible to suppress the occurrence of cracks in the inorganic film even in a case where this laminate is exposed to a high temperature.

In addition, the total content of the coloring material and the above-described specific resin in the total solid content of the resin composition is preferably 25% to 100% by mass. The lower limit is more preferably 30% by mass or more and still more preferably 40% by mass or more. The upper limit is more preferably 90% by mass or less and still more preferably 80% by mass or less.

In the resin composition, the content of the other resins described above is preferably 230 parts by mass or less, more preferably 200 parts by mass or less, and still more preferably 150 parts by mass or less with respect to 100 parts by mass of the above-described specific resin. The lower limit may be 0 part by mass, 5 parts by mass or more, or 10 parts by mass or more. In addition, it is also preferable that the resin composition does not substantially include the above-described other resin. According to this aspect, it is easy to form a film having more excellent heat resistance. The case where the resin composition does not substantially include the other resins means that the content of the other resins in the total solid content of the resin composition is 0.1% by mass or less, preferably 0.05% by mass or less, and more preferably 0% by mass.

<<Solvent>>

The resin composition according to the embodiment of the present invention contains a solvent. Basically, the solvent is not particularly limited as long as it satisfies the solubility of the respective components and the application properties of the resin composition. The solvent is preferably an organic solvent. Examples of the organic solvent include an ester-based solvent, a ketone-based solvent, an alcohol-based solvent, an amide-based solvent, an ether-based solvent, and a hydrocarbon-based solvent. The details of the organic solvent can be found in paragraph No. 0223 of WO2015/166779A, the content of which is incorporated herein by reference. In addition, an ester-based solvent in which a cyclic alkyl group is substituted or a ketone-based solvent in which a cyclic alkyl group is substituted can be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, 2-pentanone, 3-pentanone, 4-heptanone, cyclohexanone, 2-methylcyclohexanone, 3-methylcyclohexanone, 4-methylcyclohexanone, cycloheptanone, cyclooctanone, 3-methoxybutanol, cyclohexyl acetate, cyclopentanone, ethylcarbitol acetate, butylcarbitol acetate, propylene glycol monomethyl ether, propylene glycol monomethyl ether acetate, 3-methoxy-N,N-dimethylpropanamide, 3-butoxy-N,N-dimethylpropanamide, γ-butyrolactone, N-methyl-2-pyrrolidone, propylene glycol diacetate, sulfolane, anisole, 1,4-diacetoxybutane, diethylene glycol monoethyl ether acetate, butane diacetate-1,3-diyl, dipropylene glycol methyl ether acetate, diacetone alcohol (also known as diacetone alcohol or 4-hydroxy-4-methyl-2-pentanone), 2-methoxypropyl acetate, 2-methoxy-1-propanol, and isopropyl alcohol. Two or more kinds of solvents may be used. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like.

In the present invention, an organic solvent having a low metal content is preferably used. For example, the metal content in the organic solvent is preferably 10 mass parts per billion (ppb) or less. Optionally, an organic solvent having a metal content at a mass parts per trillion (ppt) level may be used. For example, such an organic solvent is available from Toyo Gosei Co., Ltd. (The Chemical Daily, Nov. 13, 2015). Examples of a method for removing impurities such as a metal from the organic solvent include distillation (such as molecular distillation and thin-film distillation) and filtration using a filter. The filter pore size of the filter used for the filtration is preferably 10 μm or less, more preferably 5 μm or less, and still more preferably 3 μm or less. As a material of the filter, polytetrafluoroethylene, polyethylene, or nylon is preferable.

The organic solvent may include an isomer (a compound having the same number of atoms and a different structure). In addition, only one kind of isomers may be included, or a plurality of isomers may be included.

The organic solvent preferably has the content of peroxides of 0.8 mmol/L or less, and more preferably, the organic solvent does not substantially include peroxides.

A content of the solvent in the resin composition is preferably 10% to 95% by mass, more preferably 20% to 90% by mass, and still more preferably 30% to 90% by mass.

<<Pigment Derivative>>

The resin composition according to the embodiment of the present invention preferably contains a pigment derivative. Examples of the pigment derivative include a compound having a structure in which a part of a chromophore is substituted with an acid group, a basic group, or a phthalimidomethyl group. Examples of the chromophore constituting the pigment derivative include a quinoline skeleton, a benzimidazolone skeleton, a diketopyrrolopyrrole skeleton, an azo skeleton, a phthalocyanine skeleton, an anthraquinone skeleton, a quinacridone skeleton, a dioxazine skeleton, a perinone skeleton, a perylene skeleton, a thioindigo skeleton, an isoindoline skeleton, an isoindolinone skeleton, a quinophthalone skeleton, a threne skeleton, and a metal complex-based skeleton. Among these, a quinoline skeleton, a benzimidazolone skeleton, a diketopyrrolopyrrole skeleton, an azo skeleton, a quinophthalone skeleton, an isoindoline skeleton, or a phthalocyanine skeleton is preferable, and an azo skeleton or a benzimidazolone skeleton is more preferable. As the acid group included in the pigment derivative, a sulfo group or a carboxy group is preferable and a sulfo group is more preferable. As the basic group included in the pigment derivative, an amino group is preferable and a tertiary amino group is more preferable.

As the pigment derivative, a pigment derivative having excellent visible light transparency (hereinafter, also referred to as a transparent pigment derivative) can be used. The maximum value (εmax) of a molar absorption coefficient of the transparent pigment derivative in a wavelength range of 400 to 700 nm is preferably 3000 $L \cdot mol^{-1} \cdot cm^{-1}$ or less, more preferably 1000 $L \cdot mol^{-1} \cdot cm^{-1}$ or less, and still more preferably 100 $L \cdot mol^{-1} \cdot cm^{-1}$ or less. The lower limit of εmax is, for example, 1 $L \cdot mol^{-1} \cdot cm^{-1}$ or more and may be 10 $L \cdot mol^{-1} \cdot cm^{-1}$ or more.

Specific examples of the pigment derivative include compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraph Nos. 0086 to 0098 of WO2011/024896A, paragraph Nos. 0063 to 0094 of WO2012/102399A, paragraph No. 0082 of WO2017/038252A, paragraph No. 0171 of JP2015-151530A, paragraph Nos. 0162 to 0183 of JP2011-252065A, JP2003-081972A, JP5299151B, JP2015-172732A, JP2014-199308A, JP2014-085562A, JP2014-035351A, JP2008-081565A, and JP2019-109512A.

The content of the pigment derivative is preferably 1 to 30 parts by mass and still more preferably 3 to 20 parts by mass with respect to 100 parts by mass of the pigment. The pigment derivative may be used singly or in a combination of two or more kinds thereof.

<<Polymerizable Monomer>>

The resin composition according to the embodiment of the present invention preferably contains a polymerizable monomer. As the polymerizable monomer, for example, a known compound which is cross-linkable by a radical, an acid, or heat can be used. Examples thereof include a compound having an ethylenically unsaturated bond-containing group and a compound having a cyclic ether group, and a compound having an ethylenically unsaturated bond-containing group is preferable. Examples of the ethylenically unsaturated bond-containing group include a vinyl group, a (meth)allyl group, and a (meth)acryloyl group. Examples of the cyclic ether group include an epoxy group and an oxetane group. The compound having an ethylenically unsaturated bond-containing group can be preferably used as a radically polymerizable monomer. In addition, the compound having a cyclic ether group can be preferably used as a cationically polymerizable monomer. The polymerizable monomer is preferably a polyfunctional polymerizable monomer. That is, the polymerizable monomer is preferably a monomer having two or more polymerizable groups such as an ethylenically unsaturated bond-containing group and a cyclic ether group.

A molecular weight of the polymerizable monomer is preferably 100 to 3000. The upper limit is more preferably 2000 or less and still more preferably 1500 or less. The lower limit is more preferably 150 or more and still more preferably 250 or more.

(Compound Having Ethylenically Unsaturated Bond-Containing Group)

The compound having an ethylenically unsaturated bond-containing group, which is used as the polymerizable monomer, is preferably a polyfunctional compound. That is, the compound having an ethylenically unsaturated bond-containing group is preferably a compound including 2 or more ethylenically unsaturated bond-containing groups, more preferably a compound including 3 or more ethylenically unsaturated bond-containing groups, still more preferably a compound including 3 to 15 ethylenically unsaturated bond-containing groups, and even more preferably a compound including 3 to 6 ethylenically unsaturated bond-containing groups. In addition, the compound having an ethylenically unsaturated bond-containing group is preferably a trifunctional to pentadecafunctional (meth)acrylate compound and more preferably a trifunctional to hexafunctional (meth)acrylate compound. Specific examples of the compound having an ethylenically unsaturated bond-containing group include the compounds described in paragraph Nos. 0095 to 0108 of JP2009-288705A, paragraph No. 0227 of JP2013-029760A, paragraph Nos. 0254 to 0257 of JP2008-292970A, paragraph Nos. 0034 to 0038 of JP2013-253224A, paragraph No. 0477 of JP2012-208494A, JP2017-048367A, JP6057891B, JP6031807B, and JP2017-194662A, the contents of which are incorporated herein by reference.

As the compound having an ethylenically unsaturated bond-containing group, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available products from Sartomer Company Inc.) is preferable. In addition, as the compound having an ethylenically unsaturated bond-containing group, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), 8UH-1006 and 8UH-1012 (manufactured by Taisei Fine Chemical Co., Ltd.), Light Acrylate POB-A0 (manufactured by KYOEISHA CHEMICAL Co., Ltd.), and the like can also be used.

In addition, as the compound having an ethylenically unsaturated bond-containing group, it is also preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the compound having an ethylenically unsaturated bond-containing group, a compound having an acid group can also be used. By using a compound having an acid group, it is possible to suppress generation of development residues. Examples of the acid group include a carboxy group, a sulfo group, and a phosphoric acid group, and a carboxy group is preferable. Examples of a commercially available product of the polymerizable monomer having an acid group include ARONIX M-305, M-510, M-520, and ARONIX TO-2349 (manufactured by TOAGOSEI CO., LTD.). An acid value of the polymerizable monomer having an acid group is preferably 0.1 to 40 mgKOH/g and more preferably 5 to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

The compound having an ethylenically unsaturated bond-containing group is also preferably a compound having a caprolactone structure. Examples of the compound having a caprolactone structure include DPCA-20, DPCA-30, DPCA-60, and DPCA-120, each of which is commercially available as KAYARAD DPCA series from Nippon Kayaku Co., Ltd.

As the compound having an ethylenically unsaturated bond-containing group, a compound having an alkyleneoxy group can also be used. The compound having an alkyleneoxy group is preferably a compound having an ethyleneoxy group and/or a propyleneoxy group, more preferably a compound having an ethyleneoxy group, and still more preferably a trifunctional to hexafunctional (meth)acrylate compound having 4 to 20 ethyleneoxy groups. Examples of a commercially available product of the compound having an alkyleneoxy group include SR-494 manufactured by Sartomer Company Inc., which is a tetrafunctional (meth) acrylate having 4 ethyleneoxy groups, and KAYARAD TPA-330, which is a trifunctional (meth)acrylate having 3 isobutyleneoxy groups.

As the compound having an ethylenically unsaturated bond-containing group, a compound having a fluorene skeleton can also be used. Examples of a commercially available product of the compound having a fluorene skeleton include OGSOL EA-0200, EA-0300 (manufactured by Osaka Gas Chemicals Co., Ltd., (meth)acrylate monomer having a fluorene skeleton).

As the compound having an ethylenically unsaturated bond-containing group, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the compound having an ethylenically unsaturated bond-containing group. In addition, the polymerizable compounds having an amino structure or a sulfide structure in the molecule, described in JP1988-277653A (JP-S63-277653A), JP1988-260909A (JP-S63-260909A), or JP1989-105238A (JP-H01-105238A), are also preferably used. In addition, as the polymerizable compound, commercially available products such as UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, AI-600, and LINC-202UA (manufactured by KYOEISHA CHEMICAL Co., Ltd.) can also be used.

(Compound Having Cyclic Ether Group)

Examples of the compound having a cyclic ether group, which can also be used as the polymerizable monomer, include a compound having an epoxy group (hereinafter, also referred to as an epoxy compound) and a compound having an oxetane group (hereinafter, also referred to as an oxetane compound). The epoxy compound is preferably a polyfunctional epoxy compound. That is, the epoxy compound is preferably a compound having 2 or more epoxy groups. The upper limit of the number of epoxy groups is preferably 20 or less and more preferably 10 or less. In addition, the oxetane compound is preferably a polyfunctional oxetane compound. That is, the oxetane compound is preferably a compound having 2 or more oxetane groups. The upper limit of the number of oxetane groups is preferably 20 or less and more preferably 10 or less.

Examples of a commercially available product of the epoxy compound include commercially available products described in paragraph 0189 of JP2011-221494A, such as JER828, JER1007, JER157S70 (manufactured by Mitsubishi Chemical Corporation) and JER157S65 (manufactured by Mitsubishi Chemical Holdings Corporation). Examples of other commercially available products include ADEKA RESIN EP-4000S, EP-4003S, EP-4010S, and EP-4011S (all of which are manufactured by ADEKA Corporation); NC-2000, NC-3000, NC-7300, XD-1000, EPPN-501, and EPPN-502 (all of which are manufactured by ADEKA Corporation); DENACOL EX-611, EX-612, EX-614, EX-614B, EX-622, EX-512, EX-521, EX-411, EX-421, EX-313, EX-314, EX-321, EX-211, EX-212, EX-810, EX-811, EX-850, EX-851, EX-821, EX-830, EX-832, EX-841, EX-911, EX-941, EX-920, EX-931, EX-212L, EX-214L, EX-216L, EX-321L, EX-850L, DLC-201, DLC-203, DLC-204, DLC-205, DLC-206, DLC-301, DLC-402, EX-111, EX-121, EX-141, EX-145, EX-146, EX-147, EX-171, and EX-192 (all of which are manufactured by Nagase ChemteX Corporation); YH-300, YH-301, YH-302, YH-315, YH-324, and YH-325 (all of which are manufactured by NIPPON STEEL Chemical & Material Co., Ltd.); CELLOXIDE 2021P, 2081, 2000, 3000, EHPE3150, EPO-LEAD GT400, CELVENUS B0134, and B0177 (manufactured by DAICEL CORPORATION); and TETRAD-X (manufactured by MITSUBISHI GAS CHEMICAL COMPANY, INC.).

Examples of a commercially available product of the oxetane compound include OXT-201, OXT-211, OXT-212, OXT-213, OXT-121, OXT-221, and OX-SQ TX-100 (all of which are manufactured by TOAGOSEI CO., LTD.).

A content of the polymerizable monomer in the total solid content of the resin composition is preferably 0.1% to 40% by mass. The lower limit is preferably 0.5% by mass or more and more preferably 1% by mass or more. The upper limit is preferably 30% by mass or less and more preferably 20% by mass or less.

In a case where the compound having an ethylenically unsaturated bond-containing group is used as the polymerizable monomer, a content of the compound having an ethylenically unsaturated bond-containing group as the polymerizable monomer is preferably 1 to 50 parts by mass with respect to 100 parts by mass of the above-described specific resin. The lower limit is preferably 3 parts by mass or more and more preferably 5 parts by mass or more. The upper limit is preferably 40 parts by mass or less and more preferably 30 parts by mass or less.

In a case where the compound having a cyclic ether group is used as the polymerizable monomer, a content of the compound having a cyclic ether group as the polymerizable monomer is preferably 1 to 50 parts by mass with respect to 100 parts by mass of the above-described specific resin. The lower limit is preferably 3 parts by mass or more and more preferably 5 parts by mass or more. The upper limit is preferably 40 parts by mass or less and more preferably 30 parts by mass or less.

In a case where the compound having an ethylenically unsaturated bond-containing group and the compound having a cyclic ether group are used as the polymerizable monomer, the resin composition preferably contains 10 to 500 parts by mass of the compound having a cyclic ether group with respect to 100 parts by mass of the compound having an ethylenically unsaturated bond-containing group. The lower limit is preferably 20 parts by mass or more and more preferably 30 parts by mass or more. The upper limit is preferably 400 parts by mass or less and more preferably 300 parts by mass or less. In a case where the proportion of both is in the above-described range, a film having more excellent heat resistance (suppression of cracks and suppression of film contraction) can be formed.

<<Photopolymerization Initiator>>

The resin composition according to the embodiment of the present invention preferably includes a photopolymerization initiator. The photopolymerization initiator is not particularly limited, and can be appropriately selected from known photopolymerization initiators. For example, a compound having photosensitivity to light in a range from an ultraviolet range to a visible range is preferable. The photopolymerization initiator is preferably a photoradical polymerization initiator.

Examples of the photopolymerization initiator include a halogenated hydrocarbon derivative (for example, a compound having a triazine skeleton, a compound having an oxadiazole skeleton, a compound having an imidazole skeleton, or the like), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a biimidazole compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from a biimidazole compound, an oxime compound, an α-hydroxyketone compound, an α-aminoketone compound, or an acylphosphine compound is more preferable, and an oxime compound is still more preferable. In addition, as the photopolymerization initiator, compounds described in paragraphs 0065 to 0111 of JP2014-130173A, compounds described in JP6301489B, peroxide-based photopolymerization initiators described in MATERIAL STAGE, p. 37 to 60, vol. 19, No. 3, 2019, photopolymerization initiators described in WO2018/221177A, photopolymerization initiators described in WO2018/110179A, photopolymerization initiators described in JP2019-043864A, and photopolymerization initiators described in JP2019-044030A, the contents of which are incorporated herein by reference.

Examples of the biimidazole compound include 2,2-bis(2-chlorophenyl)-4,4',5,5'-tetraphenylbiimidazole, 2,2'-bis(o-chlorophenyl)-4,4',5,5-tetrakis(3,4,5-trimethoxyphenyl)-1,2'-biimidazole, 2,2'-bis(2,3-dichlorophenyl)-4,4',5,5'-tetraphenylbiimidazole, and 2,2'-bis (o-chlorophenyl)-4,4,5,5'-tetraphenyl-1,2'-biimidazole. Examples of a commercially available product of the α-hydroxyketone compound include Omnirad 184, Omnirad 1173, Omnirad 2959, and Omnirad 127 (all of which are manufactured by IGM Resins B.V.), Irgacure 184, Irgacure 1173, Irgacure 2959, and Irgacure 127 (all of which are manufactured by BASF SE). Examples of a commercially available product of the α-aminoketone compound include Omnirad 907, Omnirad 369, Omnirad 369E, and Omnirad 379EG (all of which are manufactured by IGM Resins B.V.), Irgacure 907, Irgacure 369, Irgacure 369E, and Irgacure 379EG (all of which are manufactured by BASF SE). Examples of a commercially available product of the acylphosphine compound include Omnirad 819 and Omnirad TPO (both of which are manufactured by IGM Resins B.V.), Irgacure 819 and Irgacure TPO (both of which are manufactured by BASF SE).

Examples of the oxime compound include the compounds described in JP2001-233842A, the compounds described in JP2000-080068A, the compounds described in JP2006-342166A, the compounds described in J. C. S. Perkin II (1979, pp. 1653 to 1660), the compounds described in J. C. S. Perkin II (1979, pp. 156 to 162), the compounds described in Journal of Photopolymer Science and Technology (1995, pp. 202 to 232), the compounds described in JP2000-066385A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, the compounds described in paragraph Nos. 0025 to 0038 of WO2017/164127A, and compounds described in WO2013/167515A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product thereof include Irgacure OXE01, Irgacure OXE02, Irgacure OXE03, and Irgacure OXE04 (all of which are manufactured by BASF SE), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product include ADEKA ARKLS NCI-730, NCI-831, and NCI-930 (all of which are manufactured by ADEKA Corporation).

An oxime compound having a fluorene ring can also be used as the photopolymerization initiator. Specific examples of the oxime compound having a fluorene ring include the compounds described in JP2014-137466A.

In addition, as the photopolymerization initiator, an oxime compound having a skeleton in which at least one benzene ring of a carbazole ring is a naphthalene ring can also be used. Specific examples of such an oxime compound include the compounds described in WO2013/083505A.

An oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compound (C-3) described in JP2013-164471A.

In the present invention, as the photopolymerization initiator, an oxime compound in which a substituent having a hydroxy group is bonded to a carbazole skeleton can also be used. Examples of such a photopolymerization initiator include compounds described in WO2019/088055A.

An oxime compound having a nitro group can be used as the photopolymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

An oxime compound having a benzofuran skeleton can also be used as the photopolymerization initiator. Specific examples thereof include OE-01 to OE-75 described in WO2015/036910A.

In the present invention, as the photopolymerization initiator, an oxime compound in which a substituent having a hydroxy group is bonded to a carbazole skeleton can also be used. Examples of such a photopolymerization initiator include compounds described in WO2019/088055A.

Specific examples of the oxime compound are shown below, but the present invention is not limited thereto.

(C-1)

(C-2)

(C-3)

(C-4)

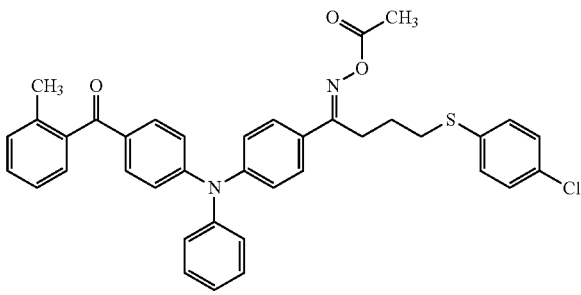

(C-5)

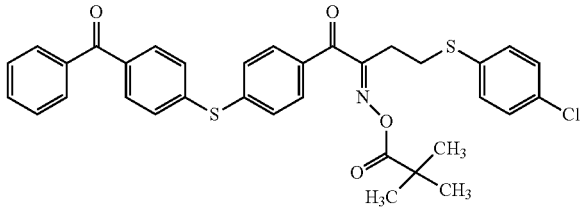

(C-6)

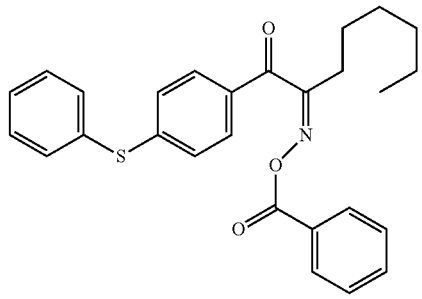

(C-7)

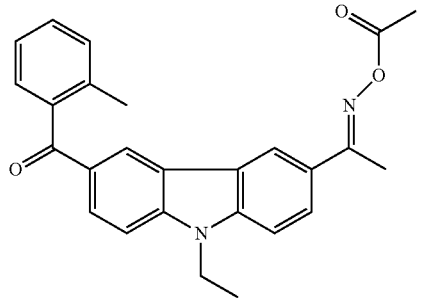

(C-8)

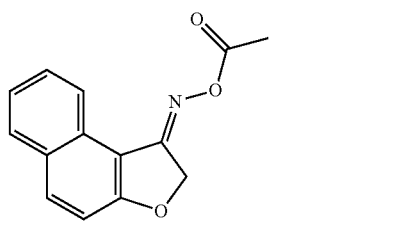

(C-9)

-continued (C-10)
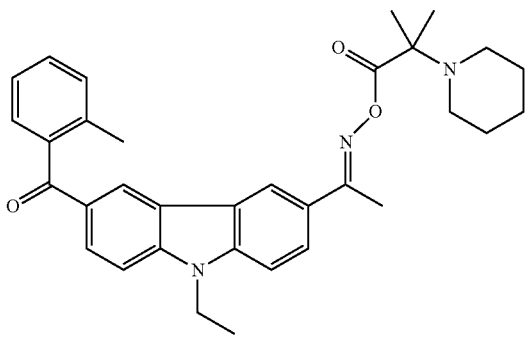

(C-11)
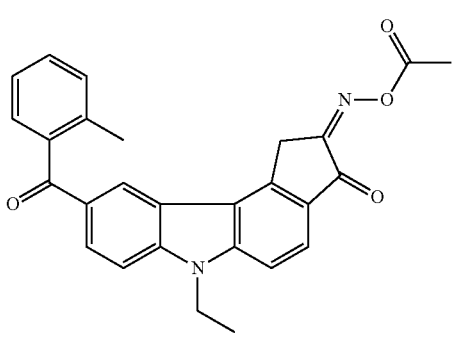

(C-12)
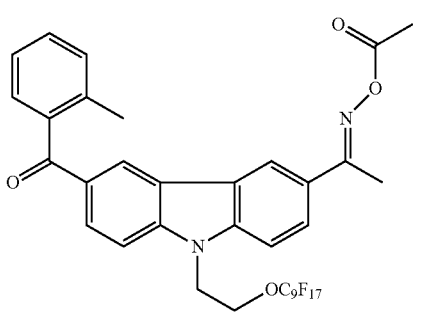

(C-13)
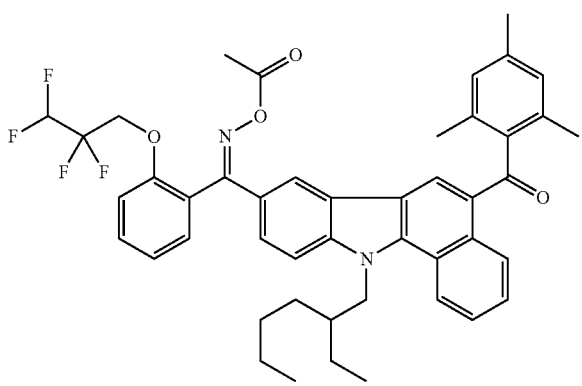

(C-14)
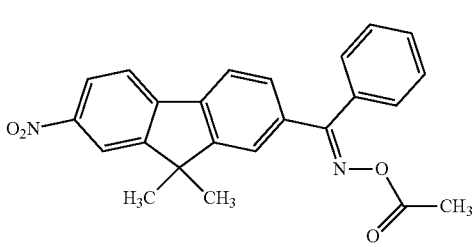

-continued (C-15)
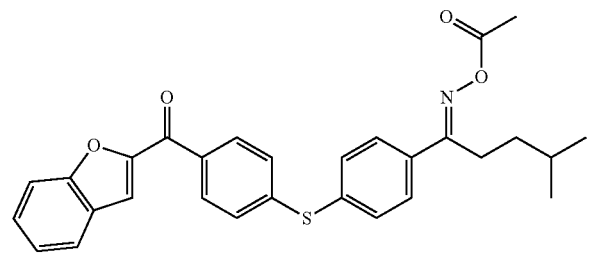

(C-16)
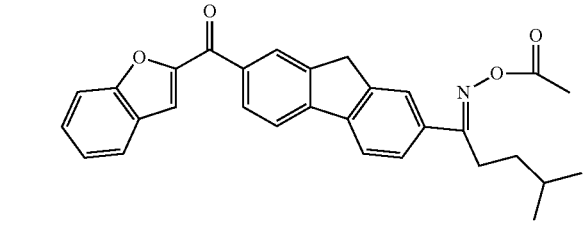

The oxime compound is preferably a compound having a maximal absorption wavelength in a wavelength range of 350 to 500 nm and more preferably a compound having a maximal absorption wavelength in a wavelength range of 360 to 480 nm. In addition, from the viewpoint of sensitivity, a molar absorption coefficient of the oxime compound at a wavelength of 365 nm or 405 nm is preferably high, more preferably 1000 to 300000, still more preferably 2000 to 300000, and particularly preferably 5000 to 200000. The molar absorption coefficient of a compound can be measured using a known method. For example, the molar absorption coefficient is preferably measured by a spectrophotometer (Cary-5 spectrophotometer, manufactured by Varian Medical Systems, Inc.) using ethyl acetate at a concentration of 0.01 g/L.

As the photopolymerization initiator, a bifunctional or tri- or higher functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the resin composition can be improved.

Specific examples of the bifunctional or tri- or higher functional photoradical polymerization initiator include dimers of the oxime compounds described in JP2010-527339A, JP2011-524436A, WO2015/004565A, paragraph Nos. 0407 to 0412 of JP2016-532675A, and paragraph Nos. 0039 to 0055 of WO2017/033680A; the compound (E) and compound (G) described in JP2013-522445A; Cmpd 1 to 7 described in WO2016/034963A; the oxime ester photoinitiators described in paragraph No. 0007 of JP2017-523465A; the photoinitiators described in paragraph Nos. 0020 to 0033 of JP2017-167399A; the photopolymerization initiator (A) described in paragraph Nos. 0017 to 0026 of JP2017-151342A; and the oxime compounds described in JP6469669B.

A content of the photopolymerization initiator in the total solid content of the resin composition is preferably 0.1% to 30% by mass. The lower limit is preferably 0.5% by mass or more and more preferably 1% by mass or more. The upper limit is preferably 20% by mass or less and more preferably 15% by mass or less. The photopolymerization initiator may be used singly or in a combination of two or more kinds thereof.

<<Silane Coupling Agent>>

The resin composition according to the embodiment of the present invention can contain a silane coupling agent. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an amino group, a ureido group, a sulfide group, an isocyanate group, and a phenyl group, and an amino group, a (meth)acryloyl group, or an epoxy group is preferable. Specific examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference.

A content of the silane coupling agent in the total solid content of the resin composition is preferably 0.1% to 5% by mass. The upper limit is preferably 3% by mass or less and more preferably 2% by mass or less. The lower limit is preferably 0.5% by mass or more and more preferably 1% by mass or more. The silane coupling agent may be used singly or in a combination of two or more kinds thereof.

<<Curing Accelerator>>

For the purpose of promoting the reaction of the resin and the polymerizable compound and lowering the curing temperature, the resin composition according to the embodiment of the present invention can further contain a curing accelerator. As the curing accelerator, a methylol-based compound (for example, the compounds exemplified as a crosslinking agent in paragraph No. 0246 of JP2015-034963A), amines, phosphonium salts, amidine salts, and amide compounds (each of which is the curing agent described in, for example, paragraph No. 0186 of JP2013-041165A), base generators (for example, the ionic compounds described in JP2014-055114A), cyanate compounds (for example, the compounds described in paragraph No. 0071 of JP2012-150180A), alkoxysilane compounds (for example, the alkoxysilane compounds having an epoxy group, described in JP2011-253054A), onium salt compounds (for example, the compounds exemplified as an acid generator in paragraph No. 0216 of JP2015-034963A, and the compounds described in JP2009-180949A), or the like can also be used.

In a case where the resin composition according to the embodiment of the present invention contains a curing accelerator, the content of the curing accelerator is preferably 0.3% to 8.9% by mass and more preferably 0.8% to 6.4% by mass with respect to the total solid content of the resin composition.

<<Polymerization Inhibitor>>

The resin composition according to the embodiment of the present invention can contain a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-t-butylphenol), and an N-nitrosophenylhydroxylamine salt (an ammonium salt, a cerous salt, or the like). Among these, p-methoxyphenol is preferable. A content of the polymerization inhibitor in the total solid content of the resin composition is preferably 0.0001% to 5% by mass.

<<Surfactant>>

The resin composition according to the embodiment of the present invention can contain a surfactant. As the surfactant, various surfactants such as a fluorine-based surfactant, a nonionic surfactant, a cationic surfactant, an anionic surfactant, or a silicone-based surfactant can be used. Examples of the surfactant include surfactants described in paragraph Nos. 0238 to 0245 of WO2015/166779A, the contents of which are incorporated herein by reference.

It is preferable that the surfactant is a fluorine-based surfactant. By containing a fluorine-based surfactant in the resin composition, liquid characteristics (particularly, fluidity) are further improved, and liquid saving properties can be further improved. In addition, it is possible to form a film with a small thickness unevenness. In addition, the surfactant is also preferably a silicone-based surfactant.

A fluorine content in the fluorine-based surfactant is suitably 3% to 40% by mass, and more preferably 5% to 30% by mass and particularly preferably 7% to 25% by mass. The fluorine-based surfactant in which the fluorine content is within the above-described range is effective in terms of the evenness of the thickness of the coating film or liquid saving properties and the solubility of the surfactant in the resin composition is also good.

Examples of the fluorine-based surfactant include surfactants described in paragraph Nos. 0060 to 0064 of JP2014-041318A (paragraph Nos. 0060 to 0064 of the corresponding WO2014/017669A) and the like, and surfactants described in paragraph Nos. 0117 to 0132 of JP2011-132503A, the contents of which are incorporated herein by reference. Examples of a commercially available product of the fluorine-based surfactant include: MEGAFACE F-171, F-172, F-173, F-176, F-177, F-141, F-142, F-143, F-144, R-30, F-437, F-475, F-477, F-479, F-482, F-554, F-555-A, F-556, F-557, F-558, F-559, F-560, F-561, F-565, F-563, F-568, F-575, F-780, EXP, MFS-330, R-01, R-40, R-40-LM, R-41, R-41-LM, RS-43, R-43, TF-1956, RS-90, R-94, RS-72-K, and DS-21 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); POLYFOX PF636, PF656, PF6320, PF6520, and PF7002 (all of which are manufactured by OMNOVA Solutions Inc.); and FTERGENT 208G, 215M, 245F, 601AD, 601ADH2, 602A, 610FM, 710FL, 710FM, 710FS, and FTX-218 (manufactured by NEOS COMPANY LIMITED).

In addition, it is also preferable that a polymer of a fluorine atom-containing vinyl ether compound having a fluorinated alkyl group or a fluorinated alkylene ether group, and a hydrophilic vinyl ether compound is used as the fluorine-based surfactant. With regard to such a fluorine-based surfactant, reference can be made to the description in JP2016-216602A, the contents of which are incorporated herein by reference.

A block polymer can also be used as the fluorine-based surfactant. Examples thereof include the compounds described in JP2011-089090A. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used. The following compounds are also exemplified as the fluorine-based surfactant used in the present invention.

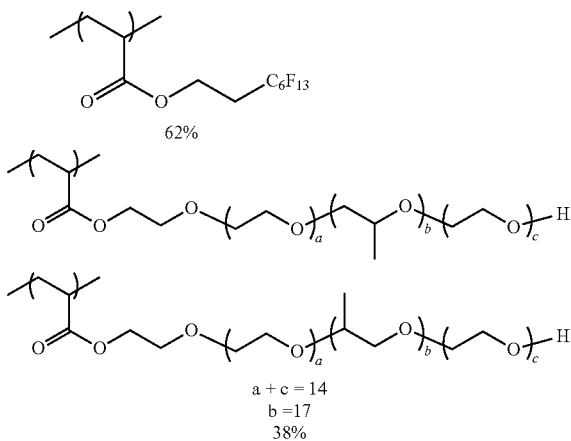

A weight-average molecular weight of the compound is preferably 3000 to 50000 and, for example, 14000. In the compound, "%" representing the proportion of a repeating unit is mol %.

In addition, as the fluorine-based surfactant, a fluorine-containing polymer having an ethylenically unsaturated bond-containing group in the side chain can be used. Specific examples thereof include compounds described in paragraph Nos. 0050 to 0090 and paragraph Nos. 0289 to 0295 of JP2010-164965A, for example, MEGAFACE RS-101, RS-102, RS-718K, and RS-72-K manufactured by DIC Corporation. As the fluorine-based surfactant, the compounds described in paragraph Nos. 0015 to 0158 of JP2015-117327A can also be used.

In addition, from the viewpoint of environmental regulation, it is also preferable to use a surfactant described in WO2020/084854A as a substitute for the surfactant having a perfluoroalkyl group having 6 or more carbon atoms.

In addition, it is also preferable to use a fluorine-containing imide salt compound represented by Formula (fi-1) as the surfactant.

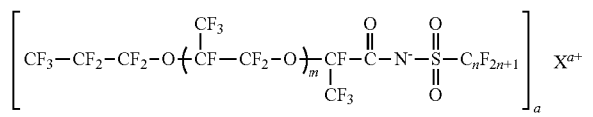

In Formula (fi-1), m represents 1 or 2, n represents an integer of 1 to 4, a represents 1 or 2, and X represents an a-valent metal ion, a primary ammonium ion, a secondary ammonium ion, a tertiary ammonium ion, a quaternary ammonium ion, or $NH_4^+$.

Examples of the nonionic surfactant include glycerol, trimethylolpropane, trimethylolethane, an ethoxylate and propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrizol Japan Ltd.), NCW-101, NCW-1001, and NCW-1002 (all of which are manufactured by FUJIFILM Wako Pure Chemical Corporation), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

Examples of the cationic surfactant include tetraalkylammonium salt, alkylamine salt, benzalkonium salt, alkylpyridium salt, and imidazolium salt. Specific examples thereof include dihydroxyethylstearylamine, 2-heptadecenyl-hydroxyethylimidazoline, lauryldimethylbenzylammonium chloride, cetylpyridinium chloride, and stealamidemethylpyridium chloride.

Examples of the anionic surfactant include dodecylbenzene sulfonic acid, sodium dodecylbenzene sulfonate, sodium lauryl sulfate, sodium alkyldiphenyl ether disulfonate, sodium alkylnaphthalene sulfonate, sodium dialkyl sulfosuccinate, sodium stearate, potassium oleate, sodium dioctyl sulfosuccinate, sodium polyoxyethylene alkyl ether sulfate, sodium polyoxyethylene alkylphenyl ether sulfate, sodium dialkyl sulfosuccinate, sodium stearate, sodium oleate, and sodium t-octylphenoxyethoxypolyethoxyethyl sulfate.

Examples of the silicone-based surfactant include: DC3PA, SH7PA, DC11PA, SH21PA, SH28PA, SH29PA, SH30PA, SH8400, SH 8400 FLUID, FZ-2122, 67 Additive, 74 Additive, M Additive, and SF 8419 OIL (all of which are manufactured by Dow TORAY); TSF-4300, TSF-4445, TSF-4460, and TSF-4452 (all of which are manufactured by Momentive Performance Materials Inc.); KP-341, KF-6000, KF-6001, KF-6002, and KF-6003 (all of which are manufactured by Shin-Etsu Chemical Co., Ltd.); and BYK-307, BYK-322, BYK-323, BYK-330, BYK-333, BYK-3760, and BYK-UV3510 (all of which are manufactured by BYK Chemie).

In addition, as the silicone-based surfactant, a compound having the following structure can also be used.

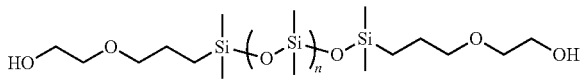

A content of the surfactant in the total solid content of the resin composition is preferably 0.001% by mass to 5.0% by mass and more preferably 0.005% to 3.0% by mass. The surfactant may be used singly or in a combination of two or more kinds thereof. In a case of using two or more kinds thereof, the total amount thereof is preferably within the above-described range.

<<Ultraviolet Absorber>>

The resin composition according to the embodiment of the present invention can contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, or the like can be used. With regard to details thereof, reference can be made to the description in paragraph Nos. 0052 to 0072 of JP2012-

208374A, paragraph Nos. 0317 to 0334 of JP2013-068814A, and paragraph Nos. 0061 to 0080 of JP2016-162946A, the contents of which are incorporated herein by reference. Examples of a commercially available product of the ultraviolet absorber include UV-503 (manufactured by Daito Chemical Co., Ltd.), Tinuvin series and Uvinul series manufactured by BASF SE, and Sumisorb series manufactured by Sumika Chemtex Co., Ltd. In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraph Nos. 0049 to 0059 of JP6268967B, compounds described in paragraph Nos. 0059 to 0076 of WO2016/181987A, and thioaryl group-substituted benzotriazole type ultraviolet absorbers described in WO2020/137819A can also be used. A content of the ultraviolet absorber in the total solid content of the resin composition is preferably 0.01% to 10% by mass and more preferably 0.01% to 5% by mass. The ultraviolet absorber may be used singly or in a combination of two or more kinds thereof. In a case of using two or more kinds thereof, the total amount thereof is preferably within the above-described range.

<<Antioxidant>>

The resin composition according to the embodiment of the present invention can contain an antioxidant. Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be suitably used. In addition, as the antioxidant, compounds described in KR10-2019-0059371A can also be used. A content of the antioxidant in the total solid content of the resin composition is preferably 0.01% to 20% by mass and more preferably 0.3% to 15% by mass. The antioxidant may be used singly or in a combination of two or more kinds thereof. In a case of using two or more kinds thereof, the total amount thereof is preferably within the above-described range.

<<Other Components>>

Optionally, the resin composition according to the embodiment of the present invention may further contain a sensitizer, a filler, a thermal curing accelerator, a plasticizer, and other auxiliary agents (for example, conductive particles, an antifoaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraph No. 0183 of JP2012-003225A (corresponding to paragraph No. 0237 of US2013/0034812A) and paragraph Nos. 0101 to 0104 and 0107 to 0109 of JP2008-250074A, the contents of which are incorporated herein by reference. In addition, optionally, the resin composition may contain a potential antioxidant. Examples of the potential antioxidant include a compound in which a site functioning as an antioxidant is protected by a protective group, and the protective group is eliminated by heating the compound at 100° C. to 250° C. or heating the compound at 80° C. to 200° C. in the presence of an acid or base catalyst so that the compound functions as an antioxidant. Examples of the potential antioxidant include compounds described in WO2014/021023A, WO2017/030005A, and JP2017-008219A. Examples of a commercially available product thereof include ADEKA ARKLS GPA-5001 (manufactured by ADEKA Corporation). In addition, as described in JP2018-155881A, C. I. Pigment Yellow 129 may be added for the purpose of improving weather fastness.

In order to adjust the refractive index of a film to be obtained, the resin composition according to the embodiment of the present invention may contain a metal oxide. Examples of the metal oxide include $TiO_2$, $ZrO_2$, $Al_2O_3$, and $SiO_2$. The primary particle diameter of the metal oxide is preferably 1 to 100 nm, more preferably 3 to 70 nm, and still more preferably 5 to 50 nm. The metal oxide may have a core-shell structure. In addition, in this case, the core portion may be hollow.

The resin composition according to the embodiment of the present invention may include a light-resistance improver. Examples of the light-resistance improver include the compounds described in paragraph Nos. 0036 and 0037 of JP2017-198787A, the compounds described in paragraph Nos. 0029 to 0034 of JP2017-146350A, the compounds described in paragraph Nos. 0036 and 0037, and 0049 to 0052 of JP2017-129774A, the compounds described in paragraph Nos. 0031 to 0034 and 0058 and 0059 of JP2017-129674A, the compounds described in paragraph Nos. 0036 and 0037, and 0051 to 0054 of JP2017-122803A, the compounds described in paragraph Nos. 0025 to 0039 of WO2017/164127A, the compounds described in paragraph Nos. 0034 to 0047 of JP2017-186546A, the compounds described in paragraph Nos. 0019 to 0041 of JP2015-025116A, the compounds described in paragraph Nos. 0101 to 0125 of JP2012-145604A, the compounds described in paragraph Nos. 0018 to 0021 of JP2012-103475A, the compounds described in paragraph Nos. 0015 to 0018 of JP2011-257591A, the compounds described in paragraph Nos. 0017 to 0021 of JP2011-191483A, the compounds described in paragraph Nos. 0108 to 0116 of JP2011-145668A, and the compounds described in paragraph Nos. 0103 to 0153 of JP2011-253174A.

In the resin composition according to the embodiment of the present invention, the content of liberated metals which are not bonded to or coordinated with a pigment or the like is preferably 100 ppm or less, more preferably 50 ppm or less, and still more preferably 10 ppm or less, it is particularly preferable to not contain the liberated metals substantially. According to this aspect, effects such as stabilization of pigment dispersibility (restraint of aggregation), improvement of spectral characteristics due to improved dispersibility, restraint of conductivity fluctuation due to stabilization of curable components or elution of metal atoms and metal ions, and improvement of display characteristics can be expected. In addition, the effects described in JP2012-153796A, JP2000-345085A, JP2005-200560A, JP1996-043620A (JP-H08-043620A), JP2004-145078A, JP2014-119487A, JP2010-083997A, JP2017-090930A, JP2018-025612A, JP2018-025797A, JP2017-155228A, JP2018-036521A, and the like can also be obtained. Examples of the types of the above-described liberated metals include Na, K, Ca, Sc, Ti, Mn, Cu, Zn, Fe, Cr, Co, Mg, Al, Sn, Zr, Ga, Ge, Ag, Au, Pt, Cs, Ni, Cd, Pb, and Bi. In addition, in the resin composition according to the embodiment of the present invention, the content of liberated halogen which is not bonded to or coordinated with a pigment or the like is preferably 100 ppm or less, more preferably 50 ppm or less, and still more preferably 10 ppm or less, it is particularly preferable to not contain the liberated halogen substantially. Examples of halogen include F, Cl, Br, I, and anions thereof. Examples of a method for reducing liberated metals and halogens in the resin composition include washing with ion exchange water, filtration, ultrafiltration, and purification with an ion exchange resin.

It is also preferable that the resin composition according to the embodiment of the present invention does not substantially include terephthalic acid ester. Here, the "does not substantially include" means that the content of terephthalic acid ester is 1000 mass ppb or less in the total amount of the resin composition, and it is more preferable to be 100 mass ppb or less and particularly preferable to be 0.

Perfluoroalkyl sulfonic acid and perfluoroalkyl carboxylic acid may be better to be reduced for environmental reasons and the like. The content of the perfluoroalkyl sulfonic acid and perfluoroalkyl carboxylic acid (particularly, perfluoroalkyl sulfonic acid and perfluoroalkyl carboxylic acid having 6 to 8 carbon atoms of alkyl) in the solid content of the resin composition is preferably 0.01 to 1000 mass ppb, more preferably 0.05 to 500 mass ppb, and still more preferably 0.1 to 300 mass ppb. In addition, substituting for compounds having different carbon atoms, it is also preferable to be an aspect in which these compounds are substantially not contained.

<Storage Container>

A storage container of the resin composition according to the embodiment of the present invention is not particularly limited, and a known storage container can be used. In addition, as the storage container, it is also preferable to use a multilayer bottle having an interior wall constituted with six layers from six kinds of resins or a bottle having a 7-layer structure from 6 kinds of resins for the purpose of suppressing infiltration of impurities into raw materials or resin compositions. Examples of such a container include the containers described in JP2015-123351A. In addition, for the purpose of preventing metal elution from the container interior wall, improving storage stability of the resin composition, and suppressing the alteration of components, it is also preferable that the container interior wall is formed of glass, stainless steel, or the like.

<Method for Preparing Resin Composition>

The resin composition according to the embodiment of the present invention can be prepared by mixing the above-described components with each other. In the preparation of the resin composition, all the components may be dissolved and/or dispersed at the same time in an organic solvent to prepare the resin composition, or the respective components may be appropriately left in two or more solutions or dispersion liquids and mixed to prepare the resin composition upon use (during coating), as desired.

In addition, in the preparation of the resin composition, a process of dispersing the pigment is preferably included. In the process for dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling step may be performed. With regard to the materials, equipment, treatment conditions, and the like used in the salt milling step, reference can be made to, for example, the description in JP2015-194521A and JP2012-046629A.

During the preparation of the resin composition, it is preferable that the resin composition is filtered through a filter, for example, in order to remove foreign matter or to reduce defects. As the filter, any filters that have been used in the related art for filtration use and the like may be used without particular limitation. Examples of a material of the filter include: a fluororesin such as polytetrafluoroethylene (PTFE) and polyvinylidene fluoride (PVDF); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including a high-density polypropylene) and nylon are preferable.

The pore size of the filter is preferably 0.01 to 7.0 µm, more preferably 0.01 to 3.0 µm, and still more preferably 0.05 to 0.5 µm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NXEY, DFA4201NAEY, DFA4201J006P, and the like), Toyo Roshi Kaisha., Ltd., Nihon Entegris K.K. (formerly Nippon Microlith Co., Ltd.), Kitz Micro Filter Corporation, and the like can be used.

In addition, it is preferable that a fibrous filter material is used as the filter. Examples of the fibrous filter material include a polypropylene fiber, a nylon fiber, and a glass fiber. Examples of a commercially available product include SBP type series (SBP008 and the like), TPR type series (TPR002, TPR005, and the like), or SHPX type series (SHPX003 and the like), all of which are manufactured by Roki Techno Co., Ltd.

In a case of using a filter, different filters (for example, a first filter, a second filter, and the like) may be combined. In this case, the filtration with each of the filters may be performed once or may be performed twice or more times. In addition, filters having different pore sizes within the above-described range may be combined. In addition, the filtration through the first filter may be performed with only a dispersion liquid, the other components may be mixed therewith, and then the filtration through the second filter may be performed. In addition, the filter can be appropriately selected according to hydrophobicity of the resin composition.

<Film>

The film according to the embodiment of the present invention is a film formed of the above-described resin composition according to the embodiment of the present invention. The film according to the embodiment of the present invention can be used for an optical filter such as a color filter, a near-infrared cut filter, and a near-infrared transmitting filter. In addition, the film according to the embodiment of the present invention can also be used as a black matrix, a light-shielding film, or the like.

A thickness of the film according to the embodiment of the present invention can be adjusted according to the purpose. For example, the film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more.

In a case where the film according to the embodiment of the present invention is used as a color filter, the film according to the embodiment of the present invention preferably has a hue of green, red, blue, cyan, magenta, or yellow. In addition, the film according to the embodiment of the present invention can be preferably used as a colored pixel of a color filter. Examples of the colored pixel include a red pixel, a blue pixel, a green pixel, a yellow pixel, a cyan pixel, and a magenta pixel.

In a case where the film according to the embodiment of the present invention is used as a near-infrared cut filter, the maximal absorption wavelength of the film according to the embodiment of the present invention is preferably in a wavelength range of 700 to 1800 nm, more preferably in a wavelength range of 700 to 1300 nm, and still more preferably in a wavelength range of 700 to 1100 nm. In addition, in the film, a transmittance of in the entire wavelength range of 400 to 650 nm is preferably 70% or more, more preferably 80% or more, and still more preferably 90% or more. In addition, the transmittance of the film at at least one point in a wavelength range of 700 to 1800 nm is preferably 20% or less. In addition, absorbance $A_{max}$/absorbance $A_{550}$, which is a ratio of an absorbance Amax at a maximal absorption wavelength to an absorbance $A_{550}$ at a wavelength of 550 nm, is preferably 20 to 500, more preferably 50 to 500, still more preferably 70 to 450, and particularly preferably 100 to 400.

In a case where the film according to the embodiment of the present invention is used as a near-infrared transmitting filter, it is preferable that the film according to the embodiment of the present invention has, for example, any one of the following spectral characteristics (i1) to (i5).

(i1): filter in which the maximum value of a transmittance in a wavelength range of 400 to 640 nm is 20% or less (preferably 15% or less and more preferably 10% or less) and the minimum value of a transmittance in a wavelength range of 800 to 1500 nm is 70% or more (preferably 75% or more and more preferably 80% or more). A film having such spectral characteristics can shield light having a wavelength range of 400 to 640 nm, and can transmit light having a wavelength exceeding 750 nm.

(i2): filter in which the maximum value of a transmittance in a wavelength range of 400 to 750 nm is 20% or less (preferably 15% or less and more preferably 10% or less) and the minimum value of a transmittance in a wavelength range of 900 to 1500 nm is 70% or more (preferably 75% or more and more preferably 80% or more). A film having such spectral characteristics can shield light having a wavelength range of 400 to 750 nm, and can transmit light having a wavelength exceeding 850 nm.

(i3): filter in which the maximum value of a transmittance in a wavelength range of 400 to 830 nm is 20% or less (preferably 15% or less and more preferably 10% or less) and the minimum value of a transmittance in a wavelength range of 1000 to 1500 nm is 70% or more (preferably 75% or more and more preferably 80% or more). A film having such spectral characteristics can shield light having a wavelength range of 400 to 830 nm, and can transmit light having a wavelength exceeding 950 nm.

(i4): filter in which the maximum value of a transmittance in a wavelength range of 400 to 950 nm is 20% or less (preferably 15% or less and more preferably 10% or less) and the minimum value of a transmittance in a wavelength range of 1100 to 1500 nm is 70% or more (preferably 75% or more and more preferably 80% or more). A film having such spectral characteristics can shield light having a wavelength range of 400 to 950 nm, and can transmit light having a wavelength exceeding 1050 nm.

(i5): filter in which the maximum value of a transmittance in a wavelength range of 400 to 1050 nm is 20% or less (preferably 15% or less and more preferably 10% or less) and the minimum value of a transmittance in a wavelength range of 1200 to 1500 nm is 70% or more (preferably 75% or more and more preferably 80% or more). A film having such spectral characteristics can shield light having a wavelength range of 400 to 1050 nm, and can transmit light having a wavelength exceeding 1150 nm.

In the film according to the embodiment of the present invention, a thickness of the film after performing a heating treatment of the film at 300° C. for 5 hours in a nitrogen atmosphere is preferably 70% or more of a thickness of the film before the heating treatment, more preferably 80% or more thereof, and still more preferably 90% or more thereof.

In addition, a thickness of the film after performing a heating treatment of the film at 350° C. for 5 hours in a nitrogen atmosphere is preferably 70% or more of a thickness of the film before the heating treatment, more preferably 80% or more thereof, and still more preferably 90% or more thereof.

In addition, a thickness of the film after performing a heating treatment of the film at 400° C. for 5 hours in a nitrogen atmosphere is preferably 70% or more of a thickness of the film before the heating treatment, more preferably 80% or more thereof, and still more preferably 90% or more thereof.

<Method for Producing Film>

The film according to the embodiment of the present invention can be manufactured through a step of applying the resin composition according to the embodiment of the present invention on a support. The method for manufacturing the film according to the embodiment of the present invention preferably further includes a step of forming a pattern (pixel). Examples of a method for forming the pattern (pixel) include a photolithography method and a dry etching method, and a photolithography method is preferable.

(Photolithography Method)

First, a case of forming the pattern by a photolithography method to manufacture a film will be described. Pattern formation by the photolithography method preferably includes a step of forming a resin composition layer on a support using the resin composition according to the embodiment of the present invention, a step of exposing the resin composition layer in a patterned manner, and a step of removing a non-exposed portion of the resin composition layer by development to form a pattern (pixel). A step (pre-baking step) of baking the resin composition layer and a step (post-baking step) of baking the developed pattern (pixel) may be provided, optionally.

In the step of forming a resin composition layer, the resin composition layer is formed on a support using the resin composition according to the embodiment of the present invention. The support is not particularly limited, and can be appropriately selected depending on applications. Examples thereof include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, a base layer may be provided on the silicon substrate so as to improve adhesiveness to an upper layer, prevent the diffusion of materials, or planarize the surface of the substrate. A surface contact angle of the base layer is preferably 20° to 70° in a case of being measured with diiodomethane. In addition, the surface contact angle of the base layer is preferably 30° to 80° in a case of being measured with water. In a case where the surface contact angle of the base layer is within the above-described range, coating property of the resin composition is good. The surface contact angle of the base layer can be adjusted by, for example, adding a surfactant.

As a method of applying the resin composition, a known method can be used. Examples thereof include a dropping method (drop casting); a slit coating method; a spray method; a roll coating method; a spin coating method (spin coating); a cast coating method; a slit and spin method; a pre-wet method (for example, a method described in JP2009-145395A), various printing methods such as an ink jet (for example, on-demand type, piezo type, thermal type), a discharge printing such as nozzle jet, a flexo printing, a screen printing, a gravure printing, a reverse offset printing, and a metal mask printing; a transfer method using molds and the like; and a nanoimprinting method. A method for applying the ink jet is not particularly limited, and examples thereof include a method described in "Extension of Use of Ink Jet—Infinite Possibilities in Patent—" (February, 2005, S. B. Research Co., Ltd.) (particularly pp. 115 to 133) and methods described in JP2003-262716A, JP2003-185831A, JP2003-261827A, JP2012-126830A, and JP2006-169325A. In addition, as the method of applying the resin composition, methods described in WO2017/030174A and WO2017/018419A can also be used, the contents of which are incorporated herein by reference.

The resin composition layer formed on the support may be dried (pre-baked). In a case of producing a film by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 to 300 seconds, more preferably 40 to 250 seconds, and still more preferably 80 to 220 seconds. The pre-baking can be performed using a hot plate, an oven, or the like.

Next, the resin composition layer is exposed in a patterned manner (exposing step). For example, the resin composition layer can be exposed in a patterned manner using a stepper exposure device or a scanner exposure device through a mask having a predetermined mask pattern. Thus, the exposed portion can be cured.

Examples of the radiation (light) which can be used during the exposure include g-rays and i-rays. In addition, light (preferably light having a wavelength of 180 to 300 nm) having a wavelength of 300 nm or less can be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

In addition, in a case of exposure, the photosensitive composition layer may be irradiated with light continuously to expose the photosensitive composition layer, or the photosensitive composition layer may be irradiated with light in a pulse to expose the photosensitive composition layer (pulse exposure). The pulse exposure refers to an exposing method in which light irradiation and resting are repeatedly performed in a short cycle (for example, millisecond-level or less). In a case of the pulse exposure, the pulse width is preferably 100 nanoseconds (ns) or less, more preferably 50 nanoseconds or less, and still more preferably 30 nanoseconds or less. The lower limit of the pulse width is not particularly limited, and may be 1 femtosecond (fs) or more or 10 femtoseconds or more. The frequency is preferably 1 kHz or more, more preferably 2 kHz or more, and still more preferably 4 kHz or more. The upper limit of the frequency is preferably 50 kHz or less, more preferably 20 kHz or less, and still more preferably 10 kHz or less. The maximum instantaneous illuminance is preferably 50000000 W/m$^2$ or more, more preferably 100000000 W/m$^2$ or more, and still more preferably 200000000 W/m$^2$ or more. In addition, the upper limit of the maximum instantaneous illuminance is preferably 1000000000 W/m$^2$ or less, more preferably 800000000 W/m$^2$ or less, and still more preferably 500000000 W/m$^2$ or less. The pulse width refers to a time during which light is irradiated in a pulse period. In addition, the frequency refers to the number of pulse periods per second. In addition, the maximum instantaneous illuminance refers to an average illuminance within the period of light irradiation in the pulse period. In addition, the pulse period refers to a period in which light irradiation and resting in the pulse exposure are defined as one cycle.

The irradiation amount (exposure amount) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 W/m$^2$ to 100000 W/m$^2$ (for example, 5000 W/m$^2$, 15000 W/m$^2$, or 35000 W/m$^2$). Appropriate conditions of each of the oxygen concentration and the exposure illuminance may be combined, and for example, a combination of the oxygen concentration of 10% by volume and the illuminance of 10000 W/m$^2$, a combination of the oxygen concentration of 35% by volume and the illuminance of 20000 W/m$^2$, or the like is available.

Next, the non-exposed portion of the resin composition layer is removed by development to form a pattern (pixel). The non-exposed portion of the resin composition layer can be removed by development using a developer. Thus, the resin composition layer of the non-exposed portion in the exposing step is eluted into the developer, and as a result, only a photocured portion remains. The temperature of the developer is preferably, for example, 20° C. to 30° C. The development time is preferably 20 to 180 seconds. In addition, in order to improve residue removing properties, a step of removing the developer by shaking off per 60 seconds and supplying a fresh developer may be repeated multiple times.

Examples of the developer include an organic solvent and an alkali developer, and an alkali developer is preferably used. As the alkali developer, an alkaline aqueous solution (alkali developer) in which an alkali agent is diluted with pure water is preferable. Examples of the alkali agent include organic alkaline compounds such as ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. In consideration of environmental aspects and safety aspects, the alkali agent is preferably a compound having a high molecular weight. The concentration of the alkali agent in the alkaline aqueous solution is preferably 0.001% to 10% by mass and more preferably 0.01% to 1% by mass. In addition, the developer may further contain a surfactant. Examples of the surfactant include the surfactants described above, and the surfactant is preferably a nonionic surfactant. From the viewpoint of transportation, storage, and the like, the developer may be first produced as a concentrated solution and then diluted to a concentration required upon the use. The dilution ratio is not particularly limited, and can be set to, for example, a range of 1.5 to 100 times. In addition, it is also preferable to wash (rinse) with pure water after development. In addition, it is preferable that the rinsing is performed by supplying a rinsing liquid to the resin composition layer after development while rotating the support on which the resin composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is preferable to carry out an additional exposure treatment or a heating treatment (post-baking) after carrying out drying. The additional exposure treatment or the post-baking is a curing treatment after development in order to complete curing. The heating temperature in the post-baking is preferably, for example, 100° C. to 240° C. and more preferably 200° C. to 240° C. In addition, the heating temperature in the post-baking may be 240° C. to 400° C., 250° C. to 350° C., or 300° C. to 350° C. The heating time in the post-baking is, for example, preferably 5 minutes to 5 hours, more preferably 1 to 4 hours, and still more preferably 2 to 4 hours. The film after development is post-baked continuously or batchwise using a heating unit such as a hot plate, a convection oven (hot air circulation dryer), and a high-frequency heater under the above-described conditions. In a case of performing the additional exposure treatment, light used for the exposure is preferably light having a wavelength of 400 nm or less. In addition, the additional exposure treatment may be carried out by the method described in KR10-2017-0122130A.

(Dry Etching Method)

Pattern formation by a dry etching method preferably includes a step of forming a resin composition layer on a support using the resin composition according to the embodiment of the present invention and curing the entire resin composition layer to form a cured composition layer, a step of forming a photoresist layer on the cured composition layer, a step of exposing the photoresist layer in a patterned manner and then developing the photoresist layer to form a resist pattern, and a step of dry-etching the cured composition layer through this resist pattern as a mask and using an etching gas. It is preferable that pre-baking treatment is further performed in order to form the photoresist layer. In particular, as the forming process of the photoresist layer, it is desirable that a heating treatment after exposure and a heating treatment after development (post-baking treatment) are performed. The details of the pattern formation by the dry etching method can be found in paragraph Nos. 0010 to 0067 of JP2013-064993A, the content of which is incorporated herein by reference.

<Optical Filter>

An optical filter according to an embodiment of the present invention has the above-described film according to the embodiment of the present invention. Examples of the optical filter include, a color filter, a near-infrared transmitting filter, and a near-infrared cut filter, and a color filter is preferable. As the color filter, it is preferable to have the film according to the embodiment of the present invention as a colored pixel of the color filter. The optical filter according to the embodiment of the present invention can be used for a solid-state imaging element such as a charge coupled device (CCD) and a complementary metal-oxide semiconductor (CMOS), an image display device, or the like.

In the optical filter, a thickness of the film according to the embodiment of the present invention can be appropriately adjusted depending on the purposes. The film thickness is preferably 5 μm or less, more preferably 1 μm or less, and still more preferably 0.6 μm or less. The lower limit of the film thickness is preferably 0.1 μm or more, more preferably 0.2 μm or more, and still more preferably 0.3 μm or more.

A width of the pixel included in the optical filter is preferably 0.4 to 10.0 μm. The lower limit is preferably 0.4 μm or more, more preferably 0.5 μm or more, and still more preferably 0.6 μm or more. The upper limit is preferably 5.0 μm or less, more preferably 2.0 μm or less, still more preferably 1.0 μm or less, and even more preferably 0.8 μm or less. In addition, a Young's modulus of the pixel is preferably 0.5 to 20 GPa and more preferably 2.5 to 15 GPa.

Each pixel included in the optical filter preferably has high flatness. Specifically, the surface roughness Ra of the pixel is preferably 100 nm or less, more preferably 40 nm or less, and still more preferably 15 nm or less. The lower limit is not specified, but is preferably, for example, 0.1 nm or more. The surface roughness of the pixel can be measured, for example, using an atomic force microscope (AFM) Dimension 3100 manufactured by Veeco Instruments, Inc. In addition, the contact angle of water on the pixel can be appropriately set to a preferred value and is typically in the range of 50° to 110°. The contact angle can be measured, for example, using a contact angle meter CV-DT-A Model (manufactured by Kyowa Interface Science Co., Ltd.). In addition, it is preferable that the volume resistivity value of the pixel is high. Specifically, the volume resistivity value of the pixel is preferably $10^9$ Ω·cm or more and more preferably $10^{11}$ Ω·cm or more. The upper limit is not specified, but is, for example, preferably $10^{14}$ Ω·cm or less. The volume resistivity value of the pixel can be measured using an ultra-high resistance meter 5410 (manufactured by Advantest Corporation).

In the optical filter, a protective layer may be provided on the surface of the film according to the embodiment of the present invention. By providing the protective layer, various functions such as oxygen shielding, low reflection, hydrophilicity/hydrophobicity, and shielding of light (ultraviolet rays, near-infrared rays, and the like) having a specific wavelength can be imparted. The thickness of the protective layer is preferably 0.01 to 10 μm and more preferably 0.1 to 5 μm. Examples of a method for forming the protective layer include a method of forming the protective layer by applying a resin composition for forming a protective layer, which is dissolved in an organic solvent, a chemical vapor deposition method, and a method of attaching a molded resin with an adhesive material. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamidoimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluororesin, a polyacrylonitrile resin, a cellulose resin, Si, C, W, $Al_2O_3$, Mo, $SiO_2$, and $Si_3N_4$, and two or more kinds of these components may be contained. For example, in a case of a protective layer for oxygen shielding, it is preferable that the protective layer contains a polyol resin, $SiO_2$, and $Si_3N_4$. In addition, in a case of a protective layer for low reflection, it is preferable that the protective layer contains a (meth)acrylic resin and a fluororesin.

In a case of forming the protective layer by applying a resin composition for forming a protective layer, as a method for applying the resin composition for forming a protective layer, a known method such as a spin coating method, a casting method, a screen printing method, and an ink jet method can be used. As the organic solvent included in the resin composition for forming a protective layer, a known organic solvent (for example, propylene glycol 1-monomethyl ether 2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

The protective layer may contain, as desired, an additive such as organic or inorganic fine particles, an absorber of light (for example, ultraviolet rays, near-infrared rays, and the like) having a specific wavelength, a refractive index adjusting agent, an antioxidant, an adhesive agent, and a surfactant. Examples of the organic or inorganic fine particles include polymer fine particles (for example, silicone resin fine particles, polystyrene fine particles, and melamine resin fine particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of light having a specific wavelength, a known absorber can be used. The content of these additives can be appropriately adjusted, but is preferably 0.1% to 70% by mass and still more preferably 1% to 60% by mass with respect to the total mass of the protective layer. In addition, as the protective layer, the protective layers described in paragraph Nos. 0073 to 0092 of JP2017-151176A can also be used.

The optical filter may have a structure in which each pixel is embedded in a space partitioned in, for example, a lattice form by a partition wall. In addition, the resin composition according to the embodiment of the present invention can also be suitably used for a pixel configuration described in WO2019/102887A.

<Solid-State Imaging Element>

A solid-state imaging element according to an embodiment of the present invention has the film according to the embodiment of the present invention. The configuration of the solid-state imaging element according to the embodiment of the present invention is not particularly limited as long as the solid-state imaging element is configured to include the film according to the embodiment of the present invention and functions as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving section of the photodiodes on the photodiodes and the transfer electrodes; have a device-protective film formed of silicon nitride or the like, which is formed to coat the entire surface of the light-shielding film and the light receiving section of the photodiodes, on the light-shielding film; and have a color filter on the device-protective film. Further, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each colored pixel is embedded in a space partitioned in, for example, a lattice shape by a partition wall. In this case, it is preferable that the partition wall has a lower refractive index than each colored pixel. Examples of an imaging device having such a structure include the devices described in JP2012-227478A, JP2014-179577A, WO2018/043654A, and US2018/0040656A. In addition, as in JP2019-211559A, an ultraviolet absorbing layer may be provided in the structure of the solid-state imaging element to improve light resistance. An imaging device including the solid-state imaging element according to the embodiment of the present invention can also be used as a vehicle camera or a surveillance camera, in addition to a digital camera or electronic apparatus (mobile phones or the like) having an imaging function. Further, the solid-state imaging element incorporating the color filter according to the embodiment of the present invention may incorporate another color filter, a near-infrared cut filter, an organic photoelectric conversion film, or the like in addition to the color filter according to the embodiment of the present invention.

<Image Display Device>

An image display device according to an embodiment of the present invention has the film according to the embodiment of the present invention. Examples of the image display device include a liquid crystal display device or an organic electroluminescent display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinafter, the present invention will be described in detail with reference to Examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention is not limited to the specific examples shown below.

<Measurement of Weight-Average Molecular Weight (Mw) of Sample>

A weight-average molecular weight (Mw) of a sample was measured by gel permeation chromatography (GPC) according to the following conditions.

Types of columns: columns formed by connection of TOSOH TSKgel Super HZM-H, TOSOH TSKgel Super HZ4000, and TOSOH TSKgel Super HZ2000

Developing solvent: tetrahydrofuran

Column temperature: 40° C.

Flow rate (amount of a sample to be injected): 1.0 µL (sample concentration: 0.1% by mass)

Device name: HLC-8220GPC manufactured by Tosoh Corporation

Detector: refractive index (RI) detector

Calibration curve base resin: polystyrene resin

<Measurement of Acid Value of Sample>

An acid value of a sample represents a mass of potassium hydroxide required to neutralize acidic components per 1 g of solid content in the sample. The acid value of the sample was measured as follows. That is, a measurement sample was dissolved in a mixed solvent of tetrahydrofuran/water=9/1 (mass ratio), and the obtained solution was subjected to neutralization titration with a 0.1 mol/L potassium hydroxide aqueous solution at 25° C. using a potentiometric titrator (trade name: AT-510, manufactured by KYOTO ELECTRONICS MANUFACTURING CO., LTD.). An inflection point of a titration pH curve was set as a titration end point, and the acid value was calculated from the following equation.

$$A = 56.11 \times Vs \times 0.5 \times f/w$$

A: acid value (mgKOH/g)

Vs: amount (mL) of the 0.1 mol/L potassium hydroxide aqueous solution used for the titration f: titer of the 0.1 mol/L potassium hydroxide aqueous solution w: mass (g) of the sample (expressed in terms of solid contents)

<Synthesis of Resin>

(Synthesis of Resin A-1)

300 g of propylene glycol monomethyl ether acetate (PGMEA) was charged into a three-neck flask, and heated to 60° C. under a nitrogen atmosphere. 380 g of (3-ethyloxetan-3-yl)methyl acrylate (manufactured by OSAKA ORGANIC CHEMICAL INDUSTRY LTD., OXE-10), 18.3 g of 6-mercaptohexanol (manufactured by TOKYO CHEMICAL INDUSTRY CO., LTD.), 2.4 g of dimethyl 2,2'-azobisisobutyrate (manufactured by FUJIFILM Wako Pure Chemical Corporation, V-601), and 300 g of PGMEA solution were added dropwise thereto over 2 hours. Thereafter, 2.4 g of dimethyl 2,2'-azobisisobutyrate was added thereto, and the mixture was heated for another 4 hours to synthesize a macromonomer precursor. After cooling this macromonomer precursor solution to 5° C., 0.4 g of dibutylhydroxytoluene (BHT) and 0.16 g of NEOSTANN U-600 (manufactured by Nitto Kasei Co., Ltd.) were added thereto, and then 22.1 g of 2-isocyanatoethyl methacrylate (manufactured by SHOWA DENKO K.K., Karenz MOI) was added dropwise thereto over 30 minutes. The mixture was further stirred at 5° C. for 1 hour, returned to room temperature, and further stirred for 6 hours to obtain a 40% PGMEA solution of a macromonomer AA-1 having the following structure. The weight-average molecular weight (Mw) of the obtained macromonomer AA-1 was 2800.

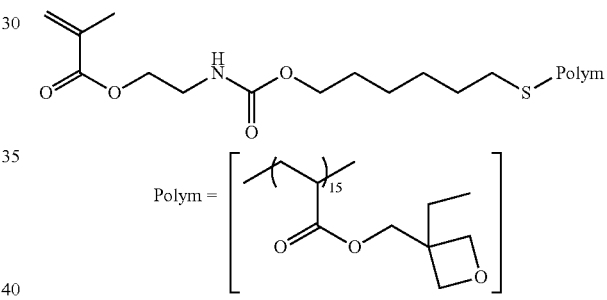

(AA-1)

7.0 g of acrylic acid (manufactured by FUJIFILM Wako Pure Chemical Corporation) and 170 g of the 40% PGMEA solution of the macromonomer AA-1 obtained above were charged into a three-neck flask, 70 g of PGMEA was further added thereto, and the mixture was heated to 80° C. under a nitrogen atmosphere. 1.2 g of dodecanethiol (manufactured by FUJIFILM Wako Pure Chemical Corporation) and 0.35 g of dimethyl 2,2'-azobisisobutyrate were added thereto, and the mixture was heated for 6 hours and stirred to obtain a PGMEA 30% solution of a resin A-1 having the following structure. The weight-average molecular weight (Mw) of the resin A-1 was 30600, and the acid value was 70 mgKOH/g. In the following formula, the numerical value described together with the main chain of the repeating unit indicates mol %, and the description of "Polym" indicates that the polymer chain of the structure in which the repeating unit of the structure indicated by "Polym" is bonded by the number of subscripts is bonded to the sulfur atom (S).

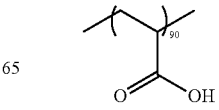

(A-1)

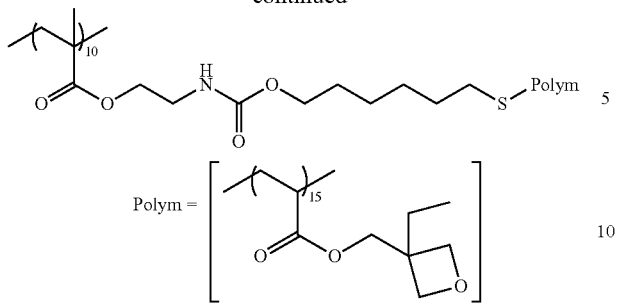

(Synthesis of Resins A-2 to A-48)

Resins A-2 to A-48 were synthesized by the same method as for the resin A-1. In the following formula, the numerical value described together with the main chain of the repeating unit indicates mol %, and the description of "Polym" indicates that the polymer chain of the structure in which the repeating unit of the structure indicated by "Polym" is bonded by the number of subscripts is bonded to the sulfur atom (S).

(A-2)

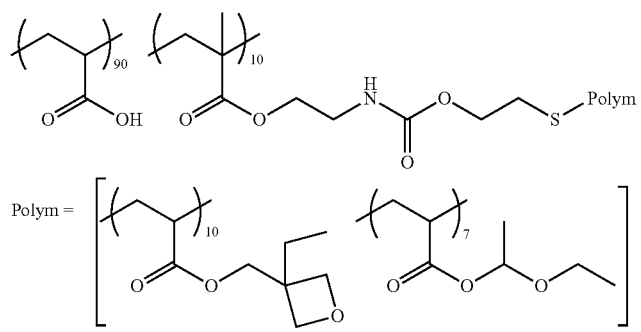

(A-3)

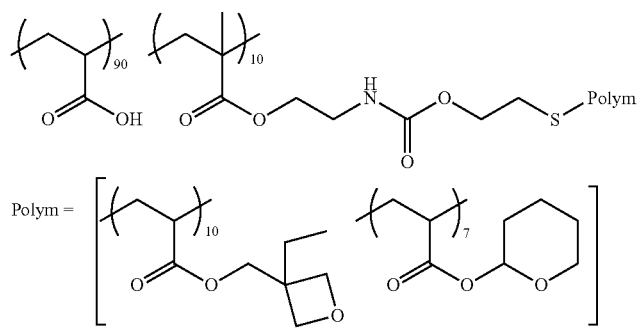

(A-4)

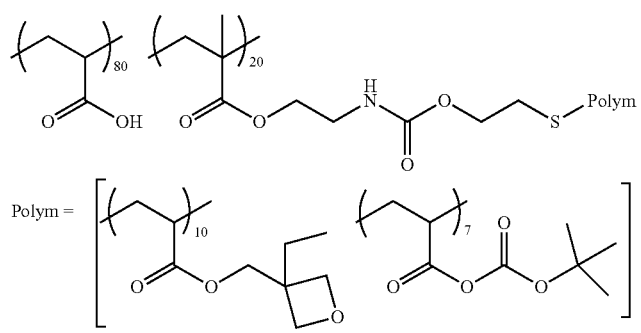

-continued
(A-5)
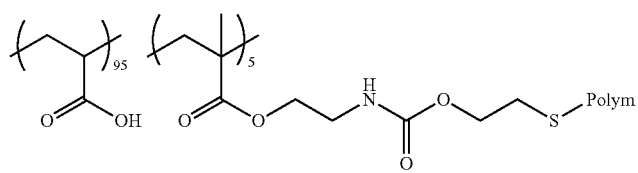
Polym =
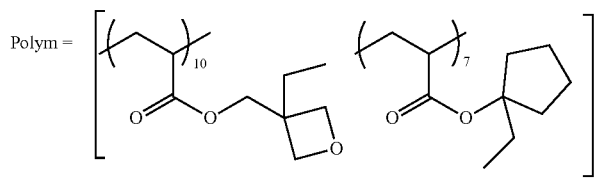
(A-6)
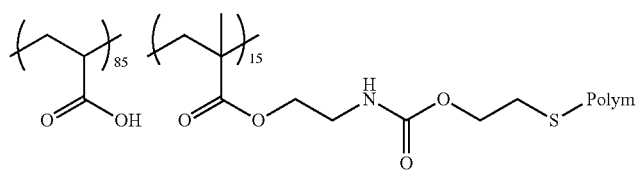
Polym =
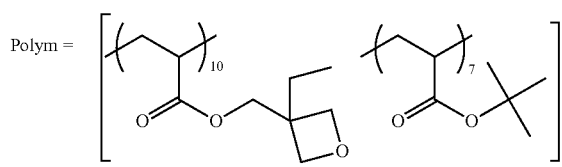
(A-7)
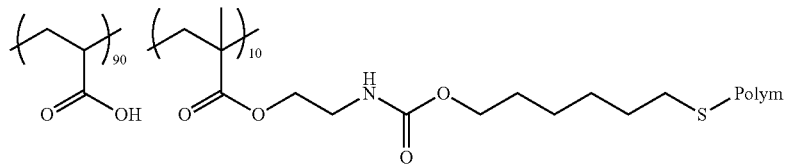
Polym =
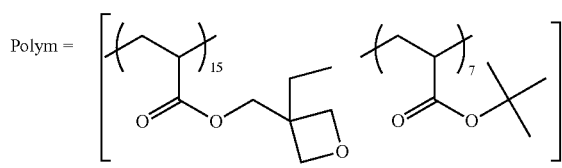
(A-8)
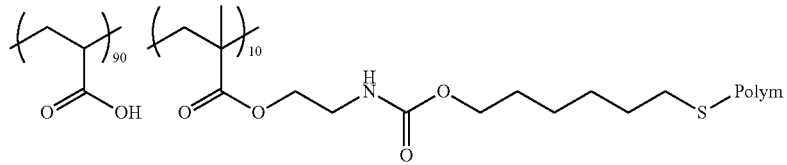
Polym =
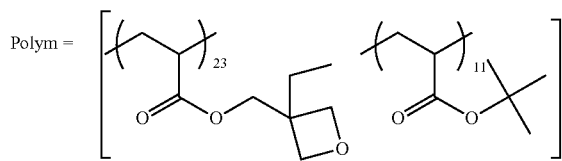
(A-9)
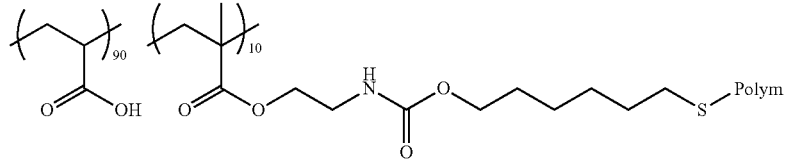

-continued
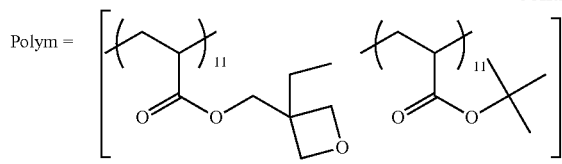
(A-10)
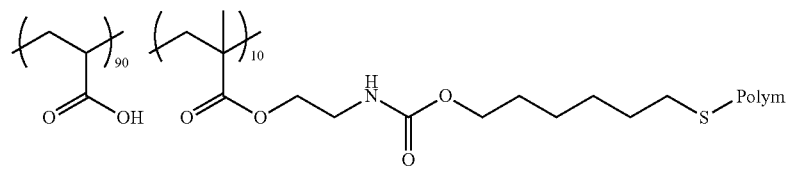
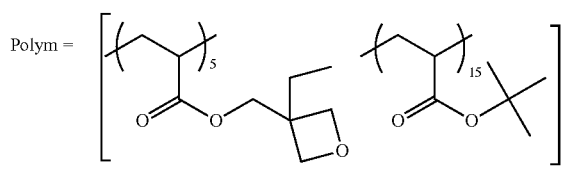
(A-11)
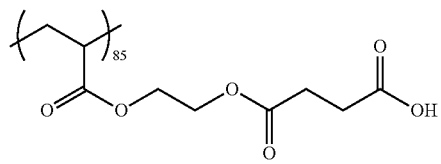
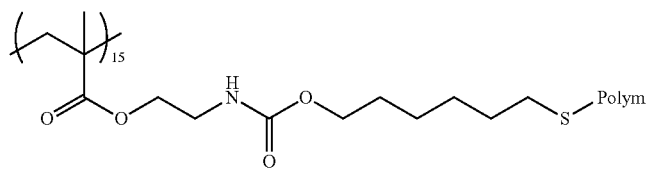
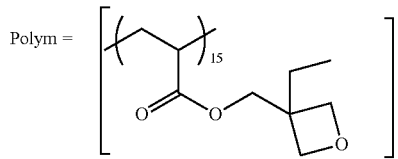
(A-12)
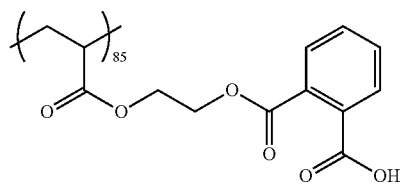
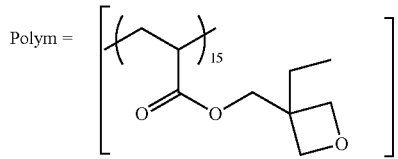
(A-13)
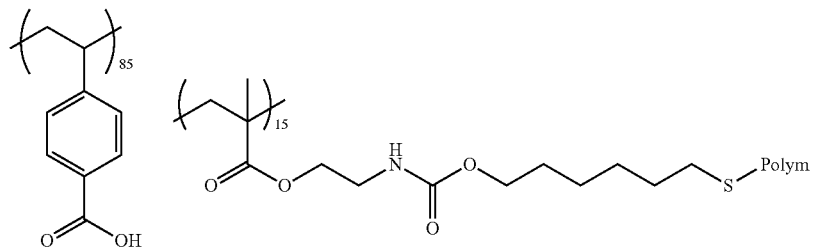

-continued
(A-14)
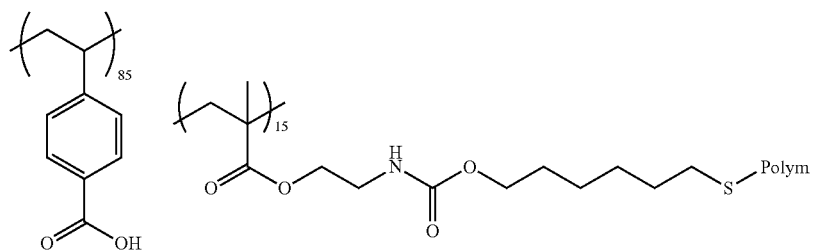
(A-15)
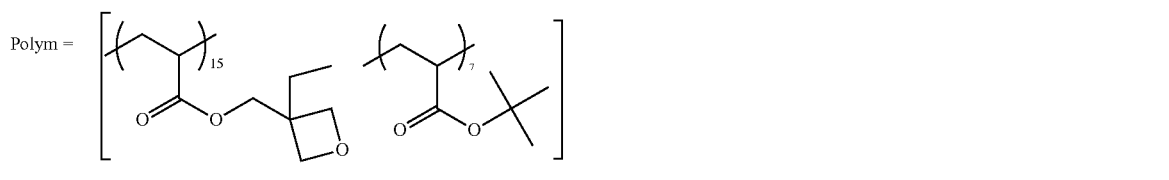
(A-16)
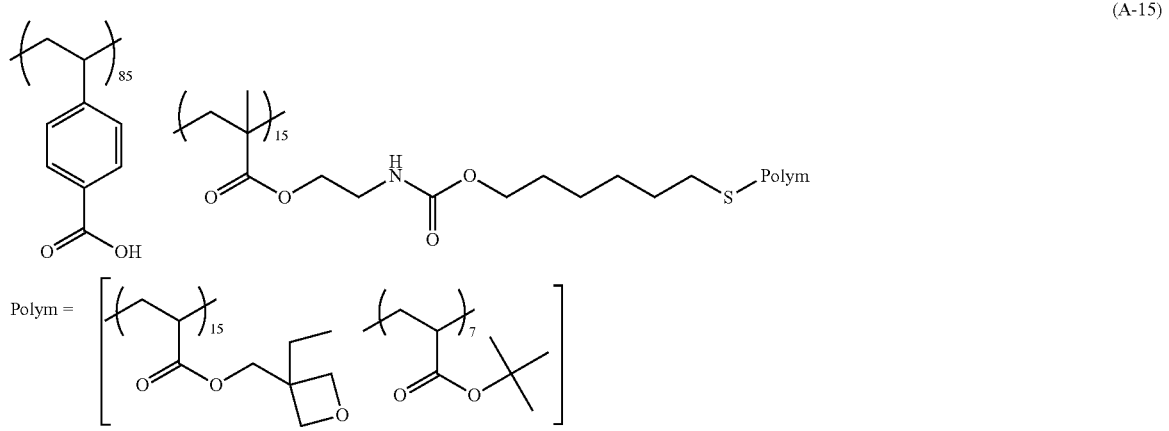
(A-17)
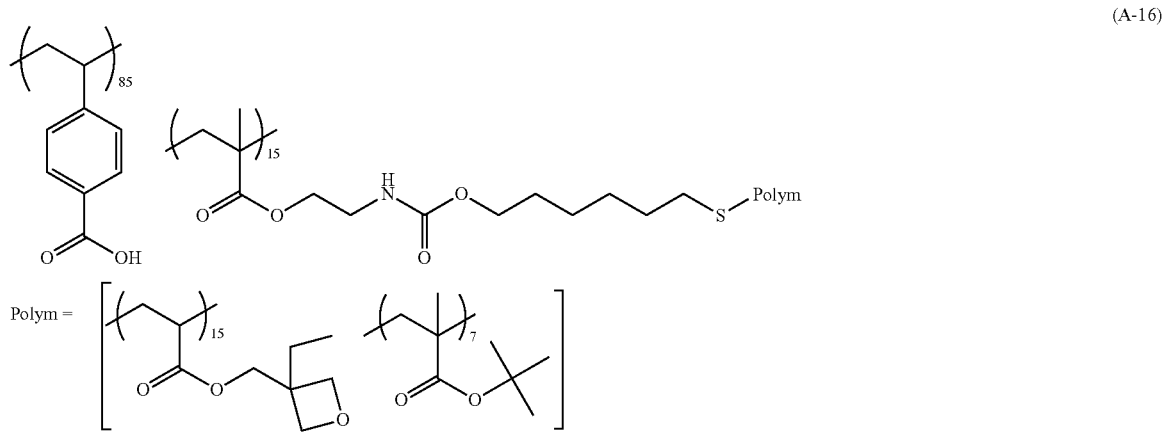
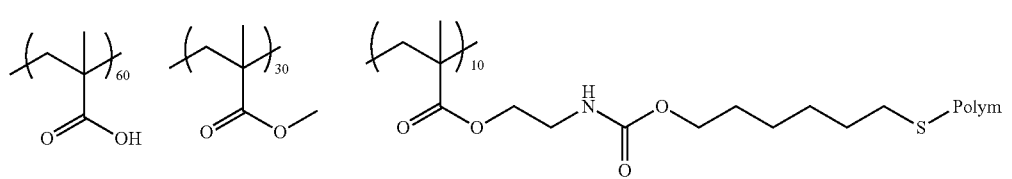

-continued
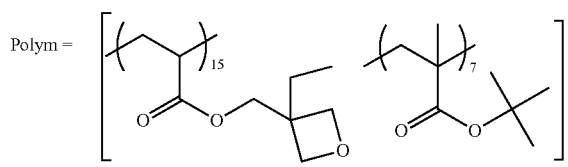
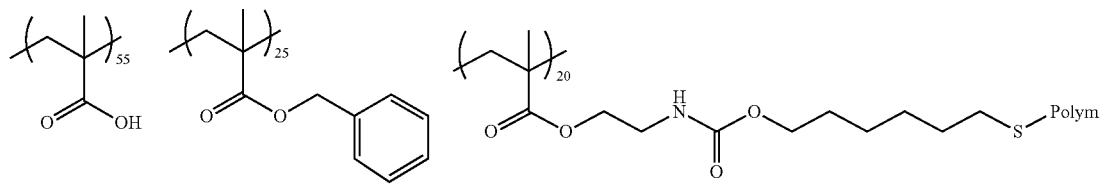
(A-18)
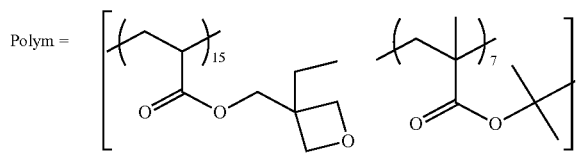
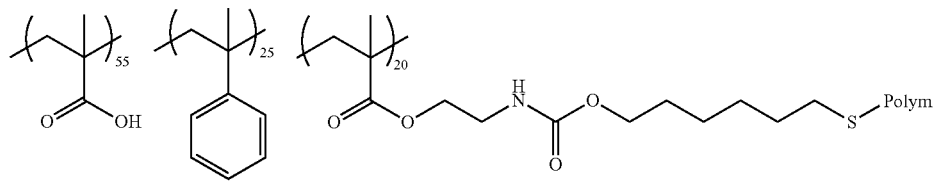
(A-19)
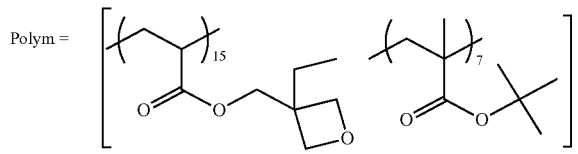
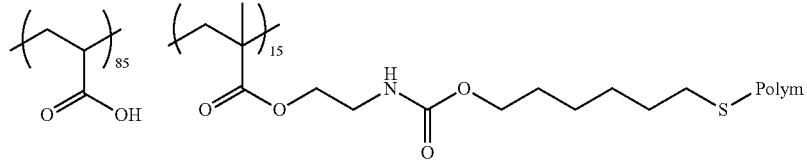
(A-20)
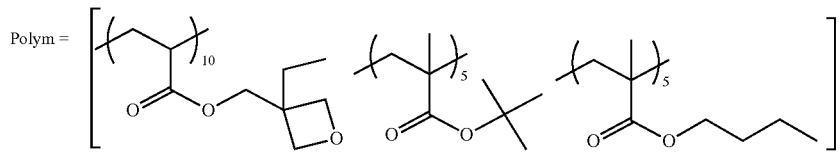
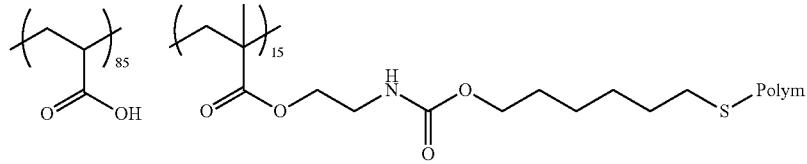
(A-21)
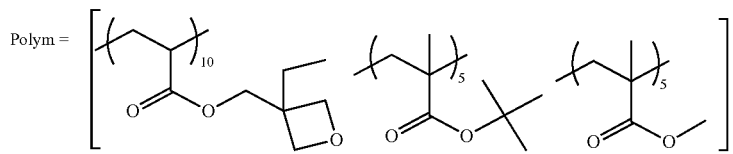

(A-22)
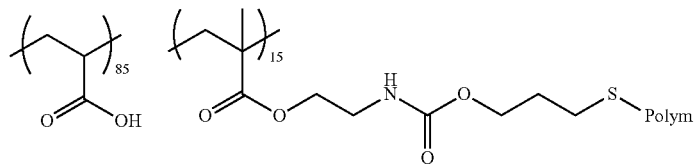
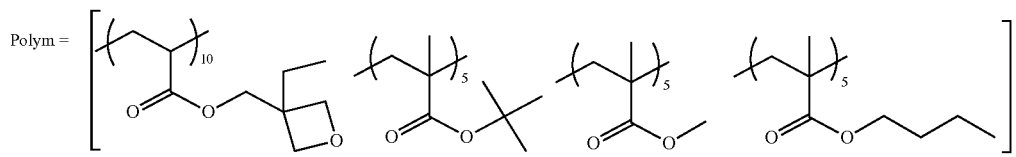
(A-23)
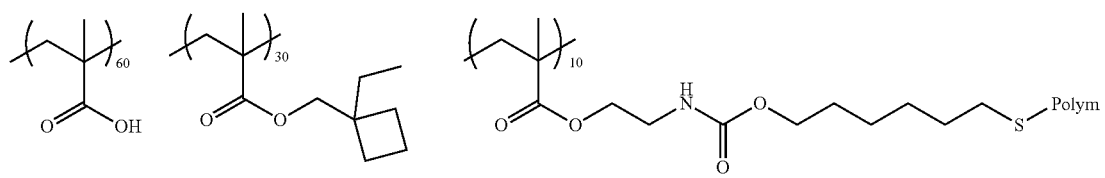
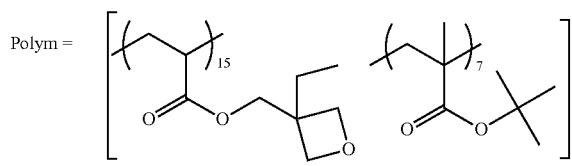
(A-24)
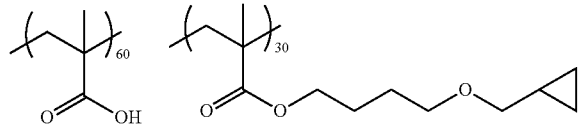
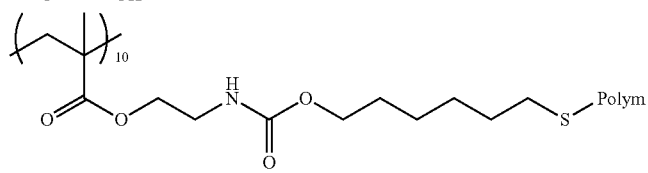
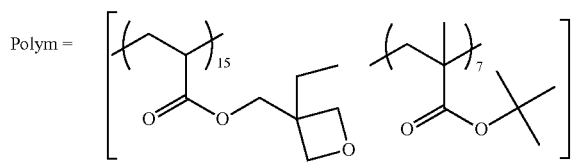
(A-25)
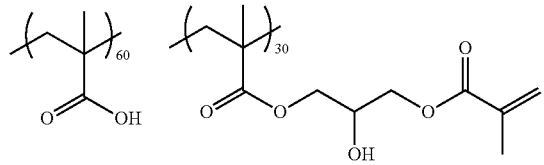
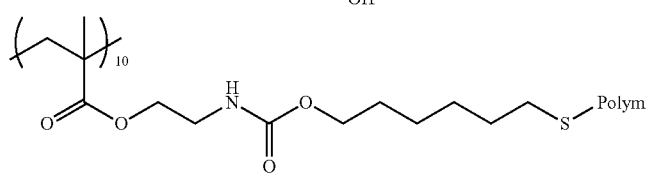
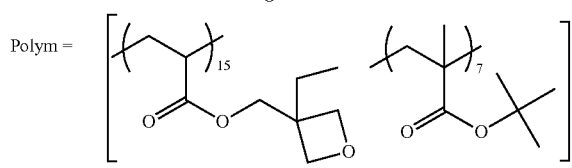

(A-26)
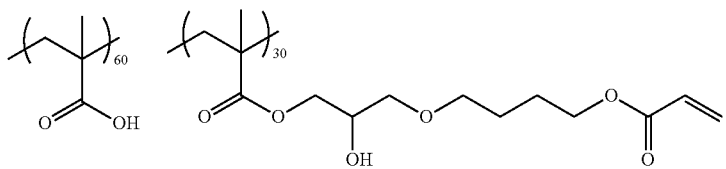
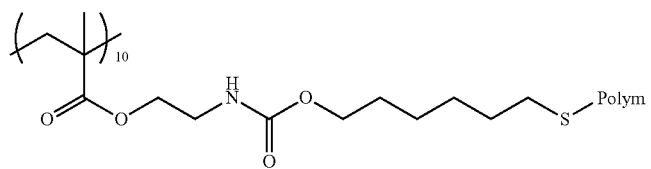
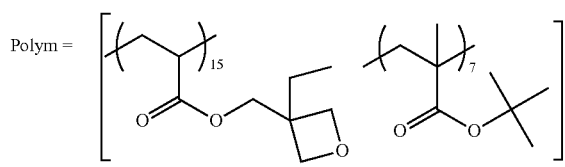
(A-27)
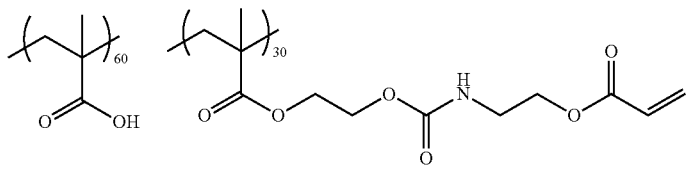
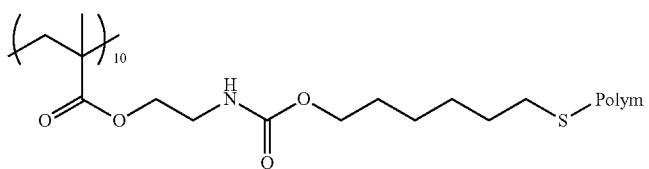
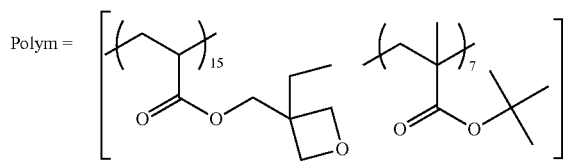
(A-28)
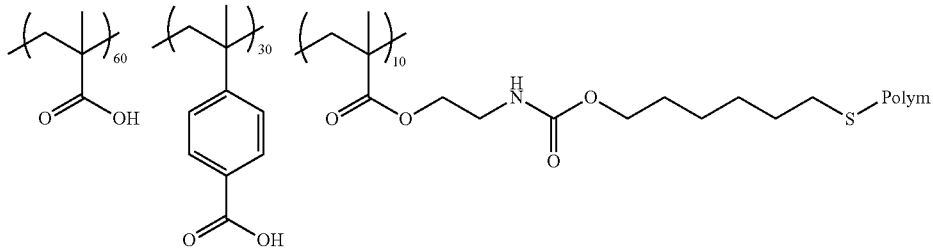
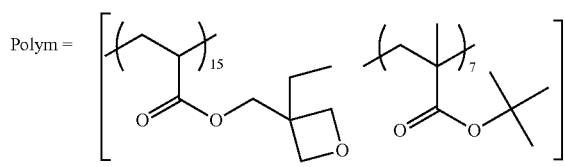

-continued
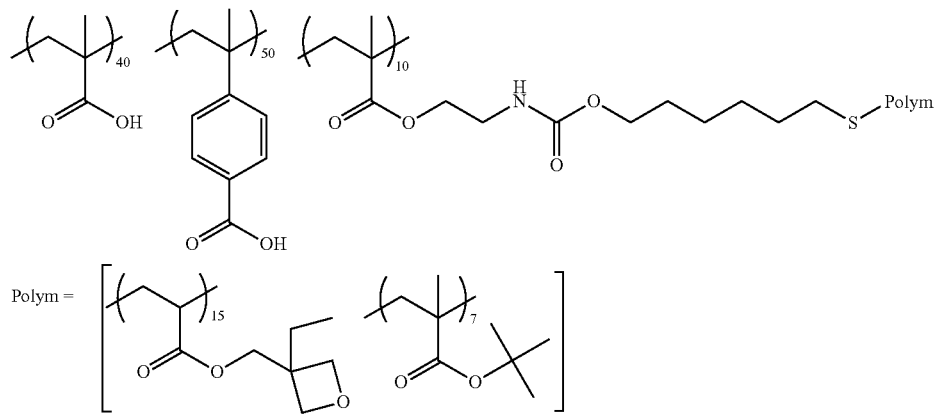
(A-29)
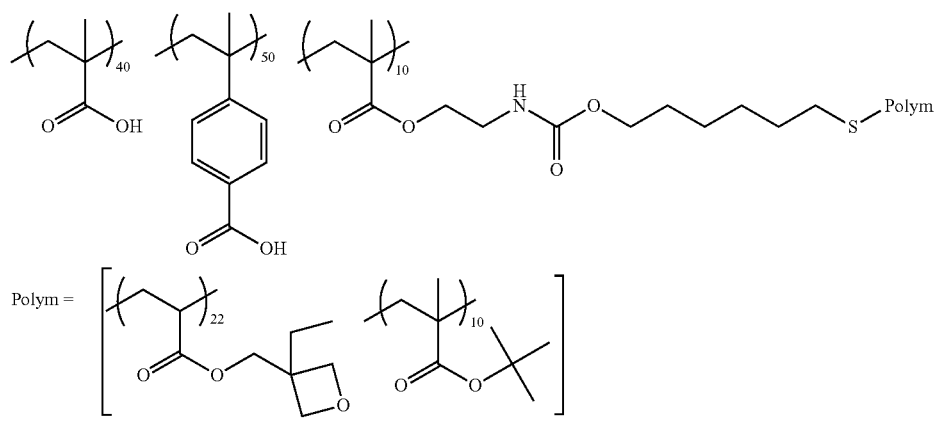
(A-30)
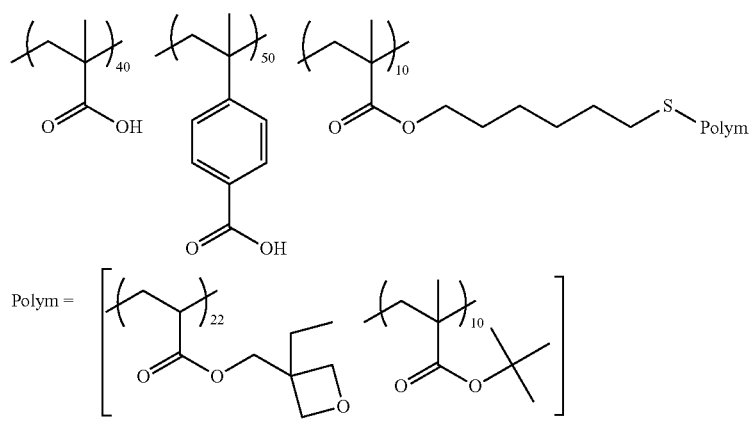
(A-31)
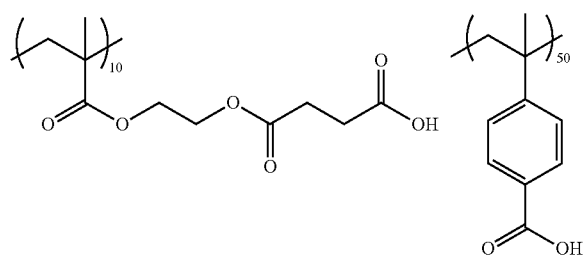
(A-32)

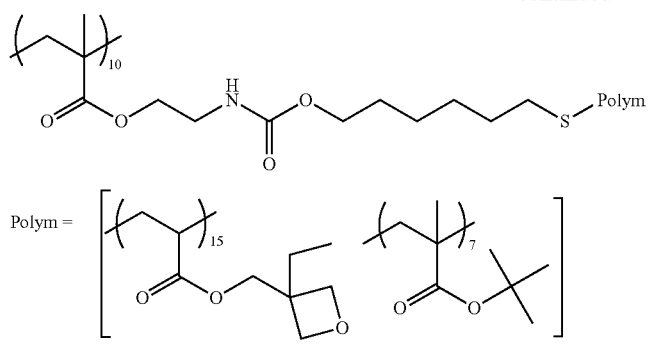
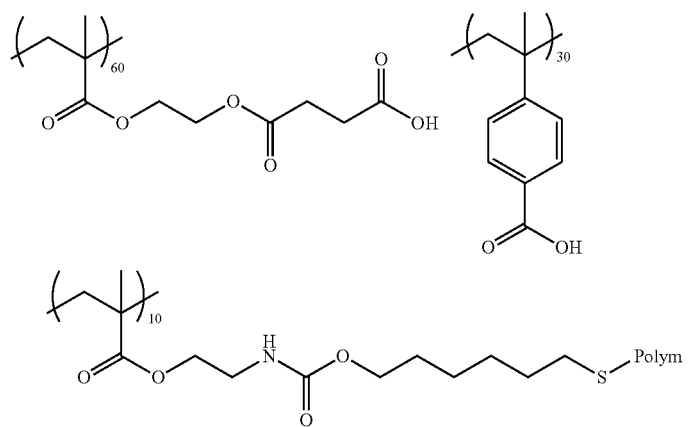
(A-33)
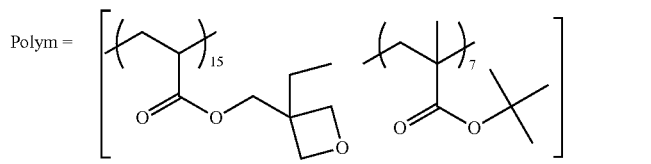
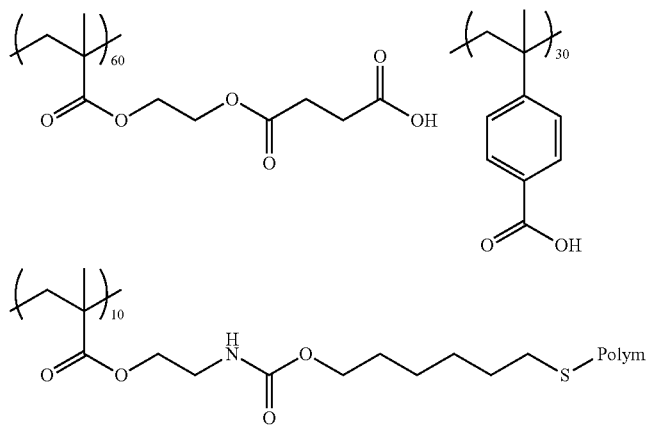
(A-34)
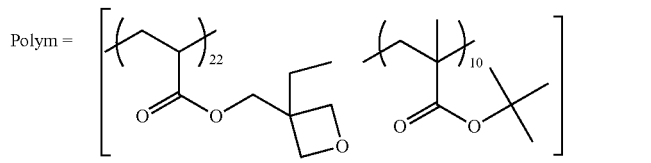

(A-35)
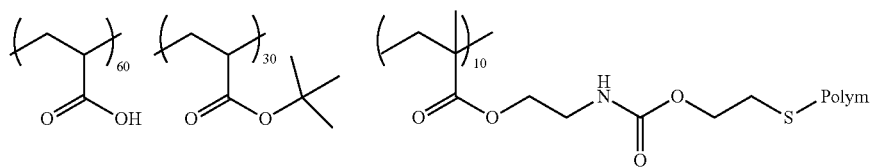
(A-36)
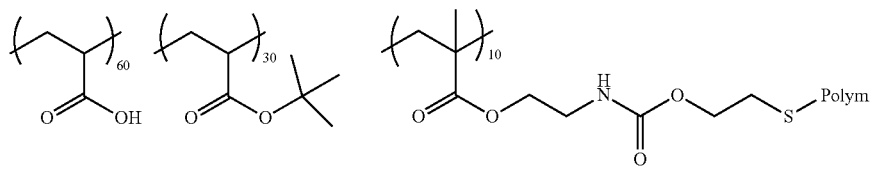
(A-37)
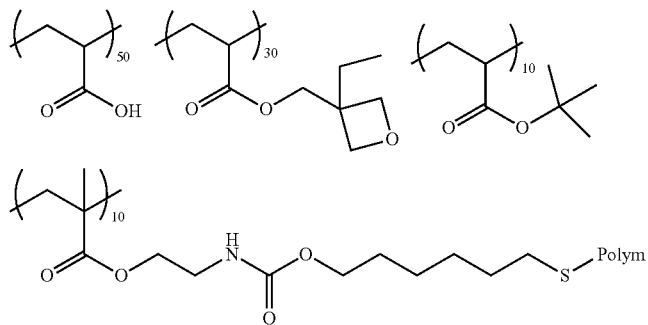
(A-38)
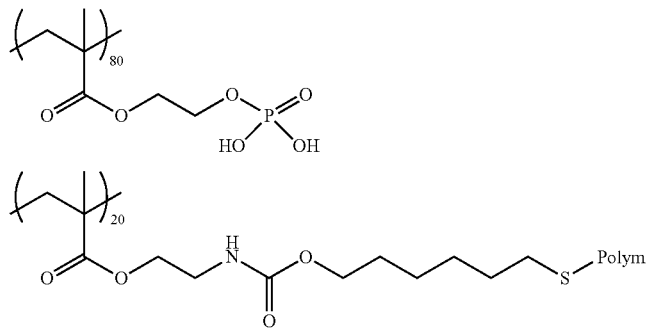

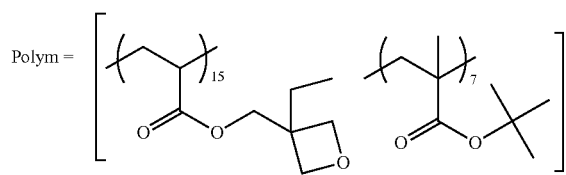
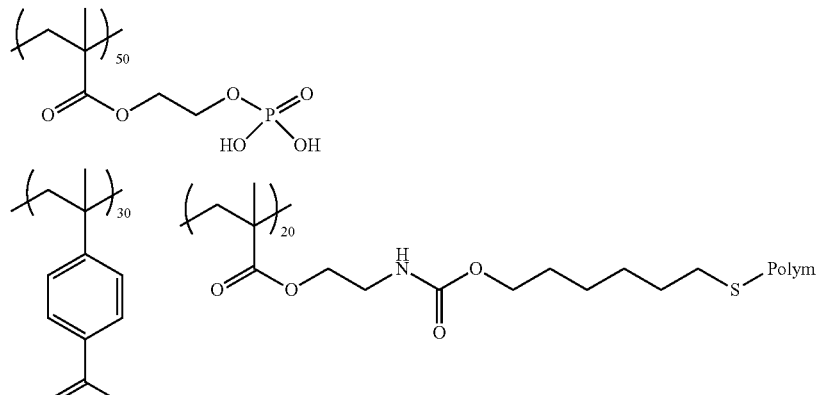
(A-39)
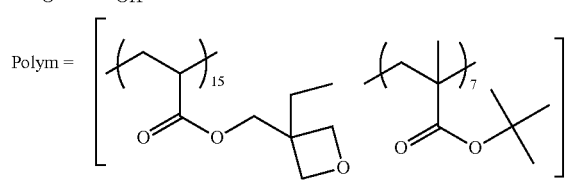
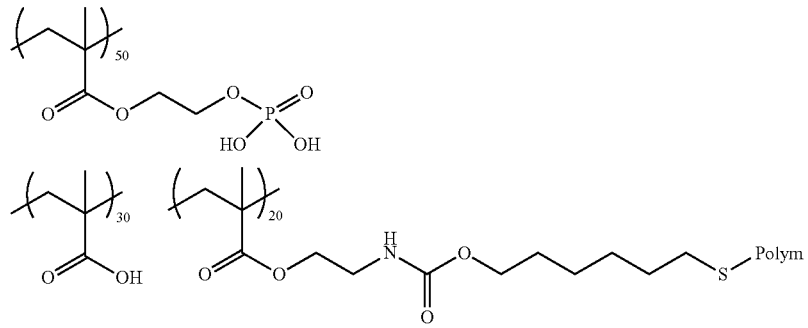
(A-40)
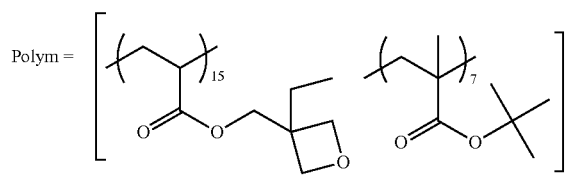
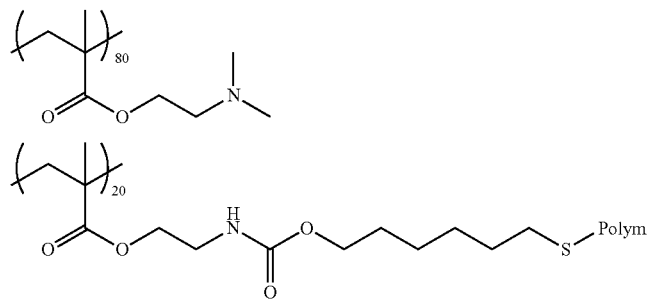
(A-41)

-continued
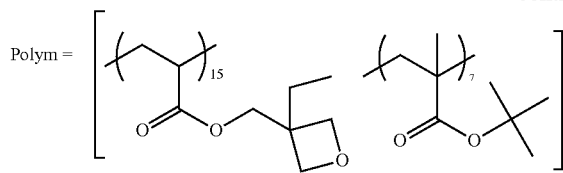
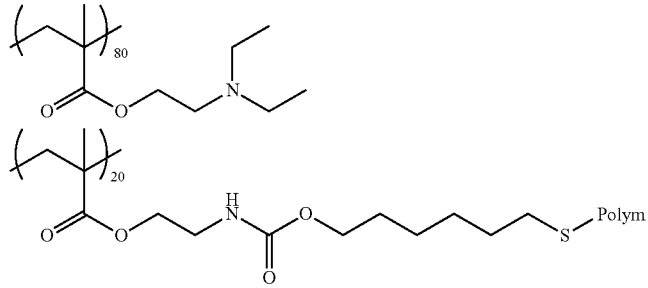
(A-42)
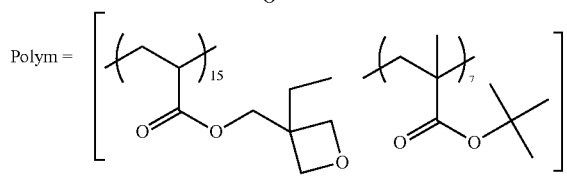
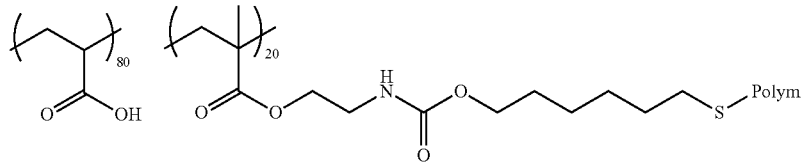
(A-43)
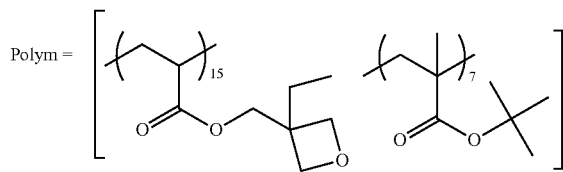
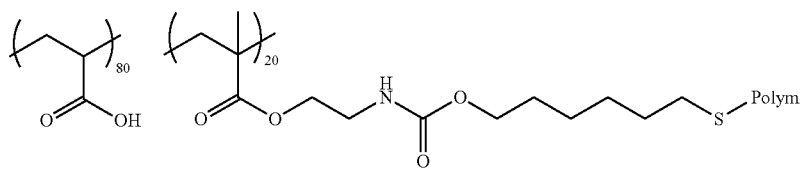
(A-44)
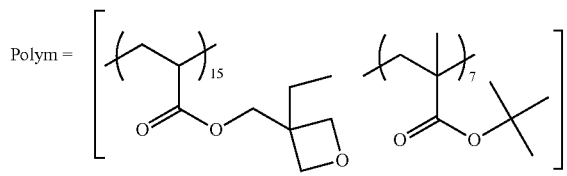
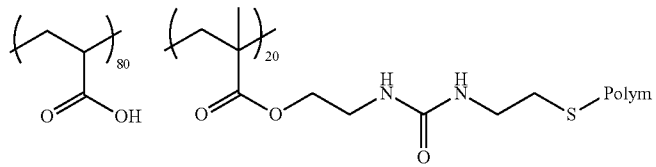
(A-45)

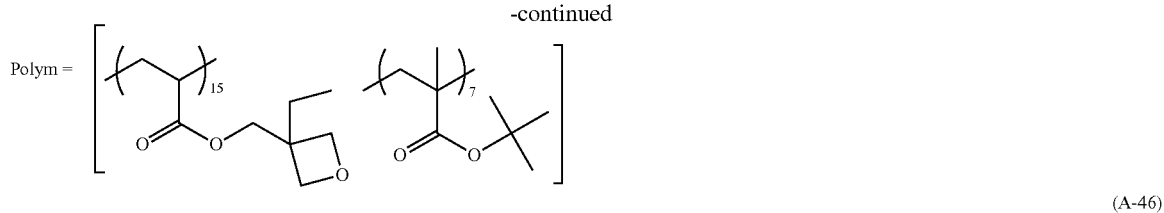

(A-46)

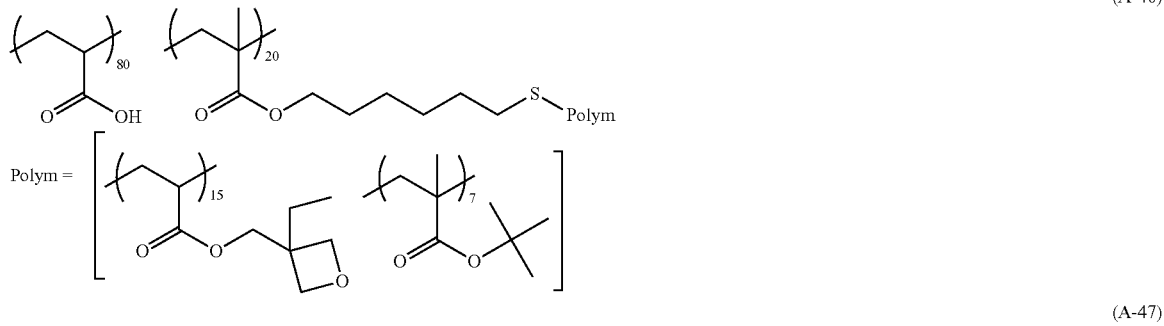

(A-47)

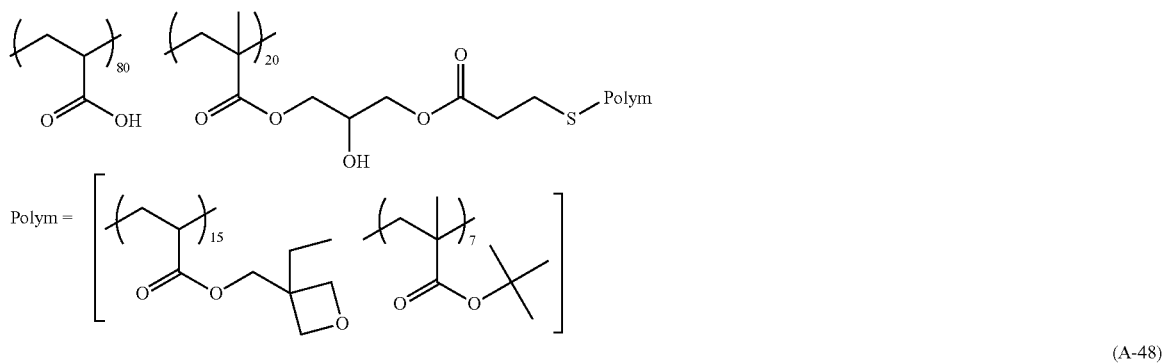

(A-48)

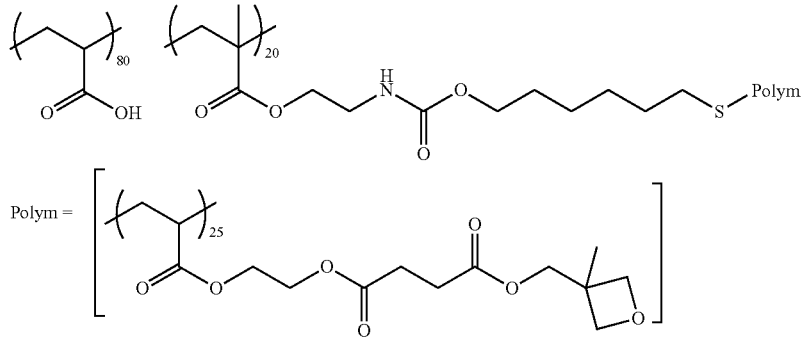

The tables below show each of the weight-average molecular weights (Mw) of macromonomers used in the synthesis of the resins A-1 to A-48, and the weight-average molecular weights (Mw), acid values, and oxetane ratios of the resins A-1 to A-48. The oxetane ratio refers to a mole fraction of repeating units having an oxetane group included in all repeating units of the resin.

TABLE 1

| | Mw of macromonomer | Mw of resin | Acid value of resin (mgKOH/g) | Oxetane ratio (mol %) |
|---|---|---|---|---|
| A-1 | 2800 | 30600 | 70 | 63 |
| A-2 | 2600 | 48900 | 90 | 53 |

TABLE 1-continued

| | Mw of macromonomer | Mw of resin | Acid value of resin (mgKOH/g) | Oxetane ratio (mol %) |
|---|---|---|---|---|
| A-3 | 2600 | 26700 | 88 | 53 |
| A-4 | 2600 | 33900 | 55 | 71 |
| A-5 | 2600 | 49100 | 87 | 34 |
| A-6 | 2600 | 39600 | 68 | 64 |
| A-7 | 3700 | 11800 | 80 | 63 |
| A-8 | 5500 | 18000 | 76 | 72 |
| A-9 | 3300 | 24300 | 79 | 55 |
| A-10 | 2900 | 48100 | 68 | 36 |
| A-11 | 2600 | 30100 | 65 | 73 |
| A-12 | 2600 | 36000 | 60 | 73 |
| A-13 | 2600 | 21000 | 59 | 73 |
| A-14 | 3600 | 37600 | 58 | 73 |

TABLE 1-continued

| | Mw of macromonomer | Mw of resin | Acid value of resin (mgKOH/g) | Oxetane ratio (mol %) |
|---|---|---|---|---|
| A-15 | 3600 | 41700 | 64 | 73 |
| A-16 | 3600 | 36300 | 50 | 73 |
| A-17 | 3600 | 42800 | 45 | 63 |
| A-18 | 3600 | 37100 | 53 | 79 |
| A-19 | 3600 | 35900 | 48 | 79 |
| A-20 | 3100 | 14300 | 65 | 64 |
| A-21 | 3100 | 29900 | 60 | 64 |
| A-22 | 3800 | 33100 | 62 | 64 |
| A-23 | 3600 | 35900 | 48 | 67 |
| A-24 | 3600 | 27300 | 56 | 63 |
| A-25 | 3600 | 26900 | 51 | 63 |
| A-26 | 3600 | 40100 | 50 | 63 |
| A-27 | 3600 | 44200 | 42 | 63 |
| A-28 | 3600 | 15600 | 61 | 63 |
| A-29 | 3600 | 23200 | 67 | 63 |
| A-30 | 5400 | 21300 | 78 | 71 |
| A-31 | 5400 | 17400 | 74 | 71 |
| A-32 | 3800 | 15300 | 76 | 63 |
| A-33 | 3800 | 19300 | 75 | 63 |
| A-34 | 3800 | 19800 | 77 | 63 |
| A-35 | 2700 | 43500 | 65 | 63 |
| A-36 | 3700 | 31500 | 60 | 63 |
| A-37 | 3700 | 20800 | 53 | 67 |
| A-38 | 3700 | 16500 | 55 | 63 |
| A-39 | 3700 | 41200 | 67 | 79 |
| A-40 | 3700 | 36400 | 64 | 79 |
| A-41 | 3700 | 18400 | 0 | 79 |
| A-42 | 3700 | 19500 | 0 | 79 |

TABLE 2

| | Mw of macromonomer | Mw of resin | Acid value of resin (mgKOH/g) | Oxetane ratio (mol %) |
|---|---|---|---|---|
| A-43 | 3600 | 25400 | 65 | 79 |
| A-44 | 3600 | 21200 | 63 | 79 |
| A-45 | 3600 | 19900 | 57 | 79 |
| A-46 | 3600 | 31500 | 59 | 79 |
| A-47 | 3600 | 29400 | 62 | 79 |
| A-48 | 5200 | 33400 | 50 | 73 |

<Production of Dispersion Liquid>

A mixed solution obtained by mixing raw materials listed in the table below was mixed and dispersed for 3 hours by a beads mill (using 0.3 mm diameter zirconia beads), and then subjected to a dispersion treatment under a pressure of 2000 MPa at a flow rate of 500 g/min using a high-pressure disperser equipped with a pressure-reducing system NANO-3000-10 (manufactured by Nippon BEE Chemical Co., Ltd.). The dispersion treatment was repeated 10 times to obtain each dispersion liquid.

TABLE 3

| | Coloring material | | | | | Pigment derivative | | Resin (dispersant) | | | |
|---|---|---|---|---|---|---|---|---|---|---|---|
| | PR264 | PR254 | PR291 | PO71 | PY215 | Derivative 1 | Derivative 2 | A-1 | A-2 | A-3 | A-4 |
| Dispersion liquid R1 | 20.8 | — | — | — | — | 5.2 | — | 9.2 | — | — | — |
| Dispersion liquid R2 | — | 24.2 | — | — | — | — | 5.6 | 9.8 | — | — | — |
| Dispersion liquid R3 | 11.6 | 10.6 | — | — | — | — | 4.6 | 11.2 | — | — | — |
| Dispersion liquid R4 | 20.8 | — | — | — | — | 5.2 | — | — | 9.2 | — | — |
| Dispersion liquid R5 | 20.8 | — | — | — | — | 5.2 | — | — | — | 9.2 | — |
| Dispersion liquid R6 | 20.8 | — | — | — | — | 5.2 | — | — | — | — | 9.2 |
| Dispersion liquid R7 | 20.8 | — | — | — | — | 5.2 | — | — | — | — | — |
| Dispersion liquid R8 | 20.8 | — | — | — | — | 5.2 | — | — | — | — | — |
| Dispersion liquid R9 | 20.8 | — | — | — | — | 5.2 | — | — | — | — | — |
| Dispersion liquid R10 | 20.8 | — | — | — | — | 5.2 | — | — | — | — | — |
| Dispersion liquid R11 | 20.8 | — | — | — | — | 5.2 | — | — | — | — | — |
| Dispersion liquid R12 | 20.8 | — | — | — | — | 5.2 | — | — | — | — | — |
| Dispersion liquid R13 | — | — | 24.2 | — | — | — | 5.6 | 9.8 | — | — | — |
| Dispersion liquid R14 | 10.4 | — | — | 10.4 | — | — | 5.6 | 9.8 | — | — | — |
| Dispersion liquid R15 | 10.4 | — | — | 5.2 | 5.2 | — | 5.6 | 9.8 | — | — | — |
| Dispersion liquid CR1 | 20.8 | — | — | — | — | 5.2 | — | — | — | — | — |

| | Resin (dispersant) | | | | | | Comparative resin | Solvent | | |
|---|---|---|---|---|---|---|---|---|---|---|
| | A-5 | A-6 | A-7 | A-8 | A-9 | A-10 | CA-1 | S-1 | S-2 | S-3 |
| Dispersion liquid R1 | — | — | — | — | — | — | — | 64.8 | — | — |
| Dispersion liquid R2 | — | — | — | — | — | — | — | 55.6 | — | 4.8 |
| Dispersion liquid R3 | — | — | — | — | — | — | — | — | 62.0 | — |
| Dispersion liquid R4 | — | — | — | — | — | — | — | 64.8 | — | — |
| Dispersion liquid R5 | — | — | — | — | — | — | — | 64.8 | — | — |
| Dispersion liquid R6 | — | — | — | — | — | — | — | 64.8 | — | — |
| Dispersion liquid R7 | 9.2 | — | — | — | — | — | — | 64.8 | — | — |
| Dispersion liquid R8 | — | 9.2 | — | — | — | — | — | 64.8 | — | — |
| Dispersion liquid R9 | — | — | 9.2 | — | — | — | — | 64.8 | — | — |
| Dispersion liquid R10 | — | — | — | 9.2 | — | — | — | 64.8 | — | — |
| Dispersion liquid R11 | — | — | — | — | 9.2 | — | — | 64.8 | — | — |
| Dispersion liquid R12 | — | — | — | — | — | 9.2 | — | 64.8 | — | — |
| Dispersion liquid R13 | — | — | — | — | — | — | — | 55.6 | — | 4.8 |
| Dispersion liquid R14 | — | — | — | — | — | — | — | 55.6 | — | 4.8 |

TABLE 3-continued

|  | | | | | | | | | | |
|---|---|---|---|---|---|---|---|---|---|---|
| Dispersion liquid R15 | — | — | — | — | — | — | — | — | 55.6 | — | 4.8 |
| Dispersion liquid CR1 | — | — | — | — | — | — | 9.2 | 64.8 | — | — |

TABLE 4

| | Coloring material | | | Pigment derivative | | Resin (dispersant) | | | | |
|---|---|---|---|---|---|---|---|---|---|---|
| | PB15:6 | PB16 | PR122 | Derivative 1 | Derivative 2 | A-11 | A-12 | A-13 | A-14 | A-15 |
| Dispersion liquid B1 | 22.6 | — | — | — | 5.0 | 9.8 | — | — | — | — |
| Dispersion liquid B2 | — | 22.3 | — | — | 4.2 | — | 10.3 | — | — | — |
| Dispersion liquid B3 | 5.4 | 22.4 | — | — | 5.6 | — | — | 10.5 | — | — |
| Dispersion liquid B4 | — | 22.3 | — | — | 4.2 | 10.3 | — | — | — | — |
| Dispersion liquid B5 | — | 22.3 | — | — | 4.2 | — | — | 10.3 | — | — |
| Dispersion liquid B6 | — | 22.3 | — | — | 4.2 | — | — | — | 10.3 | — |
| Dispersion liquid B7 | — | 22.3 | — | — | 4.2 | — | — | — | — | 10.3 |
| Dispersion liquid B8 | — | 22.3 | — | — | 4.2 | — | — | — | — | — |
| Dispersion liquid B9 | — | 22.3 | — | — | 4.2 | — | — | — | — | — |
| Dispersion liquid B10 | — | 22.3 | — | — | 4.2 | — | — | — | — | — |
| Dispersion liquid B11 | — | 22.3 | — | — | 4.2 | — | — | — | — | — |
| Dispersion liquid B12 | — | 22.3 | — | — | 4.2 | — | — | — | — | — |
| Dispersion liquid B13 | — | 11.3 | 11.3 | — | 4.2 | 9.8 | — | — | — | — |
| Dispersion liquid CB1 | — | 22.3 | — | — | 4.2 | — | — | — | — | — |

| | Resin (dispersant) | | | | | Comparative resin | Solvent | | |
|---|---|---|---|---|---|---|---|---|---|
| | A-16 | A-17 | A-18 | A-19 | A-20 | CA-1 | S-1 | S-2 | S-3 |
| Dispersion liquid B1 | — | — | — | — | — | — | 2.6 | 2.6 | 57.4 |
| Dispersion liquid B2 | — | — | — | — | — | — | 20.1 | — | 43.1 |
| Dispersion liquid B3 | — | — | — | — | — | — | 52.9 | — | 3.2 |
| Dispersion liquid B4 | — | — | — | — | — | — | 20.1 | — | 43.1 |
| Dispersion liquid B5 | — | — | — | — | — | — | 20.1 | — | 43.1 |
| Dispersion liquid B6 | — | — | — | — | — | — | 20.1 | — | 43.1 |
| Dispersion liquid B7 | — | — | — | — | — | — | 20.1 | — | 43.1 |
| Dispersion liquid B8 | 10.3 | — | — | — | — | — | 20.1 | — | 43.1 |
| Dispersion liquid B9 | — | 10.3 | — | — | — | — | 20.1 | — | 43.1 |
| Dispersion liquid B10 | — | — | 10.3 | — | — | — | 20.1 | — | 43.1 |
| Dispersion liquid B11 | — | — | — | 10.3 | — | — | 20.1 | — | 43.1 |
| Dispersion liquid B12 | — | — | — | — | 10.3 | — | 20.1 | — | 43.1 |
| Dispersion liquid B13 | — | — | — | — | — | — | 2.6 | 2.6 | 57.4 |
| Dispersion liquid CB1 | — | — | — | — | — | 10.3 | 20.1 | — | 43.1 |

TABLE 5

| | Coloring material | | | | | Pigment derivative | Resin (dispersant) | | | |
|---|---|---|---|---|---|---|---|---|---|---|
| | PB7 | PG36 | PG58 | PY185 | PY215 | Derivative 2 | A-21 | A-22 | A-23 | A-24 |
| Dispersion liquid G1 | 12.3 | — | — | — | | 2.5 | 2.5 | — | — | 2.3 |
| Dispersion liquid G2 | — | 11.9 | — | 2.5 | | 2.3 | — | 2.8 | — | — |
| Dispersion liquid G3 | 10.1 | — | 2.0 | 2.5 | | 2.6 | — | — | 5.3 | — |
| Dispersion liquid G4 | — | — | 10.2 | — | 3.0 | 2.3 | 7.6 | — | — | — |
| Dispersion liquid G5 | — | — | 10.2 | — | 3.0 | 2.3 | — | 7.6 | — | — |
| Dispersion liquid G6 | — | — | 10.2 | — | 3.0 | 2.3 | — | — | 7.6 | — |
| Dispersion liquid G7 | — | — | 10.2 | — | 3.0 | 2.3 | — | — | — | 7.6 |
| Dispersion liquid G8 | — | — | 10.2 | — | 3.0 | 2.3 | — | — | — | — |
| Dispersion liquid G9 | — | — | 10.2 | — | 3.0 | 2.3 | — | — | — | — |
| Dispersion liquid G10 | — | — | 10.2 | — | 3.0 | 2.3 | — | — | — | — |
| Dispersion liquid G11 | — | — | 10.2 | — | 3.0 | 2.3 | — | — | — | — |
| Dispersion liquid G12 | — | — | 10.2 | — | 3.0 | 2.3 | — | — | — | — |
| Dispersion liquid G13 | — | — | 10.2 | — | 3.0 | 2.3 | — | — | — | — |
| Dispersion liquid CG1 | — | — | 10.2 | — | 3.0 | 2.3 | — | — | — | — |

TABLE 5-continued

| | Resin (dispersant) | | | | | | Comparative resin | Solvent |
| | A-25 | A-26 | A-27 | A-28 | A-29 | A-30 | CA-1 | S-1 |
|---|---|---|---|---|---|---|---|---|
| Dispersion liquid G1 | — | — | — | — | — | — | — | 80.4 |
| Dispersion liquid G2 | — | — | 1.1 | — | — | — | — | 79.4 |
| Dispersion liquid G3 | — | — | — | — | — | — | — | 77.5 |
| Dispersion liquid G4 | — | — | — | — | — | — | — | 76.9 |
| Dispersion liquid G5 | — | — | — | — | — | — | — | 76.9 |
| Dispersion liquid G6 | — | — | — | — | — | — | — | 76.9 |
| Dispersion liquid G7 | — | — | — | — | — | — | — | 76.9 |
| Dispersion liquid G8 | 7.6 | — | — | — | — | — | — | 76.9 |
| Dispersion liquid G9 | — | 7.6 | — | — | — | — | — | 76.9 |
| Dispersion liquid G10 | — | — | 7.6 | — | — | — | — | 76.9 |
| Dispersion liquid G11 | — | — | — | 7.6 | — | — | — | 76.9 |
| Dispersion liquid G12 | — | — | — | — | 7.6 | — | — | 76.9 |
| Dispersion liquid G13 | — | — | — | — | — | 7.6 | — | 76.9 |
| Dispersion liquid CG1 | — | — | — | — | — | — | 7.6 | 76.9 |

TABLE 6

| | Coloring material IR coloring agent | Pigment derivative Derivative 3 | Resin (dispersant) | | | | | | | Comparative resin CA-1 | Solvent S-1 |
| | | | A-31 | A-32 | A-33 | A-34 | A-35 | A-36 | A-37 | | |
|---|---|---|---|---|---|---|---|---|---|---|---|
| Dispersion liquid I1 | 24.3 | 7.2 | 5.5 | — | — | — | — | — | — | — | 63.0 |
| Dispersion liquid I2 | 24.3 | 7.2 | — | 5.5 | — | — | — | — | — | — | 63.0 |
| Dispersion liquid I3 | 24.3 | 7.2 | — | — | 5.5 | — | — | — | — | — | 63.0 |
| Dispersion liquid I4 | 24.3 | 7.2 | — | — | — | 5.5 | — | — | — | — | 63.0 |
| Dispersion liquid I5 | 24.3 | 7.2 | — | — | — | — | 5.5 | 2.2 | — | — | 60.8 |
| Dispersion liquid I6 | 24.3 | 7.2 | — | — | — | — | — | — | 5.5 | — | 63.0 |
| Dispersion liquid CI1 | 24.3 | 7.2 | — | — | — | — | — | — | — | 5.5 | 63.0 |

TABLE 7

| | Coloring material | | | | | | | Pigment derivative | | Resin (dispersant) | | |
| | PR264 | PR179 | PB15:6 | PB16 | PY215 | PV23 | IRGAPHORE | PBk32 | Derivative 1 | Derivative 2 | A-1 | A-6 | A-11 |
|---|---|---|---|---|---|---|---|---|---|---|---|---|---|
| Dispersion liquid Bk1 | 6.8 | — | — | 4.4 | 1.0 | — | — | — | 1.2 | — | 6.5 | — | — |
| Dispersion liquid Bk2 | — | 9.9 | — | 1.3 | — | — | — | — | — | 1.5 | — | 4.5 | — |
| Dispersion liquid Bk3 | 6.8 | — | — | 4.4 | 1.0 | — | — | — | 1.2 | — | — | — | 6.5 |
| Dispersion liquid Bk4 | — | — | 12.4 | — | — | — | — | — | 1.2 | — | 2.0 | — | — |
| Dispersion liquid Bk5 | — | — | — | 6.3 | — | — | 6.3 | — | — | 2.1 | 2.0 | — | — |
| Dispersion liquid Bk6 | — | — | 3.1 | — | — | — | 3.1 | 3.1 | — | 2.1 | 2.0 | — | — |
| Dispersion liquid Bk7 | — | — | 4.2 | — | — | 4.2 | — | — | 1.0 | 1.0 | 2.0 | — | — |
| Dispersion liquid Bk8 | 6.8 | — | — | 4.4 | 1.0 | — | — | — | 2.3 | — | 2.0 | — | — |
| Dispersion liquid Bk9 | — | 9.9 | — | 1.3 | — | — | — | — | — | 1.5 | 2.0 | — | — |
| Dispersion liquid Bk10 | 6.8 | — | — | 4.4 | 1.0 | — | — | — | 1.2 | — | — | 6.5 | — |
| Dispersion liquid Bk11 | 6.8 | — | — | 4.4 | 1.0 | — | — | — | 1.2 | — | — | — | 6.5 |
| Dispersion liquid Bk12 | 6.8 | — | — | 4.4 | 1.0 | — | — | — | 1.2 | 0.3 | — | — | — |
| Dispersion liquid Bk13 | 6.8 | — | — | 4.4 | 1.0 | — | — | — | 1.2 | 0.3 | — | — | — |
| Dispersion liquid Bk14 | 6.8 | — | — | 4.4 | 1.0 | — | — | — | 1.2 | 0.3 | — | — | — |
| Dispersion liquid Bk15 | 6.8 | — | — | 4.4 | 1.0 | — | — | — | 1.2 | — | — | — | — |
| Dispersion liquid Bk16 | 6.8 | — | — | 4.4 | 1.0 | — | — | — | 1.2 | 0.3 | — | — | — |
| Dispersion liquid Bk17 | 6.8 | — | — | 4.4 | 1.0 | — | — | — | 1.2 | — | — | — | — |
| Dispersion liquid Bk18 | 6.8 | — | — | 4.4 | 1.0 | — | — | — | 1.2 | — | — | — | — |
| Dispersion liquid Bk19 | 6.8 | — | — | 4.4 | 1.0 | — | — | — | 1.2 | 0.2 | — | — | — |
| Dispersion liquid Bk20 | 6.8 | — | — | 4.4 | 1.0 | — | — | — | 1.2 | 0.2 | — | — | — |
| Dispersion liquid CBk1 | 6.8 | — | — | 4.4 | 1.0 | — | — | — | — | — | — | — | — |
| Dispersion liquid CBk2 | — | 9.9 | — | 1.3 | — | — | — | — | — | 1.5 | — | — | — |
| Dispersion liquid CBk3 | — | — | — | 6.3 | — | — | 6.3 | — | — | 2.1 | — | — | — |

TABLE 7-continued

|  | Resin (dispersant) | | | | | | | | | Comparative resin | Solvent | | |
| --- | --- | --- | --- | --- | --- | --- | --- | --- | --- | --- | --- | --- | --- |
|  | A-14 | A-24 | A-26 | A-29 | A-38 | A-39 | A-40 | A-41 | A-42 | CA-1 | S-1 | S-2 | S-3 |
| Dispersion liquid Bk1 | — | — | — | — | — | — | — | — | — | — | 62.4 | — | 17.7 |
| Dispersion liquid Bk2 | — | — | — | — | — | — | — | — | — | — | 62.6 | 20.2 | — |
| Dispersion liquid Bk3 | — | — | — | — | — | — | — | — | — | — | 62.4 | 17.7 | — |
| Dispersion liquid Bk4 | 3.2 | — | — | — | — | — | — | — | — | — | 62.2 | 9.7 | 9.3 |
| Dispersion liquid Bk5 | — | 3.2 | — | — | — | — | — | — | — | — | 62.2 | 17.9 | — |
| Dispersion liquid Bk6 | — | — | 3.2 | — | — | — | — | — | — | — | 64.8 | 18.6 | — |
| Dispersion liquid Bk7 | — | — | — | 2.5 | — | — | — | — | — | — | 64.0 | 21.1 | — |
| Dispersion liquid Bk8 | — | — | — | — | 2.2 | — | — | — | — | — | 62.4 | 18.9 | — |
| Dispersion liquid Bk9 | — | — | — | — | — | 2.2 | — | — | — | — | 62.6 | 20.5 | — |
| Dispersion liquid Bk10 | — | — | — | — | — | — | — | — | — | — | 62.4 | — | 17.7 |
| Dispersion liquid Bk11 | — | — | — | — | — | — | — | — | — | — | 62.4 | — | 17.7 |
| Dispersion liquid Bk12 | 6.5 | — | — | — | — | — | — | — | — | — | 60.8 | — | 19.0 |
| Dispersion liquid Bk13 | — | 6.5 | — | — | — | — | — | — | — | — | 60.8 | — | 19.0 |
| Dispersion liquid Bk14 | — | — | 6.5 | — | — | — | — | — | — | — | 61.6 | — | 18.2 |
| Dispersion liquid Bk15 | — | — | — | 6.5 | — | — | — | — | — | — | 62.4 | — | 17.7 |
| Dispersion liquid Bk16 | — | — | — | — | 6.5 | — | — | — | — | — | 60.5 | — | 19.3 |
| Dispersion liquid Bk17 | — | — | — | — | — | 6.5 | — | — | — | — | 62.4 | — | 17.7 |
| Dispersion liquid Bk18 | — | — | — | — | — | — | 6.5 | — | — | — | 62.4 | — | 17.7 |
| Dispersion liquid Bk19 | — | — | — | — | — | — | — | 6.5 | — | — | 60.8 | — | 19.1 |
| Dispersion liquid Bk20 | — | — | — | — | — | — | — | — | 6.5 | — | 60.8 | — | 19.1 |
| Dispersion liquid CBk1 | — | — | — | — | — | — | — | — | — | 6.5 | 64.1 | — | 17.2 |
| Dispersion liquid CBk2 | — | — | — | — | — | — | — | — | — | 6.5 | 62.6 | — | 18.2 |
| Dispersion liquid CBk3 | — | — | — | — | — | — | — | — | — | 6.5 | 62.2 | — | 16.6 |

The unit of numerical values shown in the above tables is part by mass. Among the raw materials shown in the above tables, details of the raw materials shown by abbreviations are as follows.

[Coloring Material]

PR264: C. I. Pigment Red 264 (red pigment, diketopyrrolopyrrole pigment)

PR254: C. I. Pigment Red 254 (red pigment, diketopyrrolopyrrole pigment)

PR291: C. I. Pigment Red 291 (red pigment, diketopyrrolopyrrole pigment)

PR122: C. I. Pigment Red 122 (red pigment, quinacridone pigment)

PR179: C. I. Pigment Red 179 (red pigment, perylene pigment)

PO71: C. I. Pigment Orange 71 (orange pigment, diketopyrrolopyrrole pigment)

PB15:6: C. I. Pigment Blue 15:6 (blue pigment, phthalocyanine pigment)

PB16: C. I. Pigment Blue 16 (blue pigment, phthalocyanine pigment)

PG7: C. I. Pigment Green 7 (green pigment, phthalocyanine pigment)

PG36: C. I. Pigment Green 36 (green pigment, phthalocyanine pigment)

PG58: C. I. Pigment Green 58 (green pigment, phthalocyanine pigment)

PY185: C. I. Pigment Yellow 185 (yellow pigment, isoindoline pigment)

PY215: C. I. Pigment Yellow 215 (yellow pigment, pteridin pigment)

PV23: C. I. Pigment Violet 23 (violet pigment, dioxazine pigment)

IR coloring agent: compound having the following structure (near-infrared absorbing pigment, in the following structural formula, Me represents a methyl group and Ph represents a phenyl group)

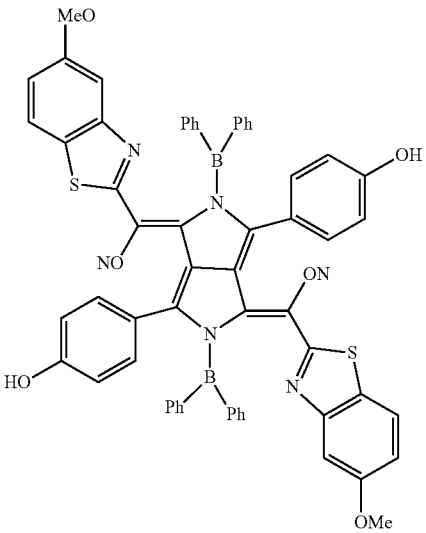

IRGAPHORE: Irgaphor Black S 0100 CF (manufactured by BASF SE, compound having the following structure, lactam pigment)

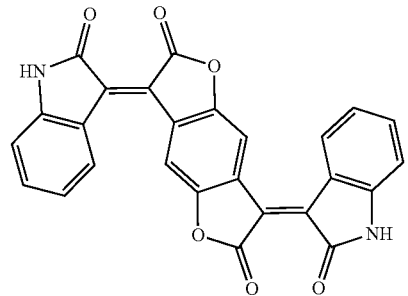 [SMILES: O=C1Nc2ccccc2/C1=C1/C(=O)Oc2cc3c(cc21)OC(=O)/C3=C1\C(=O)Nc2ccccc21]

PBk32: C. I. Pigment Black 32 (compound having the following structure, perylene pigment)
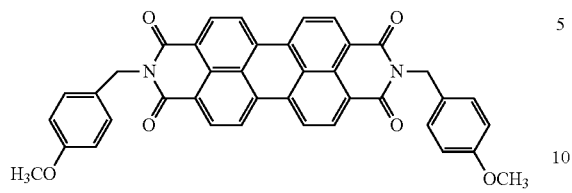
[Pigment Derivative]
Derivative 1: compound having the following structure
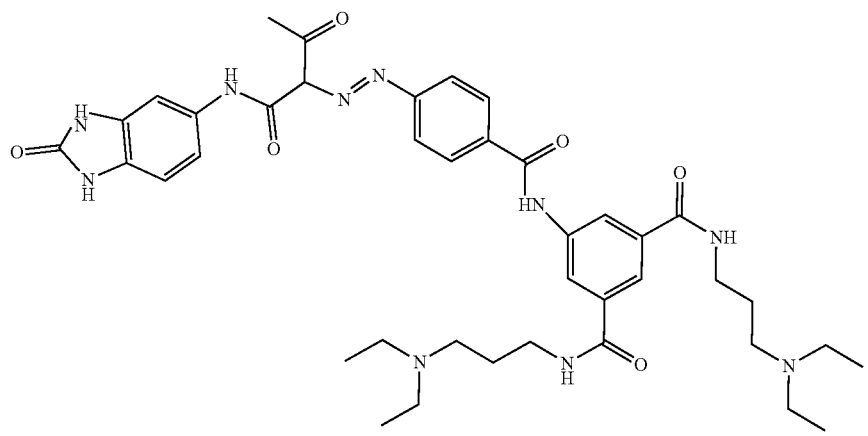 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]
Derivative 2: compound having the following structure
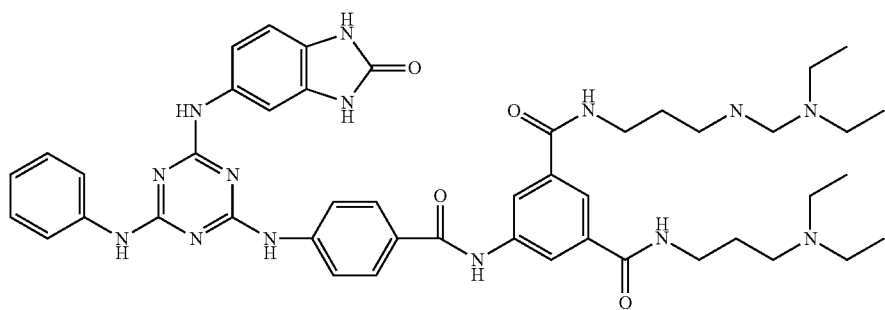 [SMILES: CCN(CC)CCCNC(=O)c1cc(NC(=O)c2ccc(Nc3nc(Nc4ccccc4)nc(Nc4ccc5[nH]c(=O)[nH]c5c4)n3)cc2)cc(C(=O)NCCCNCN(CC)CC)c1]

Derivative 3: compound having the following structure

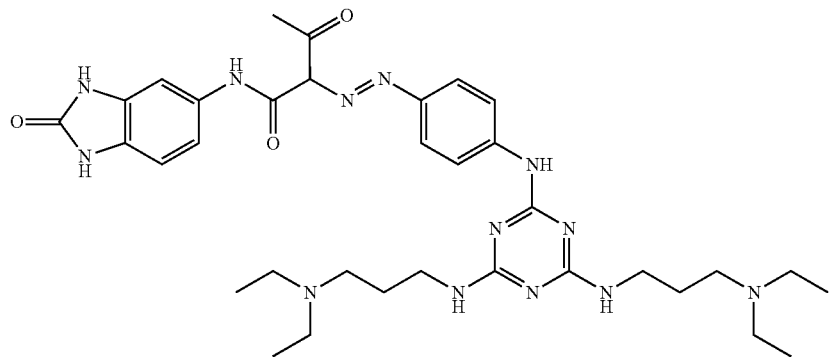 [SMILES: CCN(CC)CCCNc1nc(NCCCN(CC)CC)nc(Nc2ccc(/N=N/C(C(C)=O)C(=O)Nc3ccc4[nH]c(=O)[nH]c4c3)cc2)n1]

[Resin]
A-1 to A-42: resins described above
(Comparative Resin)
CA-1: resin having the following structure (weight-average molecular weight: 10885, acid value: 74 mgKOH/g; the description of "Polym" indicates that the polymer chain of the structure in which the repeating unit of the structure indicated by "Polym" is bonded by the number of subscripts is bonded to the sulfur atom (S).)

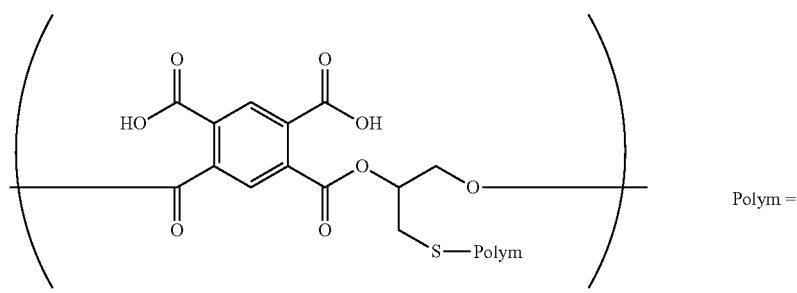

(CA-1)

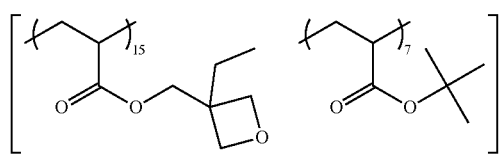

[Solvent]
- S-1: propylene glycol monomethyl ether acetate
- S-2: propylene glycol monomethyl ether
- S-3: cyclohexanone <Production of Resin Composition>

In each of Examples and Comparative Examples, raw materials shown in the tables below were mixed to prepare resin compositions of Examples and Comparative Examples. The unit of the numerical value in the column of the amount added described in the tables below is parts by mass.

TABLE 8

| | Dispersion liquid | | Resin | | Polymerizable monomer | | Photopolymerization initiator | | Solvent | |
|---|---|---|---|---|---|---|---|---|---|---|
| | Type | Part by mass | Type | Part by mass | Type | Part by mass | Type | Part by mass | Type | Part by mass |
| Example 1 | Dispersion liquid R1 | 54.6 | Aa-1 | 12.0 | D-1 | 5.0 | E-1 | 5.0 | S-1 | 23.4 |
| Example 2 | Dispersion liquid R2 | 56.4 | Aa-1 | 4.0 | D-1 | 4.0 | E-1 | 3.0 | S-1 | 32.6 |
| Example 3 | Dispersion liquid R3 | 54.6 | Aa-1 | 2.0 | D-1 | 3.0 | E-2 | 1.0 | S-3 | 39.4 |
| Example 4 | Dispersion liquid R4 | 58.6 | Aa-1 | 8.0 | D-1 | 3.0 | E-2 | 3.0 | S-3 | 27.4 |
| Example 5 | Dispersion liquid R5 | 55.0 | Aa-1 | 8.0 | D-1 | 3.0 | E-3 | 3.0 | S-3 | 31.0 |
| Example 6 | Dispersion liquid R6 | 55.9 | Aa-1 | 10.0 | D-1 | 5.0 | E-1 | 3.0 | S-3 | 26.1 |
| Example 7 | Dispersion liquid R7 | 57.2 | Aa-1 | 10.0 | D-1 | 5.0 | E-2 | 3.0 | S-3 | 24.8 |
| Example 8 | Dispersion liquid R8 | 63.7 | Aa-1 | 10.0 | D-1 | 4.0 | E-3 | 3.0 | S-1 | 19.3 |
| Example 9 | Dispersion liquid R9 | 56.9 | Aa-1 | 12.0 | D-1 | 4.0 | E-3 | 3.0 | S-3 | 24.1 |
| Example 10 | Dispersion liquid R10 | 55.0 | Aa-1 | 5.0 | D-1 | 4.0 | E-2 | 3.0 | S-1 | 33.0 |
| Example 11 | Dispersion liquid R11 | 55.0 | Aa-1 | 5.0 | D-1 | 3.0 | E-2 | 3.0 | S-1 | 17 |
| | | | | | | | | | S-2 | 17 |
| Example 12 | Dispersion liquid R12 | 55.0 | Aa-1 | 5.0 | D-1 | 3.0 | E-3 | 3.0 | S-1 | 17 |
| | | | | | | | | | S-3 | 17 |
| Example 13 | Dispersion liquid B1 | 55.0 | Aa-2 | 5.0 | D-2 | 2.0 | E-3 | 3.0 | S-1 | 35.0 |
| Example 14 | Dispersion liquid B2 | 52.5 | Aa-2 | 8.0 | D-2 | 5.0 | E-1 | 2.0 | S-3 | 32.5 |
| Example 15 | Dispersion liquid B3 | 52.0 | Aa-2 | 8.0 | D-2 | 5.0 | E-1 | 3.0 | S-3 | 32.0 |
| Example 16 | Dispersion liquid B4 | 57.9 | Aa-2 | 8.0 | D-2 | 5.0 | E-1 | 3.0 | S-3 | 26.2 |
| Example 17 | Dispersion liquid B5 | 52.3 | Aa-2 | 8.0 | D-2 | 5.0 | E-2 | 3.0 | S-3 | 31.7 |
| Example 18 | Dispersion liquid B6 | 56.7 | Aa-2 | 8.0 | D-2 | 2.0 | E-2 | 2.0 | S-3 | 31.3 |
| Example 19 | Dispersion liquid B7 | 55.1 | Aa-2 | 8.0 | D-2 | 5.0 | E-2 | 3.0 | S-1 | 28.9 |
| Example 20 | Dispersion liquid B8 | 58.0 | Aa-2 | 10.0 | D-2 | 5.0 | E-3 | 3.0 | S-1 | 24.0 |
| Example 21 | Dispersion liquid B9 | 53.8 | Aa-2 | 10.0 | D-2 | 2.0 | E-3 | 3.0 | S-1 | 31.2 |
| Example 22 | Dispersion liquid B10 | 54.1 | Aa-2 | 10.0 | D-2 | 5.0 | E-3 | 3.0 | S-1 | 27.9 |
| Example 23 | Dispersion liquid B11 | 59.2 | Aa-2 | 10.0 | D-2 | 5.0 | E-1 | 3.0 | S-3 | 22.9 |
| Example 24 | Dispersion liquid B12 | 56.4 | Aa-2 | 8.0 | D-2 | 5.0 | E-2 | 2.0 | S-3 | 28.6 |
| Example 25 | Dispersion liquid G1 | 56.8 | Aa-3 | 8.0 | D-3 | 2.0 | E-3 | 3.0 | S-3 | 30.2 |
| Example 26 | Dispersion liquid G2 | 63.7 | Aa-3 | 9.0 | D-3 | 5.0 | E-1 | 3.0 | S-3 | 19.3 |
| Example 27 | Dispersion liquid G3 | 70.2 | Aa-3 | 10.0 | D-3 | 5.0 | E-2 | 3.0 | S-3 | 11.8 |
| Example 28 | Dispersion liquid G4 | 55.0 | Aa-3 | 5.0 | D-4 | 5.0 | E-3 | 2.0 | S-1 | 33.0 |
| Example 29 | Dispersion liquid G5 | 55.0 | Aa-3 | 5.0 | D-4 | 5.0 | E-3 | 3.0 | S-1 | 32.0 |
| Example 30 | Dispersion liquid G6 | 55.0 | Aa-3 | 5.0 | D-4 | 5.0 | E-3 | 3.0 | S-1 | 32.0 |
| Example 31 | Dispersion liquid G7 | 55.0 | Aa-3 | 5.0 | D-4 | 5.0 | E-3 | 3.0 | S-1 | 32.0 |
| Example 32 | Dispersion liquid G8 | 55.0 | Aa-3 | 5.0 | D-4 | 2.0 | E-3 | 2.0 | S-1 | 36.0 |
| Example 33 | Dispersion liquid G9 | 55.0 | Aa-3 | 5.0 | D-4 | 5.0 | E-3 | 3.0 | S-1 | 32.0 |
| Example 34 | Dispersion liquid G10 | 53.8 | Aa-3 | 8.0 | D-4 | 2.0 | E-3 | 1.0 | S-1 | 35.2 |
| Example 35 | Dispersion liquid G11 | 56.6 | Aa-3 | 8.0 | D-4 | 5.0 | E-1 | 3.0 | S-1 | 27.5 |
| Example 36 | Dispersion liquid G12 | 59.8 | Aa-3 | 8.0 | D-4 | 5.0 | E-2 | 3.0 | S-1 | 24.2 |
| Example 37 | Dispersion liquid G13 | 60.3 | Aa-3 | 8.0 | D-4 | 2.0 | E-3 | 1.0 | S-3 | 28.7 |

TABLE 9

| | Dispersion liquid | | Resin | | Polymerizable monomer | | Photopolymerization initiator | | Solvent | |
|---|---|---|---|---|---|---|---|---|---|---|
| | Type | Part by mass | Type | Part by mass | Type | Part by mass | Type | Part by mass | Type | Part by mass |
| Example 38 | Dispersion liquid I1 | 57.1 | A-1 | 8.0 | D-1 | 5.0 | E-1 | 2.0 | S-3 | 27.9 |
| Example 39 | Dispersion liquid I2 | 56.3 | A-1 | 12.0 | D-1 | 10.0 | E-2 | 5.0 | S-3 | 16.7 |
| Example 40 | Dispersion liquid I3 | 55.9 | A-30 | 8.0 | D-1 | 5.0 | E-3 | 5.0 | S-3 | 26.1 |
| Example 41 | Dispersion liquid I4 | 54.1 | A-30 | 8.0 | D-1 | 2.0 | E-1 | 3.0 | S-3 | 32.9 |
| Example 42 | Dispersion liquid I5 | 55.9 | A-1 | 8.0 | D-1 | 2.0 | E-2 | 3.0 | S-3 | 31.1 |
| Example 43 | Dispersion liquid I6 | 60.6 | A-1 | 8.0 | D-1 | 5.0 | E-3 | 3.0 | S-3 | 23.4 |
| Example 44 | Dispersion liquid Bk1 | 55.0 | A-1 | 8.0 | D-1 | 5.0 | E-3 | 3.0 | S-3 | 29.0 |
| Example 45 | Dispersion liquid Bk2 | 55.0 | Aa-2 | 8.0 | D-1 | 5.0 | E-3 | 3.0 | S-3 | 29.0 |
| Example 46 | Dispersion liquid Bk3 | 55.0 | Aa-2 | 5.0 | D-1 | 2.0 | E-2 | 3.0 | S-1 | 35.0 |
| Example 47 | Dispersion liquid Bk4 | 55.0 | Aa-2 | 5.0 | D-1 | 2.0 | E-2 | 3.0 | S-1 | 35.0 |

TABLE 9-continued

| | Dispersion liquid | | Resin | | Polymerizable monomer | | Photopolymerization initiator | | Solvent | |
|---|---|---|---|---|---|---|---|---|---|---|
| | Type | Part by mass | Type | Part by mass | Type | Part by mass | Type | Part by mass | Type | Part by mass |
| Example 48 | Dispersion liquid Bk5 | 55.0 | Aa-2 | 5.0 | D-1 | 2.0 | E-3 | 3.0 | S-1 | 35.0 |
| Example 49 | Dispersion liquid Bk6 | 55.0 | Aa-2 | 5.0 | D-1 | 2.0 | E-3 | 3.0 | S-1 | 35.0 |
| Example 50 | Dispersion liquid Bk7 | 55.0 | Aa-2 | 10.0 | D-1 | 11.5 | E-2 | 5.0 | S-1 | 31.5 |
| Example 51 | Dispersion liquid Bk8 | 55.0 | Aa-2 | 5.0 | D-1 | 5.0 | E-2 | 3.0 | S-1 | 45.0 |
| Example 52 | Dispersion liquid Bk9 | 55.0 | Aa-2 | 5.0 | D-1 | 5.0 | E-2 | 3.0 | S-1 | 45.0 |
| Example 53 | Dispersion liquid Bk10 | 55.0 | A-6 | 5.0 | D-1 | 5.0 | E-3 | 3.0 | S-1 | 45.0 |
| Example 54 | Dispersion liquid Bk11 | 55.0 | A-11 | 5.0 | D-1 | 2.0 | E-2 | 3.0 | S-1 | 35.0 |
| Example 55 | Dispersion liquid Bk12 | 55.0 | A-14 | 5.0 | D-1 | 2.0 | E-2 | 3.0 | S-1 | 35.0 |
| Example 56 | Dispersion liquid Bk13 | 55.0 | A-24 | 5.0 | D-1 | 2.0 | E-2 | 3.0 | S-1 | 35.0 |
| Example 57 | Dispersion liquid Bk14 | 55.0 | A-26 | 5.0 | D-1 | 3.0 | E-3 | 3.0 | S-1 | 34.0 |
| Example 58 | Dispersion liquid Bk15 | 55.0 | A-29 | 5.0 | D-1 | 3.0 | E-1 | 1.5 | S-3 | 34.0 |
| | | | | | | | E-3 | 1.5 | | |
| Example 59 | Dispersion liquid Bk16 | 55.0 | Aa-3 | 8.0 | D-4 | 5.0 | E-2 | 1.5 | S-1 | 29.0 |
| | | | | | | | E-3 | 1.5 | | |
| Example 60 | Dispersion liquid Bk17 | 55.0 | Aa-3 | 8.0 | D-4 | 5.0 | E-3 | 3.0 | S-1 | 29.0 |
| Example 61 | Dispersion liquid Bk18 | 55.0 | Aa-3 | 8.0 | D-4 | 5.0 | E-3 | 3.0 | S-1 | 29.0 |
| Example 62 | Dispersion liquid Bk19 | 55.0 | Aa-3 | 8.0 | D-4 | 5.0 | E-3 | 3.0 | S-1 | 29.0 |
| Example 63 | Dispersion liquid Bk20 | 55.0 | Aa-3 | 8.0 | D-4 | 5.0 | E-3 | 3.0 | S-1 | 29.0 |
| Example 64 | Dispersion liquid R1 | 27.6 | Aa-3 | 8.0 | D-1 | 5.0 | E-3 | 3.0 | S-1 | 28.8 |
| | Dispersion liquid B1 | 27.6 | | | | | | | | |
| Example 65 | Dispersion liquid R1 | 27.6 | Aa-3 | 8.0 | D-1 | 2.5 | E-3 | 3.0 | S-1 | 33.8 |
| | Dispersion liquid B6 | 27.6 | | | D-4 | 2.5 | | | | |
| Example 66 | Dispersion liquid R8 | 27.6 | Aa-3 | 8.0 | D-1 | 2.5 | E-3 | 3.0 | S-1 | 33.8 |
| | Dispersion liquid B6 | 27.6 | | | D-4 | 2.5 | | | | |
| Example 67 | Dispersion liquid R1 | 18.3 | Aa-3 | 8.0 | D-1 | 2.5 | E-3 | 3.0 | S-1 | 34.1 |
| | Dispersion liquid G1 | 18.3 | | | D-4 | 2.5 | | | | |
| | Dispersion liquid B1 | 18.3 | | | | | | | | |
| Example 68 | Dispersion liquid R13 | 56.4 | Aa-1 | 4.0 | D-1 | 4.0 | E-1 | 3.0 | S-1 | 32.6 |
| Example 69 | Dispersion liquid R14 | 56.4 | Aa-1 | 4.0 | D-1 | 4.0 | E-1 | 3.0 | S-1 | 32.6 |
| Example 70 | Dispersion liquid R15 | 56.4 | Aa-1 | 4.0 | D-1 | 4.0 | E-1 | 3.0 | S-1 | 32.6 |
| Example 71 | Dispersion liquid B13 | 55.0 | Aa-2 | 5.0 | D-2 | 2.0 | E-3 | 3.0 | S-1 | 35.0 |

TABLE 10

| | Dispersion liquid | | Resin | | Polymerizable monomer | | Photopolymerization initiator | | Solvent | |
|---|---|---|---|---|---|---|---|---|---|---|
| | Type | Part by mass | Type | Part by mass | Type | Part by mass | Type | Part by mass | Type | Part by mass |
| Comparative Example 1 | Dispersion liquid CR1 | 54.6 | Ab-1 | 12.0 | D-1 | 5.0 | E-1 | 5.0 | S-1 | 23.4 |
| Comparative Example 2 | Dispersion liquid CB1 | 55.0 | Ab-1 | 5.0 | D-2 | 2.0 | E-3 | 3.0 | S-1 | 35.0 |
| Comparative Example 3 | Dispersion liquid CG1 | 56.8 | Ab-1 | 8.0 | D-3 | 2.0 | E-3 | 3.0 | S-3 | 30.2 |
| Comparative Example 4 | Dispersion liquid CI1 | 57.1 | Ab-2 | 8.0 | D-1 | 5.0 | E-1 | 2.0 | S-3 | 27.9 |
| Comparative Example 5 | Dispersion liquid CBk1 | 55.8 | Ab-2 | 8.0 | D-1 | 5.0 | E-3 | 3.0 | S-3 | 28.2 |
| Comparative Example 6 | Dispersion liquid CBk2 | 55.8 | Ab-2 | 8.0 | D-1 | 5.0 | E-3 | 3.0 | S-3 | 28.2 |
| Comparative Example 7 | Dispersion liquid CBk3 | 55.8 | Ab-2 | 8.0 | D-1 | 5.0 | E-3 | 3.0 | S-3 | 28.2 |

Among the raw materials listed in the above tables, details of the raw materials shown by abbreviations are as follows.

[Dispersion Liquid]

Dispersion liquids R1 to R15, B1 to B13, G1 to G13, I1 to 16, Bk1 to Bk20, CR1, CB1, CG1, CI1, CBk1 to 3: dispersion liquids described above

[Resin]

A-1, A-6, A-11, A-14, A-24, A-26, A-29, A-30: resins described above

Aa-1: resin having the following structure (a numerical value added to a main chain represents a molar ratio; weight-average molecular weight: 11000)

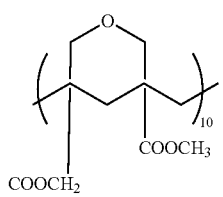

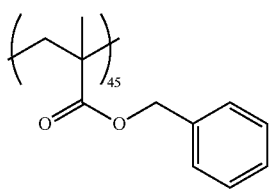

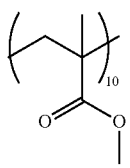

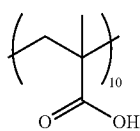

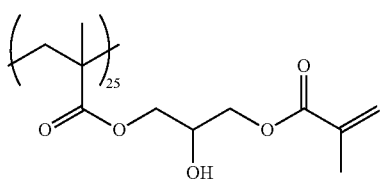

Aa-2: resin having the following structure (a numerical value added to a main chain represents a molar ratio; weight-average molecular weight: 15000)

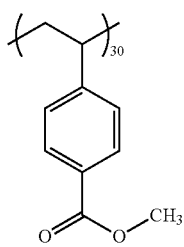

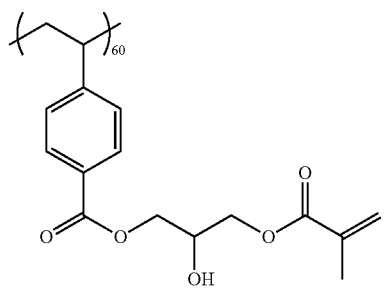

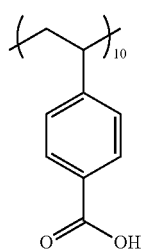

Aa-3: resin having the following structure (a numerical value added to a main chain represents a molar ratio; the total value of x, y, and z is 50; Mw=15000)

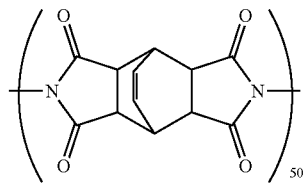

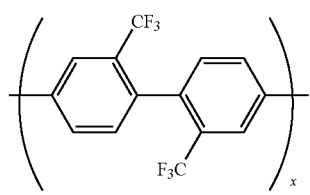

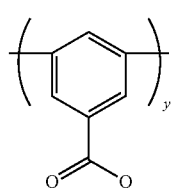

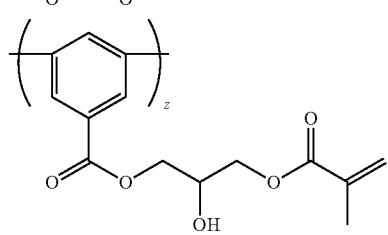

Ab-1: resin having the following structure (a numerical value added to a main chain represents a molar ratio; weight-average molecular weight: 13000)

[Structural formula of resin Ab-2 shown at left]

Ab-2: resin having the following structure (weight-average molecular weight: 10000)

[Structural formula continues]

[Polymerizable Monomer]
D-1: acrylate compound (KAYARAD DPHA, manufactured by Nippon Kayaku Co., Ltd.)

D-2: epoxy compound (TETRAD-X, manufactured by MITSUBISHI GAS CHEMICAL COMPANY, INC.)

D-3: oxetane compound (OXT-221, manufactured by TOAGOSEI CO., LTD.)

D-4: oxetane compound (OX-SQ TX-100, manufactured by TOAGOSEI CO., LTD.)

[Photopolymerization Initiator]
E-1: Omnirad 379EG (manufactured by IGM Resins B.V.)
E-2: Irgacure OXE01 (manufactured by BASF SE)
E-3: Irgacure OXE03 (manufactured by BASF SE)

[Solvent]
S-1: propylene glycol monomethyl ether acetate
S-2: propylene glycol monomethyl ether
S-3: cyclohexanone <Evaluation>
[Evaluation of Storage Stability]

In each of Examples and Comparative Examples, the viscosity (mPa·s) of each resin composition was measured by "RE-85L" manufactured by TOKI SANGYO CO., LTD. After the above-described measurement, the resin composition was allowed to stand at 45° C. under the conditions of light shielding for 3 days, and the viscosity (mPa·s) was measured again. Storage stability was evaluated according to the following evaluation standard from a viscosity difference (ΔVis) before and after leaving to stand. It can be said that, as the numerical value of the viscosity difference (ΔVis) is smaller, the storage stability of the composition is better. In each of the above-described viscosity measurements, the temperature and humidity were controlled to 22±5° C. and 60±20% in a laboratory, and the temperature of the resin composition was adjusted to 25° C.

—Evaluation Standard—
A: ΔVis was 0.5 mPa·s or less.
B: ΔVis was more than 0.5 mPa·s and 1.0 mPa·s or less.
C: ΔVis was more than 1.0 mPa·s and 2.0 mPa·s or less.
D: ΔVis was more than 2.0 mPa·s and 2.5 mPa·s or less.
E: ΔVis was more than 2.5 mPa·s.

[Evaluation of Spectral Change]

In each of Examples and Comparative Examples, on a glass substrate, each resin composition was applied to a glass substrate by spin coating, and dried (pre-baked) at 100° C. for 120 seconds using a hot plate. Thereafter, the composition was heated (post-baked) at 200° C. for 30 minutes using an oven to produce a film having a thickness of 0.60 µm. Using Cary 5000 UV-Vis-NIR spectrophotometer (manufactured by Agilent Technologies, Inc.), a light transmittance Tr1 of the obtained film at a wavelength of 450 nm was measured. Next, the obtained film was heat-treated at 300° C. for 5 hours in a nitrogen atmosphere. A light transmittance Tr2 of the film after the heating treatment at a wavelength of 450 nm was measured. An absolute value ΔT of the difference between Tr1 and Tr2 was calculated, and the spectral change was evaluated according to the following evaluation standard. It can be said that, as ΔT is smaller, the spectral change is less likely to occur, which is preferable. Both Tr1 and Tr2 were measured in a state in which the temperature and humidity were controlled to 22±5° C. and 60±20% in a laboratory, and the temperature of the substrate was adjusted to 25° C.

—Evaluation Standard—
A: ΔT was 0.1% or less.
B: ΔT was more than 0.1% and 0.5% or less.
C: ΔT was more than 0.5% and 1% or less.
D: ΔT was more than 1% and 5% or less.
E: ΔT was more than 5%.

[Evaluation of Film Contraction Ratio]

In each of Examples and Comparative Examples, on a glass substrate, each resin composition was applied to a glass substrate by spin coating, and dried (pre-baked) at 100° C. for 120 seconds using a hot plate. Thereafter, the composition was heated (post-baked) at 200° C. for 30 minutes using an oven to produce a film having a thickness of 0.60 µm. The film thickness was measured by scraping a part of the film to expose a surface of the glass substrate, and measuring a level difference (film thickness of the coating film) between the surface of the glass substrate and the coating film using a stylus profilometer (DektakXT, manufactured by BRUKER). Next, the obtained film was heat-treated at 300° C. for 5 hours in a nitrogen atmosphere. The film thickness of the film after the heating treatment was measured in the same manner as described above, a film contraction ratio was calculated from the following expression, and the film contraction ratio was evaluated according to the following evaluation standard. Both T0 and T1 below were measured in a state in which the temperature and humidity were controlled to 22±5° C. and 60±20% in a laboratory, and the temperature of the substrate was adjusted to 25° C. It can be said that, as the film contraction ratio is smaller, the film contraction is more suppressed, which is a preferred result.

Film contraction ratio (%)=(1−(T1/T0))×100

T0: thickness of film immediately after production (=0.60 μm)
T1: thickness of film after the heating treatment at 300° C. for 5 hours in a nitrogen atmosphere
—Evaluation Standard—
A: film contraction ratio was 1% or less.
B: film contraction ratio was more than 1% and 5% or less.
C: film contraction ratio was more than 5% and 10% or less.
D: film contraction ratio was more than 10% and 30% or less.
E: film contraction ratio was more than 30%.

[Evaluation of Cracks]
In each of Examples and Comparative Examples, on a glass substrate, each resin composition was applied to a glass substrate by spin coating, and dried (pre-baked) at 100° C. for 120 seconds using a hot plate. Thereafter, the composition was heated (post-baked) at 200° C. for 30 minutes using an oven to produce a film having a thickness of 0.60 μm.

Next, $SiO_2$ was laminated at 200 nm on the surface of the obtained film by a sputtering method to form an inorganic film. The obtained film in which the inorganic film was formed on the surface was heat-treated at 300° C. for 5 hours in a nitrogen atmosphere. The surface of the inorganic film after the heating treatment was observed with an optical microscope, the number of cracks per 1 cm² was counted, and the presence or absence of cracks was evaluated according to the following evaluation standard.
—Evaluation Standard—
A: number of cracks per 1 cm² was 0.
B: number of cracks per 1 cm² was 1 to 10.
C: number of cracks per 1 cm² was 11 to 50.
D: number of cracks per 1 cm² was 51 to 100.
E: number of cracks per 1 cm² was 101 or more.

TABLE 11

| | Evaluation result | | | |
|---|---|---|---|---|
| | Storage stability | Spectral change | Film contraction ratio | Crack |
| Example 1 | A | B | A | A |
| Example 2 | B | B | A | A |
| Example 3 | A | B | B | A |
| Example 4 | B | B | C | B |
| Example 5 | B | B | C | B |
| Example 6 | A | B | B | A |
| Example 7 | B | A | C | C |
| Example 8 | A | A | A | A |
| Example 9 | B | A | C | B |
| Example 10 | A | A | B | A |
| Example 11 | A | A | C | B |
| Example 12 | A | A | C | C |
| Example 13 | A | A | A | A |
| Example 14 | B | A | B | A |
| Example 15 | A | A | B | B |
| Example 16 | A | B | A | A |
| Example 17 | A | B | A | A |
| Example 18 | A | A | A | A |
| Example 19 | C | A | A | A |
| Example 20 | A | B | A | A |
| Example 21 | C | A | A | A |
| Example 22 | A | A | A | A |
| Example 23 | C | A | A | A |
| Example 24 | A | B | B | A |
| Example 25 | A | B | A | A |
| Example 26 | B | B | B | B |
| Example 27 | C | A | B | B |
| Example 28 | A | A | A | A |
| Example 29 | A | A | A | A |
| Example 30 | C | A | A | A |
| Example 31 | A | A | A | A |
| Example 32 | A | A | A | A |
| Example 33 | A | A | B | B |
| Example 34 | C | B | A | A |
| Example 35 | A | A | A | A |
| Example 36 | A | A | A | A |
| Example 37 | A | A | A | A |
| Example 38 | A | A | A | A |
| Example 39 | A | A | A | A |
| Example 40 | A | A | A | A |

TABLE 12

| | Evaluation result | | | |
|---|---|---|---|---|
| | Storage stability | Spectral change | Film contraction ratio | Crack |
| Example 41 | A | A | A | A |
| Example 42 | A | A | B | B |
| Example 43 | A | B | B | A |
| Example 44 | A | B | B | B |
| Example 45 | B | A | B | B |
| Example 46 | A | A | A | B |
| Example 47 | A | A | A | B |
| Example 48 | A | A | A | A |
| Example 49 | C | A | A | A |
| Example 50 | A | A | A | A |
| Example 51 | A | A | B | A |
| Example 52 | C | A | A | A |
| Example 53 | A | A | A | A |
| Example 54 | B | A | A | A |
| Example 55 | B | A | A | A |
| Example 56 | B | A | A | A |
| Example 57 | B | A | A | A |
| Example 58 | A | A | A | A |
| Example 59 | A | A | A | A |
| Example 60 | C | A | A | A |
| Example 61 | A | A | A | A |
| Example 62 | A | A | A | A |
| Example 63 | A | A | A | A |
| Example 64 | A | A | A | A |
| Example 65 | A | A | A | A |
| Example 66 | A | A | A | A |

TABLE 12-continued

| | Evaluation result | | | |
|---|---|---|---|---|
| | Storage stability | Spectral change | Film contraction ratio | Crack |
| Example 67 | A | A | A | A |
| Example 68 | B | A | A | A |
| Example 69 | B | A | A | A |
| Example 70 | B | A | A | A |
| Example 71 | A | A | A | A |
| Comparative Example 1 | C | D | E | D |
| Comparative Example 2 | C | D | E | E |
| Comparative Example 3 | C | D | E | D |
| Comparative Example 4 | C | D | D | E |
| Comparative Example 5 | C | D | E | D |
| Comparative Example 6 | C | D | E | D |
| Comparative Example 7 | C | D | E | E |

In a case of using the resin compositions of Examples, the occurrence of cracks was suppressed as compared with a case of using the resin compositions of Comparative Examples. Therefore, as compared with the resin compositions of Comparative Examples, it can be said that it was possible to expand a process window of process after manufacturing the film.

In addition, the resin compositions of Examples 1 to 37 and 68 to 71 could be preferably used as a resin composition for forming a colored pixel of a color filter. In addition, the resin compositions of Examples 38 to 43 could be preferably used as a resin composition for forming a near-infrared cut filter. In addition, the resin compositions of Examples 44 to 67 could be preferably used as a resin composition for forming a near-infrared transmitting filter.

In Example 67, in a case where any of the dispersion liquids I1 to I6 was further added as the dispersion liquid, the same effects as in Example 67 could be obtained.

Example 100: Pattern Formation by Photolithography Method

The resin composition of Example 1 was applied to a silicon wafer by spin coating, and dried (pre-baked) at 100° C. for 120 seconds using a hot plate. Thereafter, the coloring resin composition was heated (post-baked) at 200° C. for 30 minutes using an oven to form a resin composition layer having a thickness of 0.60 μm.

Next, using an i-ray stepper exposure device FPA-3000 i5+(manufactured by Canon Inc.), the resin composition layer was irradiated with light having a wavelength of 365 nm through a mask pattern in which square non-masked pixels with a side of 1.1 μm were arranged in an area of 4 mm×3 mm to perform exposure thereon with an exposure amount of 500 mJ/cm².

Next, the silicon wafer on which the resin composition layer after the exposure was formed was placed on a horizontal rotary table of a spin-shower developing machine (DW-30 Type, manufactured by Chemitronics Co., Ltd.), and subjected to a puddle development at 23° C. for 60 seconds using a developer (CD-2000, manufactured by Fujifilm Electronic Materials Co., Ltd.). Next, while rotating the silicon wafer at a rotation speed of 50 rpm, the silicon wafer was rinsed by supplying pure water from above the center of rotation in shower-like from an ejection nozzle, and then spray-dried to form a pattern (pixel).

The produced silicon wafer with a pattern was divided into two, and one of these was heat-treated at 300° C. for 5 hours in a nitrogen atmosphere (hereinafter, one is referred to as a substrate before heating treatment at 300° C. and the other is referred to as a substrate after heating treatment at 300° C.). In a case where cross sections of resist patterns formed on the substrate before heating treatment at 300° C. and the substrate after heating treatment at 300° C. were evaluated by a scanning electron microscope (SEM), the height of the resist pattern formed on the substrate after heating treatment at 300° C. was 75% of the height of the resist pattern formed on the substrate before heating treatment at 300° C.

What is claimed is:

1. A resin composition comprising:
   a coloring material;
   a resin; and
   a solvent,
   wherein the resin includes a graft polymer which has a main chain including a molecular chain having a structure derived from a compound having an ethylenically unsaturated bond-containing group and a graft chain, and
   the graft chain includes a repeating unit p1 having an oxetane group.

2. The resin composition according to claim 1,
   wherein the repeating unit p1 is a repeating unit represented by Formula (p1-1),

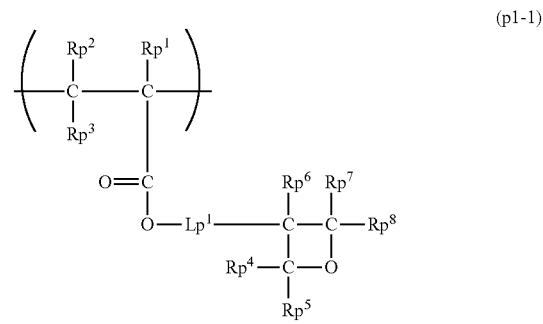

in the formula, $Rp^1$ to $Rp^3$ each independently represent a hydrogen atom, an alkyl group, or an aryl group,
   $Lp^1$ represents a divalent linking group, and
   $Rp^4$ to $Rp^8$ each independently represent a hydrogen atom or an alkyl group.

3. The resin composition according to claim 1,
   wherein the graft chain further includes a repeating unit having a group in which a carboxy group is protected by a heat-decomposable group.

4. The resin composition according to claim 1,
   wherein the graft chain further includes a repeating unit having a t-butyl ester group.

5. The resin composition according to claim 1,
   wherein the graft chain further includes a repeating unit represented by Formula (p2-10),

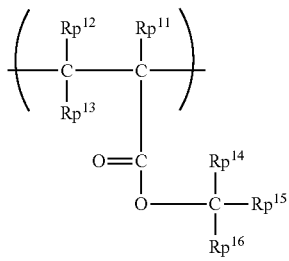

in the formula, $Rp^{11}$ to $Rp^{13}$ each independently represent a hydrogen atom, an alkyl group, or an aryl group, and $Rp^{14}$ to $Rp^{16}$ represent an alkyl group or an aryl group, and $Rp^{14}$ and $Rp^{15}$ may be bonded to each other to form a ring.

6. The resin composition according to claim 1, wherein the main chain of the graft polymer includes a repeating unit represented by Formula (1),

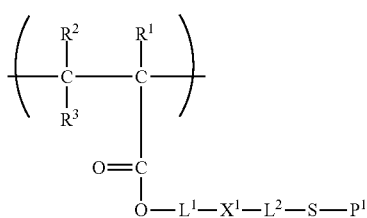

in the formula, $R^1$ to $R^3$ each independently represent a hydrogen atom, an alkyl group, or an aryl group,
$L^1$ and $L^2$ each independently represent a divalent linking group,
$X^1$ represents a single bond, —O—, —COO—, —OCO—, —NHCOO—, —OCONH—, or —NHCONH—, and
$P^1$ represents a graft chain including the repeating unit p1.

7. The resin composition according to claim 1, wherein the main chain of the graft polymer includes a repeating unit having a crosslinkable group.

8. The resin composition according to claim 1, wherein the main chain of the graft polymer includes a repeating unit having an acid group.

9. The resin composition according to claim 1, wherein the coloring material includes a near-infrared absorbing coloring material.

10. The resin composition according to claim 1, wherein the coloring material includes a black coloring material.

11. The resin composition according to claim 1, wherein the coloring material includes at least one selected from Color Index Pigment Red 179, Color Index Pigment Red 264, Color Index Pigment Red 291, Color Index Pigment Blue 16, or Color Index Pigment Yellow 215.

12. The resin composition according to claim 1, wherein Amin/B, which is a ratio of a minimum value Amin of an absorbance of the resin composition in a wavelength range of 400 to 640 nm to an absorbance B of the resin composition at a wavelength of 1500 nm, is 5 or more.

13. The resin composition according to claim 1, further comprising:
a polymerizable monomer.

14. The resin composition according to claim 1, further comprising:
a photopolymerization initiator.

15. A film obtained from the resin composition according to claim 1.

16. An optical filter comprising:
the film according to claim 15.

17. A solid-state imaging element comprising:
the film according to claim 15.

18. An image display device comprising:
the film according to claim 15.

* * * * *